US012225703B2

(12) United States Patent
Kim et al.

(10) Patent No.: US 12,225,703 B2
(45) Date of Patent: Feb. 11, 2025

(54) METHODS OF MANUFACTURING A SEMICONDUCTOR DEVICE USING A MASK

(71) Applicant: SAMSUNG ELECTRONICS CO., LTD., Suwon-si (KR)

(72) Inventors: Mingyu Kim, Suwon-si (KR); Munhyeon Kim, Hwaseong-si (KR); Daewon Ha, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/479,323

(22) Filed: Oct. 2, 2023

(65) Prior Publication Data

US 2024/0032269 A1   Jan. 25, 2024

Related U.S. Application Data

(63) Continuation of application No. 17/363,748, filed on Jun. 30, 2021, now Pat. No. 11,832,430.

(30) Foreign Application Priority Data

Oct. 19, 2020   (KR) .................. 10-2020-0135324

(51) Int. Cl.
  *H10B 10/00*   (2023.01)
  *G11C 11/412*   (2006.01)
  *H01L 29/10*   (2006.01)
(52) U.S. Cl.
  CPC ............ *H10B 10/12* (2023.02); *G11C 11/412* (2013.01); *H01L 29/1033* (2013.01)

(58) Field of Classification Search
  CPC .......... H01L 27/1104; H01L 29/78696; H01L 29/1033; H01L 29/0673; H01L 29/1083; H01L 29/42392; H01L 29/66545; H01L 29/165; G11C 11/412; H10B 10/12
  See application file for complete search history.

(56) References Cited

U.S. PATENT DOCUMENTS

| 7,663,166 B2 | 2/2010 | Kim et al. |
| 8,084,308 B2 | 12/2011 | Chang et al. |
| 8,395,220 B2 | 3/2013 | Chang et al. |
| 9,935,204 B2 * | 4/2018 | Lee ................. G11C 11/419 |
| 10,490,559 B1 | 11/2019 | Ando et al. |
| 10,541,305 B2 | 1/2020 | Then et al. |

(Continued)

*Primary Examiner* — Changhyun Yi
(74) *Attorney, Agent, or Firm* — F. CHAU & ASSOCIATES, LLC

(57) ABSTRACT

A method of manufacturing a semiconductor device includes forming a first sacrificial and first active layer on a substrate; forming a first mask pattern on a portion of the substrate; etching the first sacrificial and first active layer partially using the first mask pattern to expose a portion of a top surface of the substrate; forming a semiconductor layer on the exposed top surface of the substrate; forming sacrificial layers and active layers on the first active and semiconductor layer, the active layers including an uppermost second active layer; forming a second mask pattern on a portion of the second active layer; forming a trench using the second mask pattern, the trench defining a first and second active pattern; and removing the sacrificial layers to form a first and second channel patterns on the first and second active patterns, respectively, wherein the first active pattern includes the semiconductor layer.

20 Claims, 42 Drawing Sheets

(56) References Cited

U.S. PATENT DOCUMENTS

2019/0393102 A1    12/2019   Chiang et al.
2020/0135740 A1*   4/2020   Liaw ................. H01L 29/66439
2022/0122994 A1    4/2022   Kim et al.

* cited by examiner

METHODS OF MANUFACTURING A SEMICONDUCTOR DEVICE USING A MASK

CROSS-REFERENCE TO RELATED APPLICATIONS

The present application is a continuation application of U.S. patent application Ser. No. 17/363,748, filed Jun. 30, 2021, which claims priority under 35 U.S.C. § 119 to Korean Patent Application No. 10-2020-0135324, filed on Oct. 19, 2020, in the Korean Intellectual Property Office, the entire contents of which are hereby incorporated by reference.

BACKGROUND OF THE INVENTION

The present disclosure relates to a semiconductor device, and in particular, to a semiconductor device including an SRAM cell.

Due to their small-sized, multifunctional, and/or low-cost characteristics, semiconductor devices are being esteemed as important elements in the electronics industry. Semiconductor devices are classified as semiconductor memory devices for storing data, semiconductor logic devices for processing data, and hybrid semiconductor devices including both memory and logic elements. As the electronics industry advances, there is an increasing demand for semiconductor devices with improved characteristics. For example, there is an increasing demand for semiconductor devices with high reliability, high performance, and/or multiple functions. To meet this demand, the complexity and/or integration density of semiconductor devices are being increased.

SUMMARY

An embodiment of the inventive concept provides a semiconductor device with improved electric characteristics.

According to an embodiment of the inventive concept, a semiconductor device may include a pull-down transistor and a pull-up transistor on a substrate. Each of the pull-down transistor and the pull-up transistor may include an active pattern on the substrate; a pair of source/drain patterns on the active pattern; a channel pattern interposed between the pair of source/drain patterns, the channel pattern including semiconductor patterns that are disposed in a noncontiguous stack, such that a semiconductor pattern does not contact an adjacent semiconductor pattern; and a gate electrode crossing the channel pattern in a first direction. In some embodiments, there may be more or less semiconductor patterns of pull-down transistors as compared to semiconductor patterns of pull-up transistors.

According to an embodiment of the inventive concept, a semiconductor device may include a pull-down transistor, a pull-up transistor, and a pass-gate transistor on a substrate. Each of the pull-down, pull-up, and pass-gate transistors may include an active pattern on the substrate; a pair of source/drain patterns on the active pattern; a channel pattern interposed between the pair of source/drain patterns, the channel pattern including semiconductor patterns that are disposed in a noncontiguous stack, such that a semiconductor pattern does not contact an adjacent semiconductor pattern; and a gate electrode crossing the channel pattern. The gate electrode may include gate patterns interposed between the substrate and the semiconductor pattern and between adjacent ones of the semiconductor patterns. In some embodiments, there may be more or less gate patterns of pull-down transistors as compared to gate patterns of pull-up transistors.

According to an embodiment of the inventive concept, a semiconductor device may include a substrate including a bit cell region; a first active pattern and a second active pattern on the bit cell region, the first active pattern being spaced apart from the second active pattern in a first direction; a device isolation layer provided on the substrate to cover a lower side surface of each of the first and second active patterns; an upper portion of each of the first and second active patterns protruding above the device isolation layer; a pair of first source/drain patterns provided on the first active pattern; a pair of second source/drain patterns provided on the second active pattern; a first channel pattern interposed between the pair of first source/drain patterns; a second channel pattern interposed between the pair of second source/drain patterns; a gate electrode crossing the first and second channel patterns and extending in the first direction; a gate insulating layer interposed between the first channel pattern and the gate electrode and between the second channel pattern and the gate electrode; gate spacers provided on side surfaces of the gate electrode; a gate capping pattern provided on a top surface of the gate electrode: a first interlayer insulating layer on the gate capping pattern; active contacts, which are provided to penetrate the first interlayer insulating layer and are respectively coupled to the first and second source/drain patterns; silicide patterns between the first and second source/drain patterns and the active contacts; a gate contact, which is provided to penetrate the first interlayer insulating layer and is coupled to the gate electrode; a second interlayer insulating layer on the first interlayer insulating layer; and a first interconnection layer provided in the second interlayer insulating layer. The first interconnection layer may include first interconnection lines that are respectively electrically connected to the active contacts and the gate contacts. A conductivity type of the pair of first source/drain patterns may be different from a conductivity type of the pair of second source/drain patterns. Each of the first and second channel patterns may include semiconductor patterns that disposed in a noncontiguous stack, such that a semiconductor pattern does not contact an adjacent semiconductor pattern. The number of semiconductor patterns of the second channel pattern may be different from the number of semiconductor patterns of the first channel pattern.

DETAILED DESCRIPTION

Figure 1:
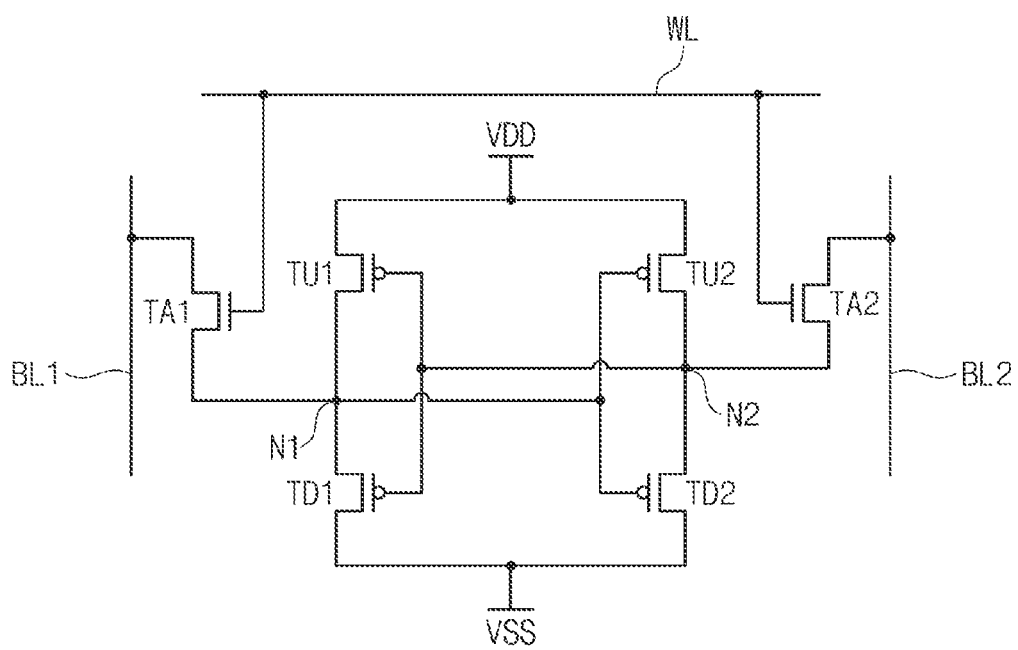
FIG. 1 is an equivalent circuit diagram illustrating an SRAM cell according to an embodiment of the inventive concept.

FIG. 1 is an equivalent circuit diagram illustrating an SRAM cell according to an embodiment of the inventive concept.

Referring to FIG. 1, the SRAM cell may include a first pull-up transistor TU1, a first pull-down transistor TD1, a second pull-up transistor TU2, a second pull-down transistor TD2, a first pass-gate transistor TA1, and a second pass-gate transistor TA2. The first and second pull-up transistors TU1 and TU2 may be p-type metal-oxide-semiconductor (PMOS) transistors. The first and second pull-down transistors TD1 and TD2 and the first and second pass-gate transistors TA1 and TA2 may be n-type metal-oxide-semiconductor (NMOS) transistors.

A first source/drain of the first pull-up transistor TU1 and a first source/drain of the first pull-down transistor TD1 may be connected to a first node N1. A second source/drain of the first pull-up transistor TU1 may be connected to a power line VDD, and a second source/drain of the first pull-down transistor TD1 may be connected to a ground line VSS. A gate of the first pull-up transistor TU1 and a gate of the first pull-down transistor TD1 may be electrically connected to each other. The first pull-up transistor TU1 and the first pull-down transistor TD1 may constitute a first inverter. The connected gates of the first pull-up transistor TU1 and the first pull-down transistor TD1 may correspond to an input terminal of the first inverter, and the first node N1 may correspond to an output terminal of the first inverter.

A first source/drain of the second pull-up transistor TU2 and a first source/drain of the second pull-down transistor TD2 may be connected to a second node N2. A second source/drain of the second pull-up transistor TU2 may be connected to the power line VDD, and a second source/drain of the second pull-down transistor TD2 may be connected to the ground line VSS. A gate of the second pull-up transistor TU2 and a gate of the second pull-down transistor TD2 may be electrically connected to each other. Thus, the second pull-up transistor TU2 and the second pull-down transistor TD2 may constitute a second inverter. The connected gates of the second pull-up transistor TU2 and the second pull-down transistor TD2 may correspond to an input terminal of the second inverter, and the second node N2 may correspond to an output terminal of the second inverter.

The first and second inverters may be combined to form a latch structure. For example, the gates of the first pull-up transistor TU1 and the first pull-down transistor TD1 may be electrically connected to the second node N2, and the gates of the second pull-up transistor TU2 and the second pull-down transistor TD2 may be electrically connected to the first node N1. A first source/drain of the first pass-gate transistor TA1 may be connected to the first node N1, and a second source/drain of the first pass-gate transistor TA1 may be connected to a first bit line BL1. A first source/drain of the second pass-gate transistor TA2 may be connected to the second node N2, and a second source/drain of the second pass-gate transistor TA2 may be connected to a second bit line BL2. Gates of the first and second pass-gate transistors TA1 and TA2 may be electrically coupled to a word line WL. Thus, the SRAM cell according to an embodiment of the inventive concept may be realized.

Figure 2:
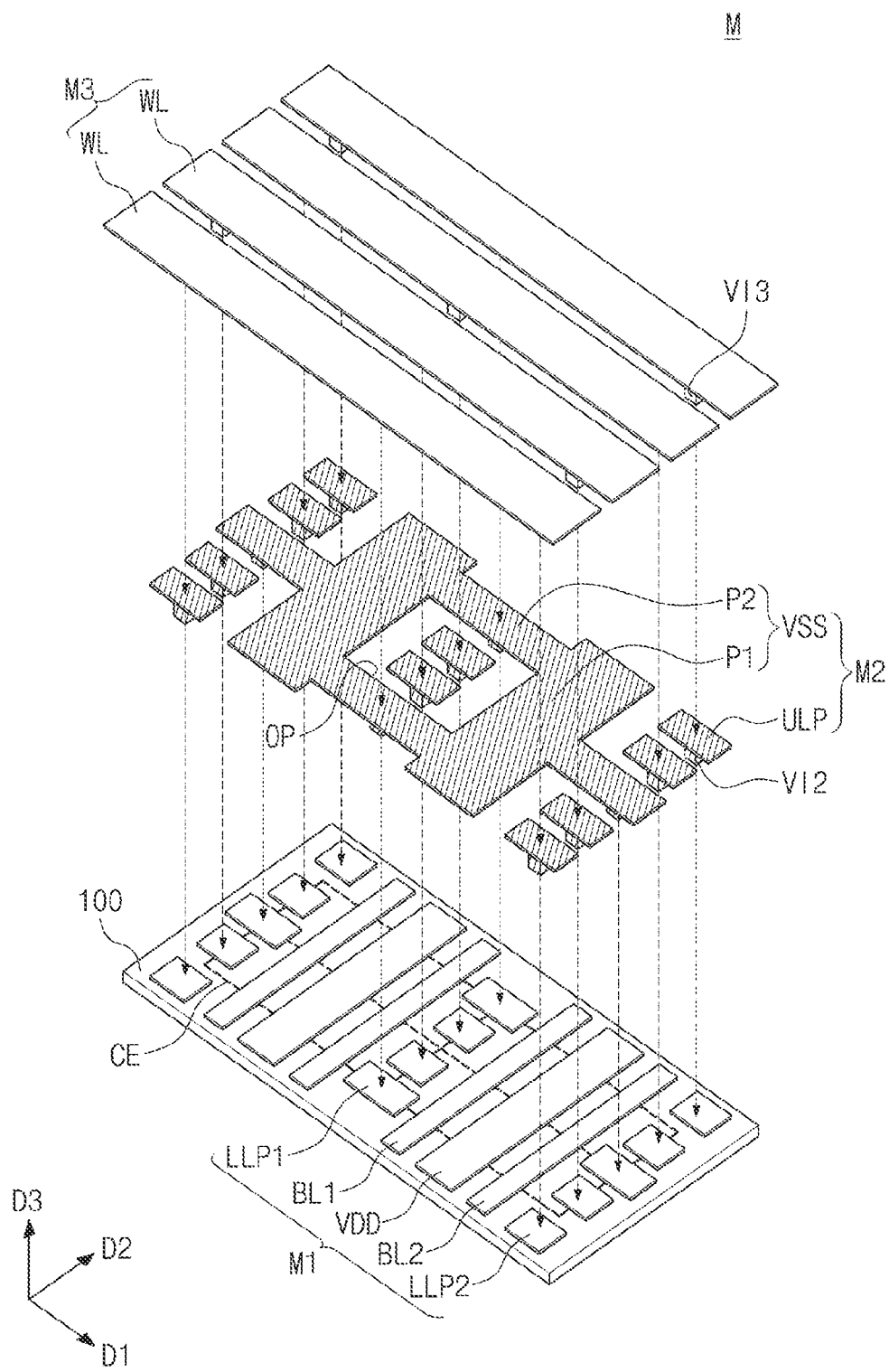
FIG. 2 is a perspective view illustrating interconnection layers of a semiconductor device according to an embodiment of the inventive concept.
Figure 3:
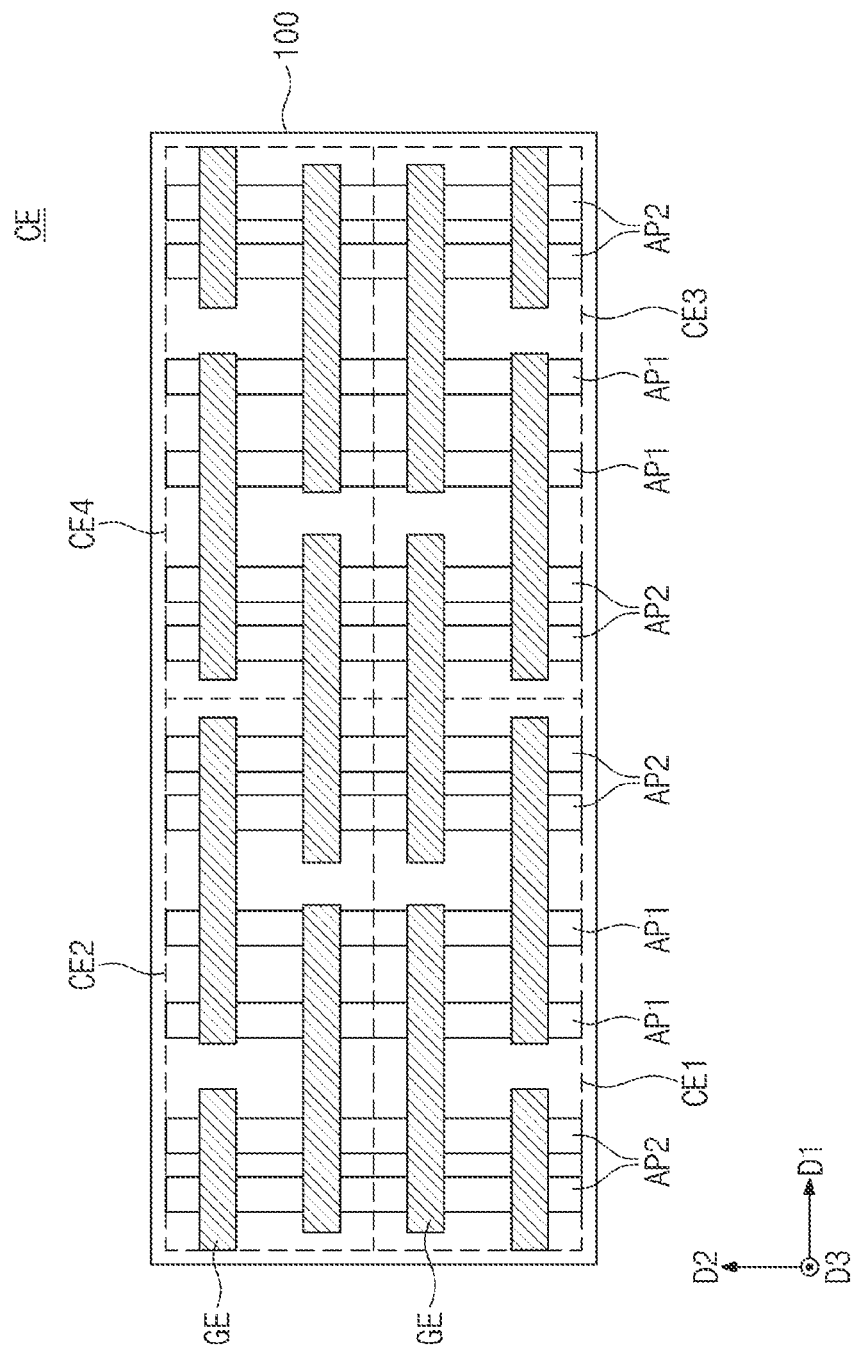
FIG. 3 is a plan view illustrating a memory cell of FIG. 2.

FIG. 2 is a perspective view illustrating interconnection layers of a semiconductor device according to an embodiment of the inventive concept. FIG. 3 is a plan view illustrating a memory cell of FIG. 2.

Referring to FIGS. 2 and 3, a memory cell CE may be provided on a substrate 100. Referring to FIG. 3, the memory cell CE may include first to fourth bit cells CE1 to CE4, which are arranged in a 2×2 array. Each of the first to fourth bit cells CE1 to CE4 may be the SRAM cell previously described with reference to FIG. 1. As a representative example of the first to fourth bit cells CE1 to CE4, a structure of the first bit cell CE1 will be described in more detail with reference to FIGS. 4 and 5A to 5D. Each of the second to fourth bit cells CE2, CE3, and CE4 may be provided to have a structure symmetric to the first bit cell CE1.

A first interconnection layer M1, a second interconnection layer M2, and a third interconnection layer M3 may be provided on the memory cell CE. The first to third interconnection layers M1, M2, and M3 may be sequentially stacked. The first to third interconnection layers M1, M2, and M3 may be formed of or include at least one of conductive metal nitrides (e.g., titanium nitride or tantalum nitride) or metallic materials (e.g., titanium, tantalum, tungsten, copper, or aluminum).

The first interconnection layer M1 may include the first bit line BL1, the second bit line BL2, and the power line VDD, which are provided to extend in a second direction D2. The power line VDD may be interposed between the first bit line BL1 and the second bit line BL2. When viewed in a plan view, the first bit line BL1, the second bit line BL2, and the power line VDD may have line-shaped patterns. A width of the power line VDD may be larger than a width of each of the first and second bit lines BL1 and BL2 when measured in a first direction D1.

The first interconnection layer M1 may further include first lower landing pads LLP1 and second lower landing pads LLP2, which are provided near the first and second bit lines BL1 and BL2. The first and second lower landing pads LLP1 and LLP2 may be arranged in the second direction D2. When viewed in a plan view, each of the first and second lower landing pads LLP1 and LLP2 may be an island-shaped pattern.

The first interconnection layer M1 may further include first vias, which are respectively provided below the first bit line BL1, the second bit line BL2, the power line VDD, the first lower landing pads LLP1, and the second lower landing pads LLP2. The memory cell CE and the first interconnection layer M1 may be electrically connected to each other through the first vias.

The second interconnection layer M2 may include the ground line VSS and upper landing pads ULP. The ground line VSS may be a mesh-shaped conductive structure. The ground line VSS may have at least one opening OP. In detail, the ground line VSS may include first portions P1 extending in the second direction D2 and second portions P2 extending in the first direction D1. A width of the first portions P1 may be larger than a width of the second portions P2. The opening OP may be defined by an adjacent pair of the first portions P1 and an adjacent pair of the second portions P2.

A pair of the upper landing pads ULP may be disposed in the opening OP. The pair of the upper landing pads ULP in the opening OP may be arranged in the second direction D2. When viewed in a plan view, the upper landing pads ULP may be island-shaped patterns.

The second portions P2 of the ground line VSS may be respectively overlapped with the first lower landing pads LLP1, when viewed in a plan view. The upper landing pads ULP may be respectively overlapped with the second lower landing pads LLP2, when viewed in a plan view.

The second interconnection layer M2 may further include second vias VI2, which are respectively provided below the ground line VSS and the upper landing pads ULP. The ground line VSS may be electrically connected to the first lower landing pads LLP1 of the first interconnection layer M1 through the second vias VI2. Since a plurality of the second vias VI2 are provided below the ground line VSS, a plurality of the first lower landing pads LLP1 may be connected in common to a single ground line VSS. The upper landing pads ULP may be electrically connected to the second lower landing pads LLP2 of the first interconnection layer M1 through the second vias VI2.

In an embodiment, the second interconnection layer M2 may be composed of only the ground line VSS, the upper landing pads ULP, and the second vias VI2. In other words, the second interconnection layer M2 may not include any other line (e.g., a bit line, a power line, and a word line) except for the ground line VSS.

The third interconnection layer M3 may include the word lines WL extending in the first direction D1. The word lines WL may be arranged in the second direction D2. When viewed in a plan view, the word lines WL may be line-shaped patterns.

The third interconnection layer M3 may further include third vias VI3 provided below the word lines WL. A word line WL may be electrically connected to an upper landing pad ULP of the second interconnection layer M2 through a third via VI3. In other words, a word line WL may be electrically connected to a second lower landing pad LLP2 of the first interconnection layer M1 through a third via VI3, an upper landing pad ULP, and a second via VI2.

In an embodiment, the third interconnection layer M3 may be composed of only the word lines WL and the third vias VI3. In other words, the third interconnection layer M3 may not include any other line (e.g., a bit line, a power line, and a ground line) except for the word lines WL.

Figure 4:
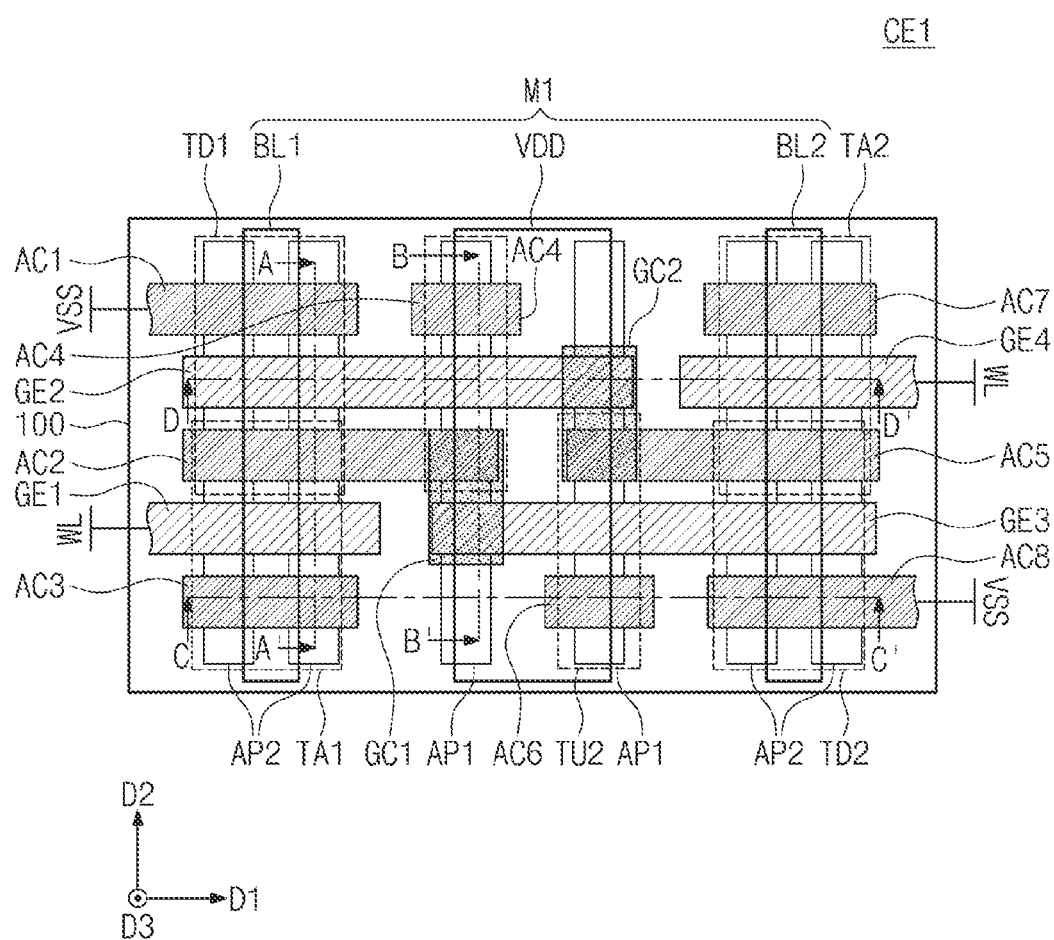
FIG. 4 is a plan view illustrating a first bit cell of FIG. 3, which is an SRAM cell according to the circuit diagram of FIG. 1.

FIG. 4 is a plan view illustrating the first bit cell CE1 of FIG. 3, which is an SRAM cell according to the circuit diagram of FIG. 1. FIGS. 5A to 5D are sectional views that are respectively taken along the lines A-A', B-B', C-C', and D-D' of FIG. 4.

Referring to FIGS. 1, 4, and 5A to 5D, the first bit cell CE1 on the substrate 100 may include an SRAM cell. A device isolation layer ST may be provided on the substrate 100. The device isolation layer ST may define first active patterns AP1 and second active patterns AP2. The substrate 100 may be a semiconductor substrate including silicon (Si), germanium (Ge), silicon-germanium (SiGe), or the like, or a compound semiconductor substrate. The device isolation layer ST may be formed of or include at least one of insulating materials (e.g., silicon oxide).

The first and second active patterns AP1 and AP2 may be portions of the substrate 100. A trench TR may be defined between adjacent first and second active patterns AP1 and AP2. The device isolation layer ST may fill the trench TR. Upper portions of the first and second active patterns AP1 and AP2 may be vertically extended to have a shape protruding above the device isolation layer ST. Each of the upper portions of the first and second active patterns AP1 and AP2 may be a fin-shaped structure vertically protruding above the device isolation layer ST. For example, each of the first and second active patterns AP1 and AP2 may be an active fin.

In an embodiment, the first bit cell CE1 may include a pair of the first active patterns AP1 and two pairs of the second active patterns AP2. A first pair of the second active patterns AP2 may respectively constitute a body of the first pass-gate transistor TA1 and a body of the first pull-down transistor TD1. A second pair of the second active patterns AP2 may respectively constitute a body of the second pass-gate transistor TA2 and a body of the second pull-down transistor TD2. A first active pattern AP1 of the pair of the first active patterns AP1 may constitute a body of the first pull-up transistor TU1. A second first active pattern AP1 of the pair of the first active patterns AP1 may constitute a body of the second pull-up transistor TU2. A distance between the two first active patterns AP1 in the pair of the first active patterns AP1 may be larger than a distance between the two second active patterns AP2 of a pair of second active pattern AP2.

In another embodiment, two second active patterns AP2 may be provided, instead of the two pairs of the second active patterns AP2. In other words, each pair of the second active patterns AP2 may be provided as a single second active pattern AP2.

First channel patterns CH1 and first source/drain patterns SD1 may be provided in the upper portions of the first active patterns AP1. Second channel patterns CH2 and second source/drain patterns SD2 may be provided in the upper portions of the second active patterns AP2.

A second channel pattern CH2 may include a first semiconductor pattern SP1, a second semiconductor pattern SP2, and a third semiconductor pattern SP3, which are sequentially stacked. The first to third semiconductor patterns SP1, SP2, and SP3 may be spaced apart from each other in a vertical direction (i.e., a third direction D3). Among the semiconductor patterns of a second channel pattern CH2, the lowermost semiconductor pattern may be the first semiconductor pattern SP1. The uppermost semiconductor pattern may be the third semiconductor pattern SP3. In other words, the first semiconductor pattern SP1 may be located at a level lower than the second semiconductor pattern SP2, and the second semiconductor pattern SP2 may be located at a level lower than the third semiconductor pattern SP3.

Each first to third semiconductor patterns SP1, SP2, and SP3 may be formed of or include at least one of silicon, germanium, or silicon-germanium. For example, each first to third semiconductor patterns SP1, SP2, and SP3 may be formed of or include silicon.

A first channel pattern CH1 may include second and third semiconductor patterns SP2 and SP3, which are sequentially stacked. Among the semiconductor patterns of a first channel pattern CH1, the lowermost semiconductor pattern may be the second semiconductor pattern SP2, and the uppermost semiconductor pattern may be the third semiconductor pattern SP3.

A semiconductor pattern may extend further in the first direction D1 than a semiconductor pattern that is disposed above it in the third direction D3.

In some embodiments, there may be more or less semiconductor patterns in first channel patterns CH1 as compared to semiconductor patterns in second channel patterns CH2. For example, a second channel pattern CH2 may include more semiconductor patterns than a first channel pattern CH1. The number of semiconductor patterns constituting each of the first and second channel patterns CH1 and CH2 is not limited to the illustrated number.

The first source/drain patterns SD1 may be p-type impurity regions. The second source/drain patterns SD2 may be n-type impurity regions. A first channel pattern CH1 may be interposed between a pair of the first source/drain patterns SD1. In other words, the pair of the first source/drain patterns SD1 may be connected to each other by stacked second and third semiconductor patterns SP2 and SP3. A second channel pattern CH2 may be interposed between a pair of the second source/drain patterns SD2. In other words, the pair of the second source/drain patterns SD2 may be connected to each other by stacked first to third semiconductor patterns SP1, SP2, and SP3.

The first and second source/drain patterns SD1 and SD2 may be epitaxial patterns that are formed by a selective epitaxial growth process. The first and second source/drain patterns SD1 and SD2 may have top surfaces that are located at a level higher in the third direction D3 than top surfaces of the first and second channel patterns CH1 and CH2. The first and second source/drain patterns SD1 and SD2 may be formed of or include a semiconductor material that is the same as or different from that of the substrate 100. As an example, the first source/drain patterns SD1 may be formed of or include a semiconductor material (e.g., SiGe) whose lattice constant is greater than that of a semiconductor material of the substrate 100. Accordingly, the first source/drain patterns SD1 may exert a compressive stress on the first channel patterns CH1. Alternatively, the second source/drain patterns SD2 may be formed of or include the same semiconductor material (e.g., Si) as that of the substrate 100.

The second source/drain patterns SD2 on an adjacent pair of the second active patterns AP2 may be merged to form a single second source/drain electrode. This may be because a distance between the pair of the second active patterns AP2 is relatively small.

A first active pattern AP1 may include a semiconductor layer SL. The semiconductor layer SL and a first channel pattern CH1 may be vertically spaced apart from each other in the third direction D3. The semiconductor layer SL may be disposed below the first channel pattern CH1. The semiconductor layer SL may be a portion of the first active pattern AP1 protruding above the device isolation layer ST in the third direction D3. The semiconductor layer SL may have a top surface that is located at substantially the same level as the top surface of a first semiconductor pattern SP1 in the third direction D3. The semiconductor layer SL may be interposed between the two first source/drain patterns SD1 in a pair of the first source/drain patterns SD1. The semiconductor layer SL of the first active pattern AP1 may be formed of or include at least one of silicon (Si) or silicon phosphide (SiP). Since the semiconductor layer SL is formed between the source/drain patterns, a leakage current in the semiconductor device may be reduced. In an embodiment, the semiconductor layer SL and the substrate 100 may be provided as a single object, although an interface is illustrated between the semiconductor layer SL and the substrate 100.

First to fourth gate electrodes GE1 to GE4 may be provided to cross the first and second active patterns AP1 and AP2 and to extend in the first direction D1. The first and second channel patterns CH1 and CH2 may overlap the first to fourth gate electrodes GE1 to GE4 when viewed in a plan view. The first gate electrode GE1 may be symmetric to the fourth gate electrode GE4. The second gate electrode GE2 may be symmetric to the third gate electrode GE3.

The second gate electrode GE2 and the fourth gate electrode GE4 may be aligned to each other in the first direction D1 and may be parallel to each other. A separation pattern SEP may be interposed between the second gate electrode GE2 and the fourth gate electrode GE4 to separate them from each other. The first gate electrode GEL and the third gate electrode GE3 may be aligned to each other in the first direction D1 and may be parallel to each other. The separation pattern SEP may also be interposed between the first gate electrode GEL and the third gate electrode GE3 to separate them from each other.

Each of the second and third gate electrodes GE2 and GE3 on a first active pattern AP1 may include a third gate pattern PO3, which is interposed between the substrate 100 and the second semiconductor pattern SP2; a second gate pattern PO2, which is interposed between the second and third semiconductor patterns SP2 and SP3; and a first gate pattern PO1, which is provided on the second gate pattern PO2. The first to third gate patterns PO1 to PO3 may be sequentially stacked. The first to third gate patterns PO1 to PO3 may be spaced apart from each other in the third direction D3. The lowermost gate pattern on a first active pattern AP1 may be the third gate pattern PO3.

Each of the first to fourth gate electrodes GE1 to GE4 on a second active pattern AP2 may include a fourth gate pattern PO4 interposed between the substrate 100 and the first semiconductor pattern SP1, a third gate pattern PO3 interposed between the first semiconductor pattern SP1 and the second semiconductor pattern SP2, a second gate pattern PO2 interposed between the second semiconductor pattern SP2 and the third semiconductor pattern SP3, and a first gate pattern PO1 on the second gate pattern PO2. The first to fourth gate patterns PO1 to PO4 may be sequentially stacked. The first to fourth gate patterns PO1 to PO4 may be spaced apart from each other in the third direction D3. The lowermost gate pattern on a second active pattern AP2 may be the fourth gate pattern PO4. The top surface of the semiconductor layer SL may be located at a level higher than a top surface of the fourth gate pattern PO4. The fourth gate pattern PO4 may be located at a level lower than the third gate pattern PO3. The third gate pattern PO3 may be located at a level lower than the second gate pattern PO2. The second gate pattern PO2 may be located at a level lower than the first gate pattern PO1.

In some embodiments, there may be more or less gate patterns on second active patterns AP2 as compared to gate patterns of first active patterns AP1. For example, a second active pattern AP2 may include more gate patterns than a first active pattern AP1. The number of gate patterns on a first active pattern AP1 and the number of gate patterns on a second active pattern AP2 are not limited to the illustrated numbers.

Figure 5A:
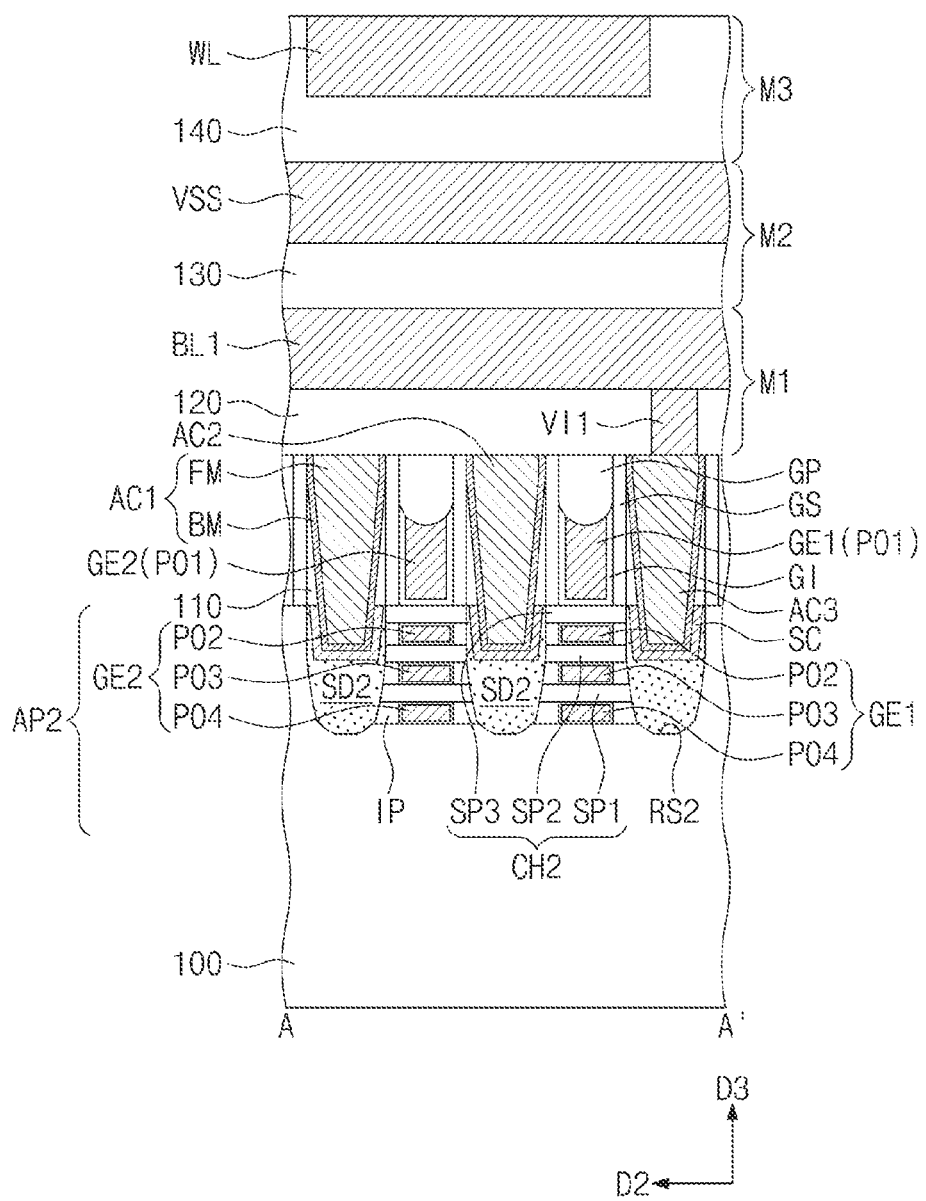
FIG. 5A is a sectional view that is taken along the line A-A' of FIG. 4 to illustrate a semiconductor device according to an embodiment of the inventive concept.
Figure 5B:
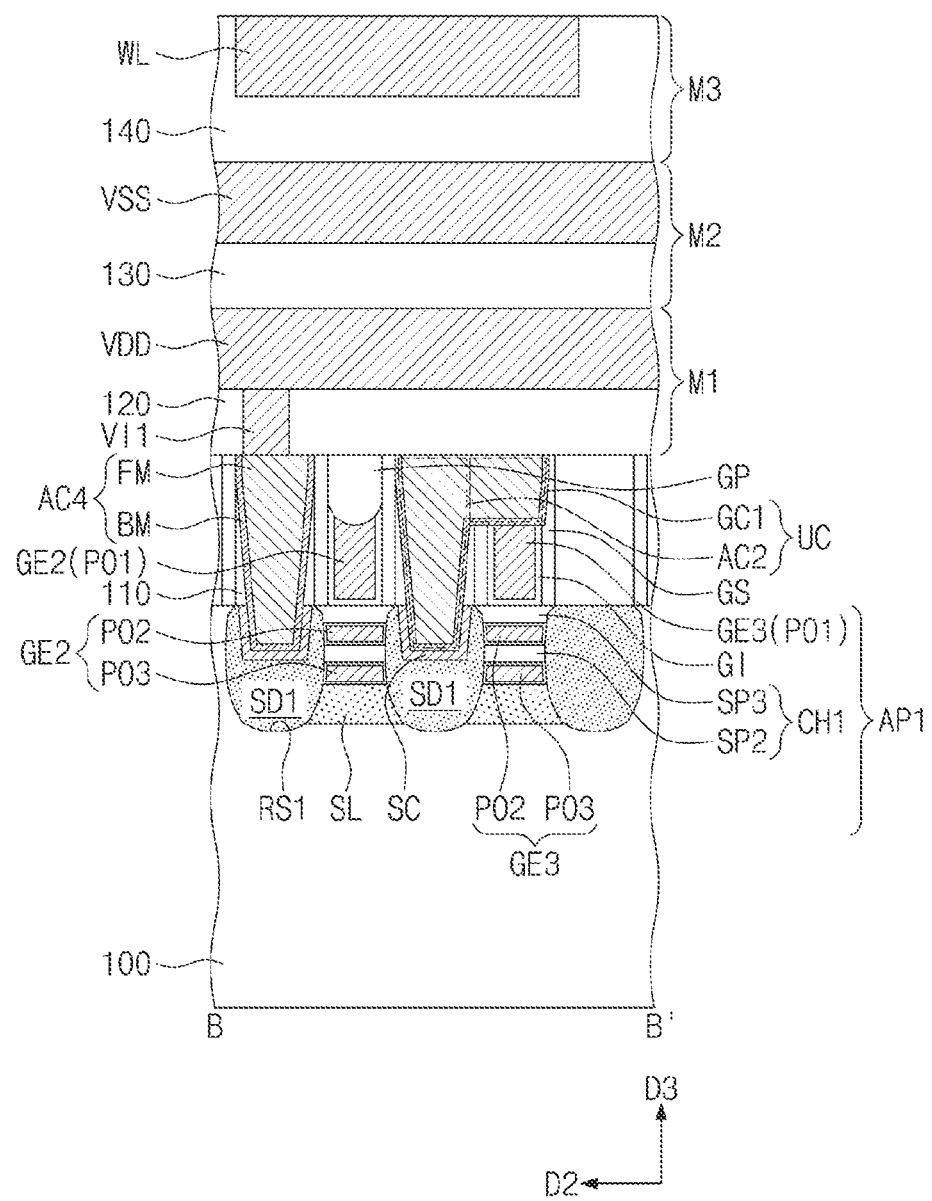
FIG. 5B is a sectional view that is taken along the line B-B' of FIG. 4 to illustrate a semiconductor device according to an embodiment of the inventive concept.
Figure 5C:
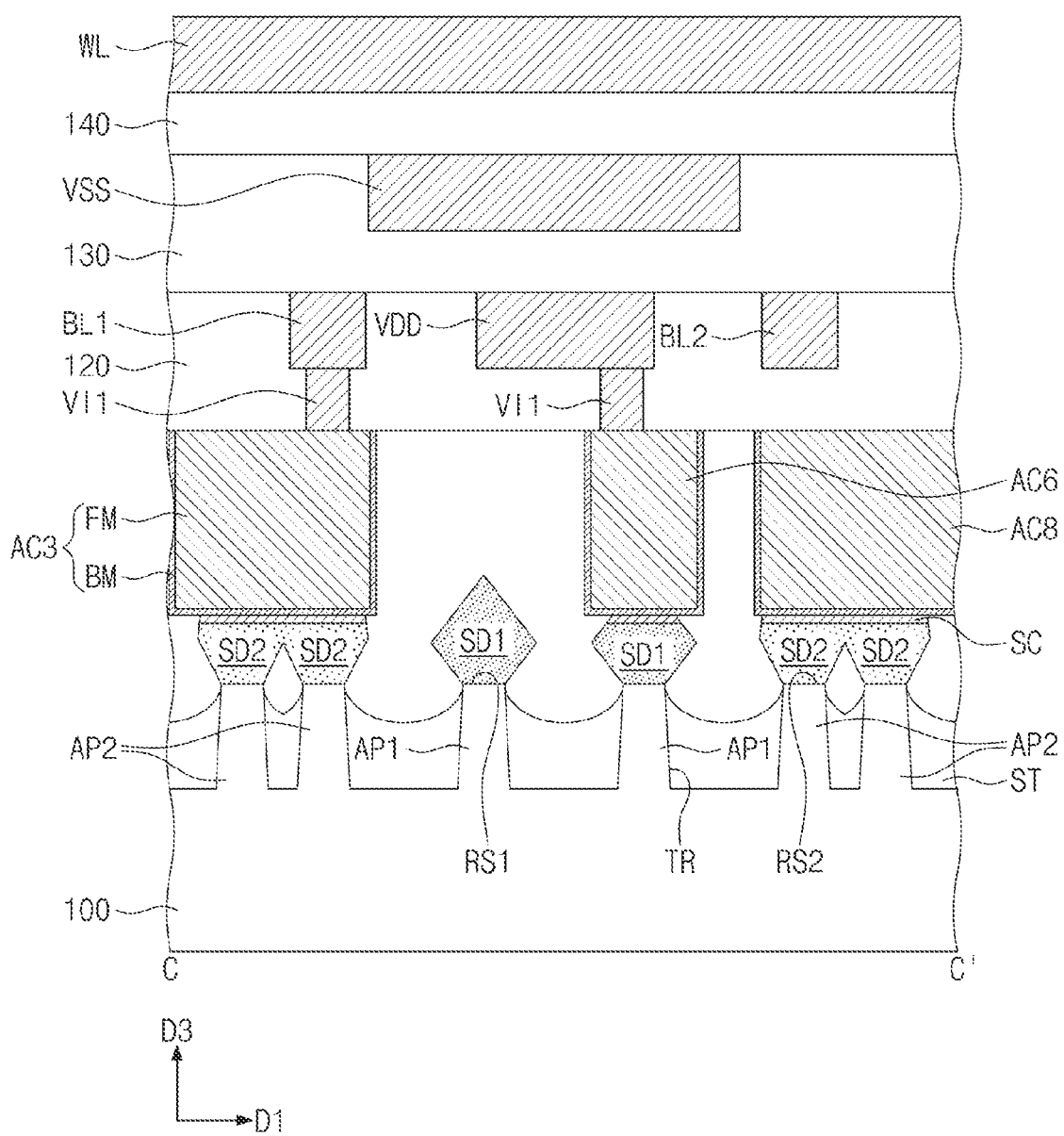
FIG. 5C is a sectional view that is taken along the line C-C' of FIG. 4 to illustrate a semiconductor device according to an embodiment of the inventive concept.
Figure 5D:
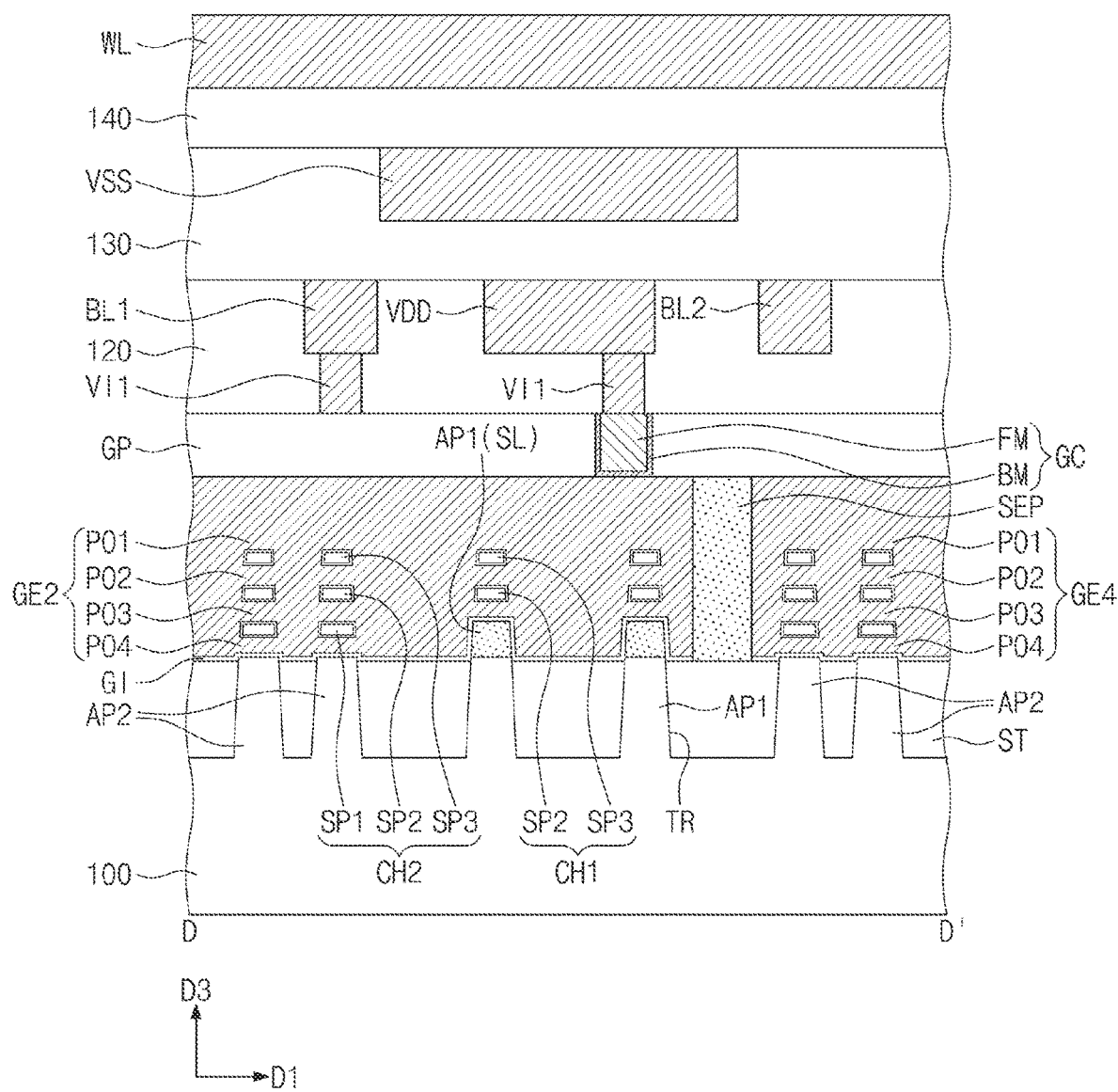
FIG. 5D is a sectional view that is taken along the line D-D' of FIG. 4 to illustrate a semiconductor device according to an embodiment of the inventive concept.

Referring to FIG. 5D, the first to fourth gate electrodes GE1 to GE4 may be provided to face top, bottom, and opposite side surfaces of each of the first to third semiconductor patterns SP1, SP2, and SP3. For example, the semiconductor device according to the present embodiment may be a three-dimensional field effect transistor (e.g., a multi-bridge channel field-effect transistor (MBCFET)), in which the gate electrodes are provided to three-dimensionally surround the channel pattern.

A pair of gate spacers GS may be disposed on opposite side surfaces of the first gate pattern PO1 of each of the first to fourth gate electrodes GE1 to GE4. The gate spacers GS may extend along the first to fourth gate electrodes GE1 to GE4 and in the first direction D1. Top surfaces of the gate spacers GS may be higher than top surfaces of the first to fourth gate electrodes GE1-GE4. The top surfaces of the gate spacers GS may be coplanar with a top surface of a first interlayer insulating layer 110, which will be described below. The gate spacers GS may be formed of or include at least one of SiO, SiCN, SiCON, or SiN. Alternatively, the gate spacers GS may be a multi-layered structure including at least two of SiO, SiCN, SiCON, or SiN.

Gate capping patterns GP may be respectively provided on the first to fourth gate electrodes GE1 to GE4. The gate capping patterns GP may extend along the first to fourth gate electrodes GE1 to GE4 and in the first direction D1. The gate capping patterns GP may be interposed between each pair of the gate spacers GS. The gate capping patterns GP may be formed of or include a material having an etch selectivity with respect to first to fourth interlayer insulating layers 110 to 140, which will be described below. In detail, the gate capping patterns GP may be formed of or include at least one of SION, SiCN, SiCON, or SiN.

A gate insulating layer GI may be interposed between the first to fourth gate electrodes GE1 to GE4 and the first and second active patterns AP1 and AP2. The gate insulating layer GI may cover the top, bottom, and opposite side surfaces of each of the first to third semiconductor patterns SP1, SP2, and SP3. The gate insulating layer GI may also cover a top surface of the device isolation layer ST, which is located below each of the first to fourth gate electrodes GE1 to GE4 (e.g., see FIG. 5D).

Each of the first to fourth gate electrodes GE1 to GE4 may include a first metal pattern and a second metal pattern on the first metal pattern. The first metal pattern may be provided on the gate insulating layer GI and may be adjacent to the first to third semiconductor patterns SP1, SP2, and SP3. The first metal pattern may include a work function metal that can be used to adjust a threshold voltage of the transistor. By adjusting a thickness and composition of the first metal pattern, it may be possible to realize a transistor having a desired threshold voltage.

The first metal pattern may include a metal nitride layer. For example, the first metal pattern may be formed of or include at least one metallic material that is selected from the group consisting of titanium (Ti), tantalum (Ta), aluminum (Al), tungsten (W), molybdenum (Mo), and nitrogen (N). In an embodiment, the first metal pattern may further include carbon (C). The first metal pattern may include a plurality of stacked work function metal layers.

The second metal pattern may be formed of or include a metallic material or metallic materials with a lower resistance than the first metal pattern. For example, the second metal pattern may be formed of or include at least one metallic material that is chosen from the group consisting of tungsten (W), aluminum (Al), titanium (Ti), and tantalum (Ta).

Referring to FIG. 5A, insulating patterns IP may be provided on the second active pattern AP2. The insulating patterns IP may be interposed between the second source/drain pattern SD2 and the second to fourth gate patterns PO2, PO3, and PO4, which constitute each of the first to fourth gate electrodes GEL to GE4 on the second active pattern AP2. The insulating patterns IP may be in direct contact with the second source/drain patterns SD2. The second to fourth gate patterns PO2, PO3, and PO4 of each of the first to fourth gate electrodes GE1 to GE4 on the second active pattern AP2 may be spaced apart from the second source/drain pattern SD2 by the insulating patterns IP.

The first interlayer insulating layer 110 may be provided on the substrate 100. The first interlayer insulating layer 110 may cover the gate spacers GS and the first and second source/drain patterns SD1 and SD2. The first interlayer insulating layer 110 may have a top surface that is substantially coplanar with the top surface of the gate capping pattern GP and the top surface of the gate spacer GS.

First to eighth active contacts AC1 to AC8 may be provided. The first to eighth active contacts AC1 to AC8 may be provided to penetrate the first interlayer insulating layer 110 and may be coupled to the first and second source/drain patterns SD1 and SD2. The first to eighth active contacts AC1 to AC8 may have top surfaces that are coplanar with the top surface of the first interlayer insulating layer 110.

Each of the first to eighth active contacts AC1 to AC8 may be a self-aligned contact plug. In other words, the first to eighth active contacts AC1 to AC8 may be formed by a self-aligned method using the gate capping pattern GP and the gate spacer GS. For example, each or at least one of the first to eighth active contacts AC1 to AC8 may cover at least a portion of a side surface of the gate spacer GS.

Silicide patterns SC may be respectively interposed between the first to eighth active contacts AC1 to AC8 and the first and second source/drain patterns SD1 and SD2. Each of the first to eighth active contacts AC1 to AC8 may be electrically connected to the source/drain pattern SD1 or SD2 through the silicide pattern SC. The silicide pattern SC may be formed of or include at least one of metal silicide materials (e.g., titanium silicide, tantalum silicide, tungsten silicide, nickel silicide, or cobalt silicide).

A first gate contact GC1 may be provided on the third gate electrode GE3 and a second gate contact GC2 may be provided on the second gate electrode GE2. The first gate contact GC1 may be provided to penetrate the first interlayer insulating layer 110, the gate spacers GS, and the gate capping pattern GP, and may be coupled to the third gate electrode GE3. The second gate contact GC2 may be provided to penetrate the first interlayer insulating layer 110, the gate spacers GS, and the gate capping pattern GP, and may be coupled to the second gate electrode GE2.

Top surfaces of the first and second gate contacts GC1 and GC2 may be coplanar with the top surface of the first interlayer insulating layer 110. A bottom surface of each of the first and second gate contacts GC1 and GC2 may be located at a level higher than bottom surfaces of the first to eighth active contacts AC1 to AC8.

Referring to FIG. 5B, the first gate contact GC1 may be connected to the second active contact AC2 to constitute a single object (e.g., a contact structure UC). The third gate electrode GE3 may be directly connected to the first source/drain pattern SD1, which is adjacent to the third gate electrode GE3, through the contact structure UC. The second gate contact GC2 may also be connected to the fifth active contact AC5 to constitute a single object (i.e., another contact structure).

Each of the first to eighth active contacts AC1 to AC8 and the first and second gate contacts GC1 and GC2 may include a conductive pattern FM and a barrier pattern BM enclosing the conductive pattern FM. For example, the conductive pattern FM may be formed of or include at least one metal of aluminum, copper, tungsten, molybdenum, or cobalt. The barrier pattern BM may cover side and bottom surfaces of the conductive pattern FM. In an embodiment, the barrier pattern BM may include a metal layer and a metal nitride layer. The metal layer may be formed of or include at least one of titanium, tantalum, tungsten, nickel, cobalt, or platinum. The metal nitride layer may be formed of or include at least one of titanium nitride (TiN), tantalum nitride (TaN), tungsten nitride (WN), nickel nitride (NiN), cobalt nitride (CON), or platinum nitride (PtN).

A second interlayer insulating layer 120, a third interlayer insulating layer 130, and a fourth interlayer insulating layer 140 may be sequentially provided on the first interlayer insulating layer 110. In an embodiment, at least one of the first to fourth interlayer insulating layers 110 to 140 may be formed of or include silicon oxide.

The first interconnection layer M1 may be provided in the second interlayer insulating layer 120. The first interconnection layer M1 may include the first bit line BL1, the second bit line BL2, the power line VDD, the first lower landing pads LLP1, the second lower landing pads LLP2, and first vias VI1, as previously described with reference to FIG. 2.

The second interconnection layer M2 may be provided in the third interlayer insulating layer 130. The second interconnection layer M2 may include the ground line VSS, the upper landing pads ULP, and the second vias VI2, as previously described with reference to FIG. 2.

The third interconnection layer M3 may be provided in the fourth interlayer insulating layer 140. The third interconnection layer M3 may include the word lines WL and the third vias VI3, as previously described with reference to FIG. 2.

The first and second active patterns AP1 and AP2 and the first to fourth gate electrodes GE1 to GE4 may constitute memory transistors. The memory transistors of the first bit cell CE1 may include the first pull-up transistor TU1, the first pull-down transistor TD1, the second pull-up transistor TU2, the second pull-down transistor TD2, the first pass-gate transistor TA1, and the second pass-gate transistor TA2, previously described with reference to FIG. 1.

The first gate electrode GE1 may serve as the gate of the first pass-gate transistor TA1. The first gate electrode GE1 may be electrically connected to a word line WL. The second gate electrode GE2 may serve as a common gate of the first pull-down transistor TD1 and the first pull-up transistor TU1. The third gate electrode GE3 may serve as a common gate of the second pull-down transistor TD2 and the second pull-up transistor TU2. The fourth gate electrode GE4 may serve as the gate of the second pass-gate transistor TA2. The fourth gate electrode GE4 may be electrically connected to a word line WL.

The first active contact AC1 may be electrically connected to the second source/drain of the first pull-down transistor TD1. The first active contact AC1 may be electrically connected to the ground line VSS.

The second active contact AC2 may be electrically connected to a common source/drain (e.g., the first source/drain) of the first pull-down transistor TD1 and the first pass-gate transistor TA1. The second active contact AC2 may extend in the first direction D1 and may be electrically connected to the first source/drain of the first pull-up transistor TU1. The second active contact AC2 may correspond to the first node N1 of FIG. 1.

The third active contact AC3 may be electrically connected to the second source/drain of the first pass-gate transistor TA1. The third active contact AC3 may be electrically connected to the first bit line BL1 through a first via VI1.

The fourth active contact AC4 may be electrically connected to the second source/drain of the first pull-up transistor TU1. The fourth active contact AC4 may be electrically connected to the power line VDD through a first via VI1.

The fifth active contact AC5 may be electrically connected to the first source/drain of the second pull-up transistor TU2. The fifth active contact AC5 may extend in the first direction D1 and may be electrically connected to a common source/drain (e.g., the first source/drain) of the second pull-down transistor TD2 and the second pass-gate transistor TA2. The fifth active contact AC5 may correspond to the second node N2 of FIG. 1.

The sixth active contact AC6 may be electrically connected to the second source/drain of the second pull-up transistor TU2. The sixth active contact AC6 may be electrically connected to the power line VDD through a first via VI1.

The seventh active contact AC7 may be electrically connected to the second source/drain of the second pass-gate transistor TA2. The seventh active contact AC7 may be electrically connected to the second bit line BL2 through a first via VI1.

The eighth active contact AC8 may be electrically connected to the second source/drain of the second pull-down transistor TD2. The eighth active contact AC8 may be electrically connected to the ground line VSS.

The first gate contact GC1 may electrically connect the second active contact AC2 to the third gate electrode GE3. In other words, the first gate contact GC1 may be provided to electrically connect the first node N1 of FIG. 1 to the common gate of the second pull-up transistor TU2 and the second pull-down transistor TD2.

The second gate contact GC2 may electrically connect the fifth active contact AC5 to the second gate electrode GE2. In other words, the second gate contact GC2 may be provided to electrically connect the second node N2 of FIG. 1 to the common gate of the first pull-up transistor TU1 and the first pull-down transistor TD1.

Since a pull-up transistor is formed to be different from a pull-down transistor and a pass-gate transistor in terms of the number of semiconductor and gate patterns, a pull-up transistor may be formed to have a channel size smaller than that of a pull-down transistor. This may make it possible to improve a write margin property of a semiconductor device.

FIGS. 6A to 13D are sectional views illustrating a method of fabricating a semiconductor device according to an embodiment of the inventive concept. FIGS. 6A, 7A, 8A, 9A, 10A, 11A, 12A, and 13A are sectional views taken along the line A-A' of FIG. 4. FIGS. 6B, 7B, 8B, 9B, 10B, 11B, 12B, and 13B are sectional views taken along the line B-B' of FIG. 4. FIGS. 9C, 10C, 11C, 12C, and 13C are sectional views taken along the line C-C' of FIG. 4. FIGS. 6C, 7C, 8C, 9D, 11D, 12D, and 13D are sectional views taken along the line D-D' of FIG. 4.

Figure 6A:
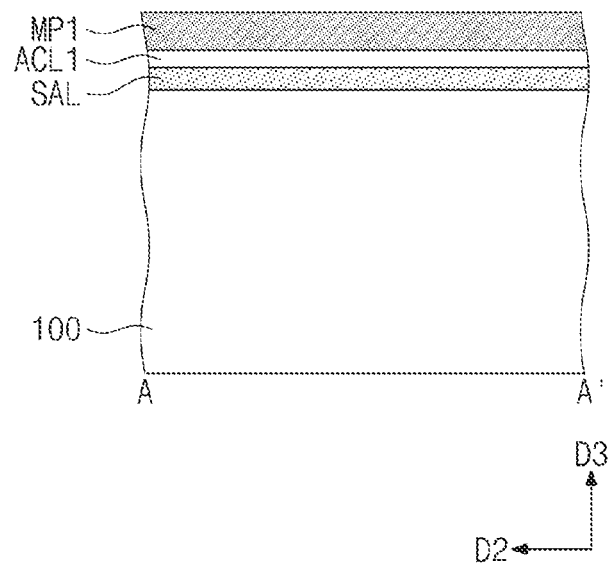
FIG. 6A is a sectional view that is taken along the line A-A' of FIG. 4 illustrating a method of fabricating a semiconductor device according to an embodiment of the inventive concept.
Figure 6B:
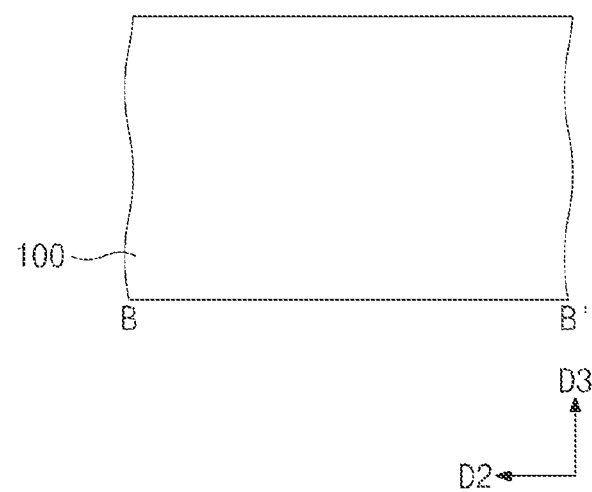
FIG. 6B is a sectional view that is taken along the line B-B' of FIG. 4 illustrating a method of fabricating a semiconductor device according to an embodiment of the inventive concept.
Figure 6C:
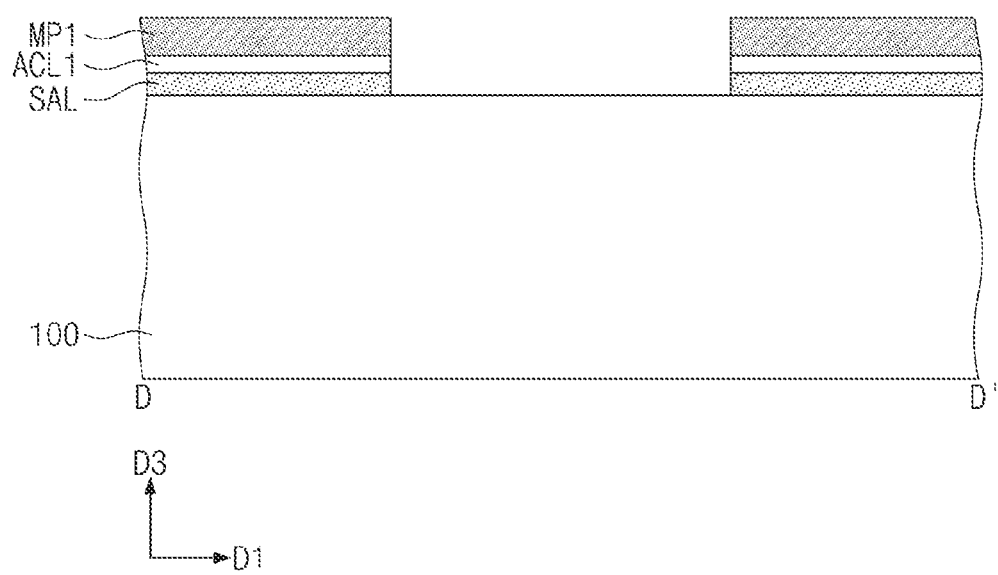
FIG. 6C is a sectional view that is taken along the line D-D' of FIG. 4 illustrating a method of fabricating a semiconductor device according to an embodiment of the inventive concept.

Referring to FIGS. 6A to 6C, a sacrificial layer SAL and a first active layer ACL1 may be formed on the substrate 100. The sacrificial layer SAL may be formed of or include at least one of silicon (Si), germanium (Ge), or silicon-germanium (SiGe). The first active layer ACL1 may also be formed of or include at least one of silicon (Si), germanium (Ge), or silicon-germanium (SiGe), but the composition of the first active layer ACL1 may be different than that of the sacrificial layer SAL. For example, the sacrificial layer SAL may be formed of or include silicon-germanium (SiGe), whereas the first active layer ACL1 may be formed of or include silicon (Si).

A first mask pattern MP1 may be locally formed on a portion of the substrate 100. The first mask pattern MP1 may be a line- or bar-shaped pattern extending in the second direction D2. In an embodiment, the first mask pattern MP1 may be formed of or include silicon nitride. A first patterning process using the first mask pattern MP1 as an etch mask may be performed to partially etch the sacrificial layer SAL and the first active layer ACL1 so that the top surface of the substrate 100 may be partially exposed. The semiconductor layer SL may be formed in a region that is formed by etching the sacrificial layer SAL and the first active layer ACL1.

Figure 7A:
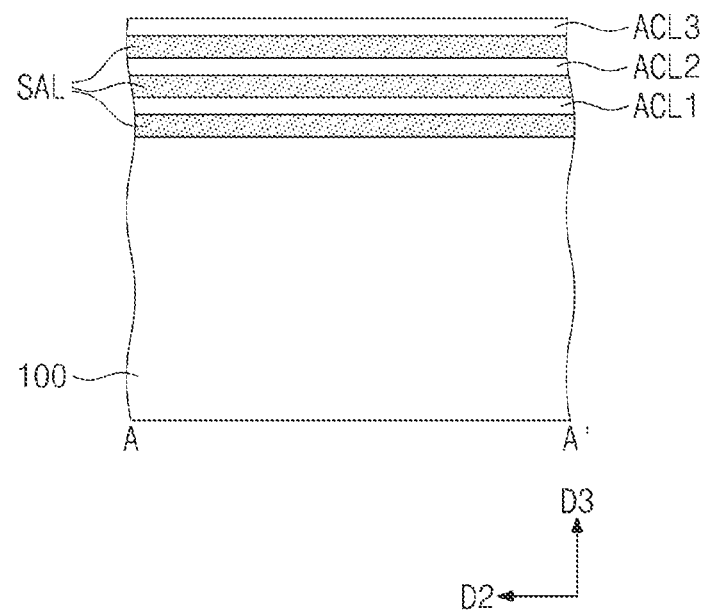
FIG. 7A is a sectional view that is taken along the line A-A' of FIG. 4 illustrating a method of fabricating a semiconductor device according to an embodiment of the inventive concept.
Figure 7B:
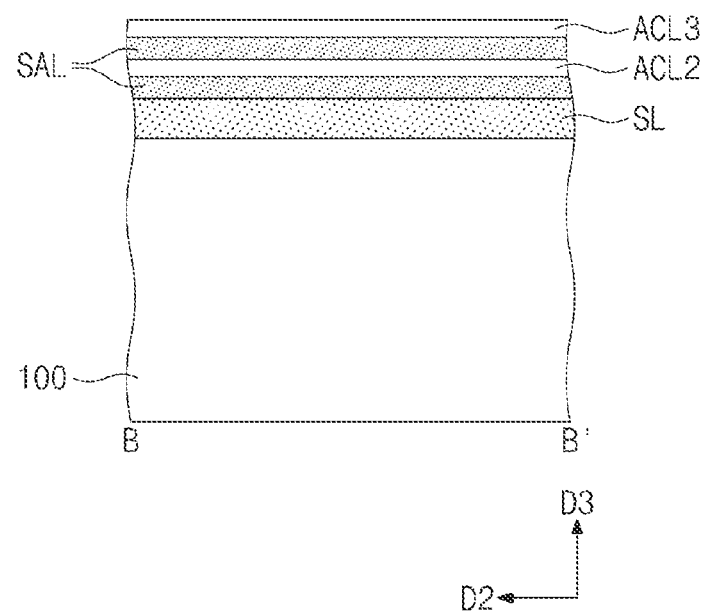
FIG. 7B is a sectional view that is taken along the line B-B' of FIG. 4 illustrating a method of fabricating a semiconductor device according to an embodiment of the inventive concept.
Figure 7C:
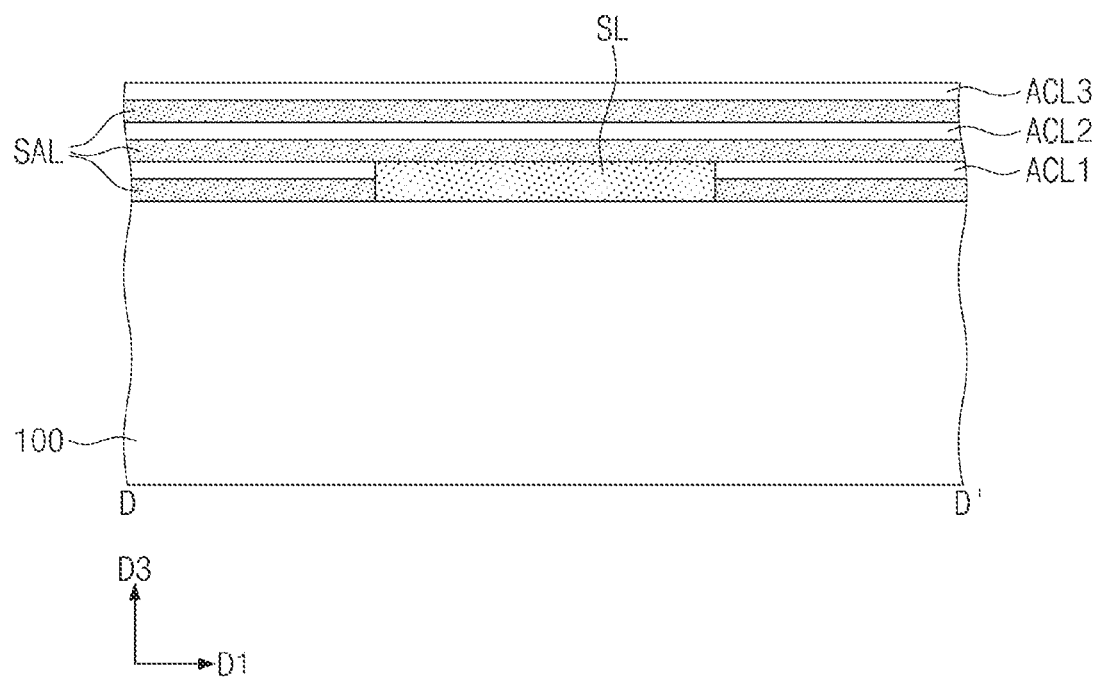
FIG. 7C is a sectional view that is taken along the line D-D' of FIG. 4 illustrating a method of fabricating a semiconductor device according to an embodiment of the inventive concept.

Referring to FIGS. 7A to 7C, the first mask pattern MP1 may be removed. The semiconductor layer SL may then be formed on the exposed top surface of the substrate 100. The semiconductor layer SL may be formed of or include one of silicon (Si) or silicon phosphide (SiP). In an embodiment, the semiconductor layer SL may be formed by performing an epitaxial growth process on the substrate 100. Alternatively, the semiconductor layer SL may be formed by growing a silicon (Si) layer from the exposed top surface of the substrate 100 and doping the silicon layer with impurities. The impurities may be phosphorus (P). The semiconductor layer SL may have a top surface that is substantially coplanar with the top surface of the first active layer ACL1. The semiconductor layer SL may be a portion of the first active pattern AP1.

Sacrificial layers SAL and second and third active layers ACL2 and ACL3 may be alternately stacked on the first active layer ACL1. The second and third active layers ACL2 and ACL3 may be formed of or include the same material as the first active layer ACL1. A sacrificial layer SAL may cover the top surface of the semiconductor layer SL. The sacrificial layers SAL and the second and third active layers ACL2 and ACL3 that are stacked on the semiconductor layer SL may be formed on the entire top surface of the substrate 100.

Figure 8A:
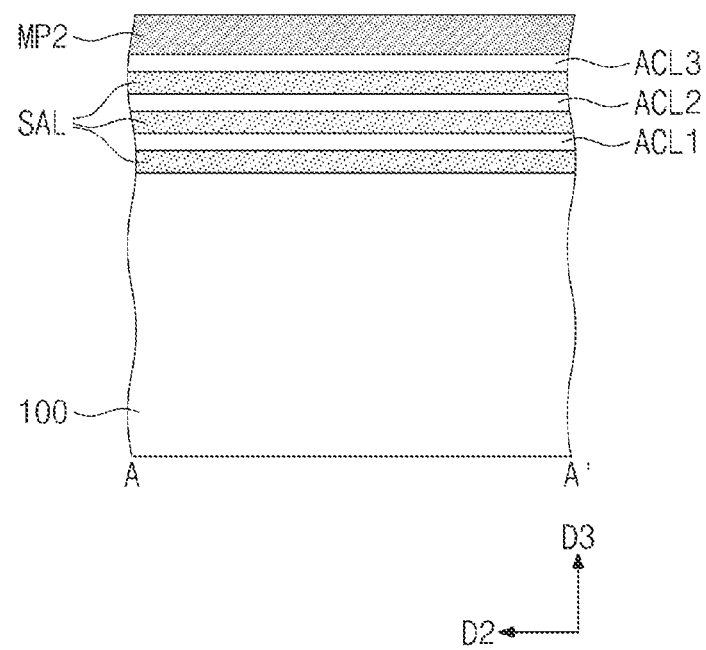
FIG. 8A is a sectional view that is taken along the line A-A' of FIG. 4 illustrating a method of fabricating a semiconductor device according to an embodiment of the inventive concept.
Figure 8B:
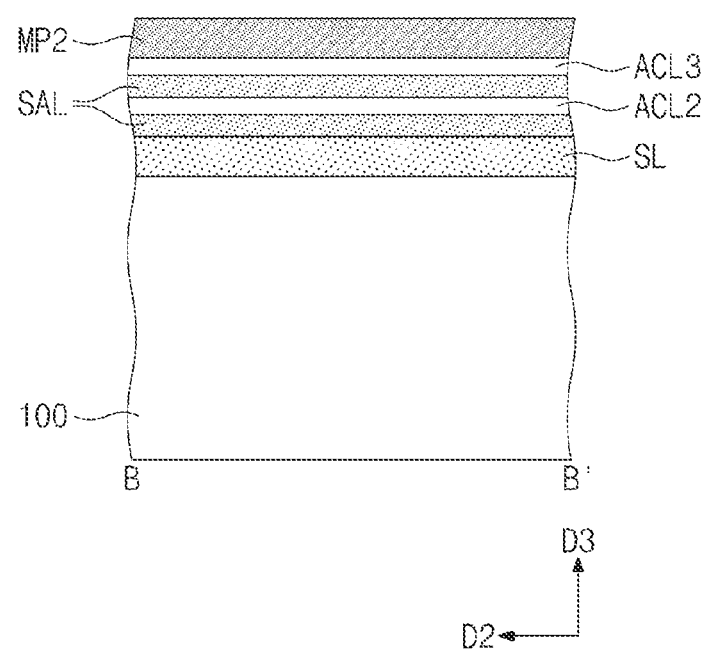
FIG. 8B is a sectional view that is taken along the line B-B' of FIG. 4 illustrating a method of fabricating a semiconductor device according to an embodiment of the inventive concept.
Figure 8C:
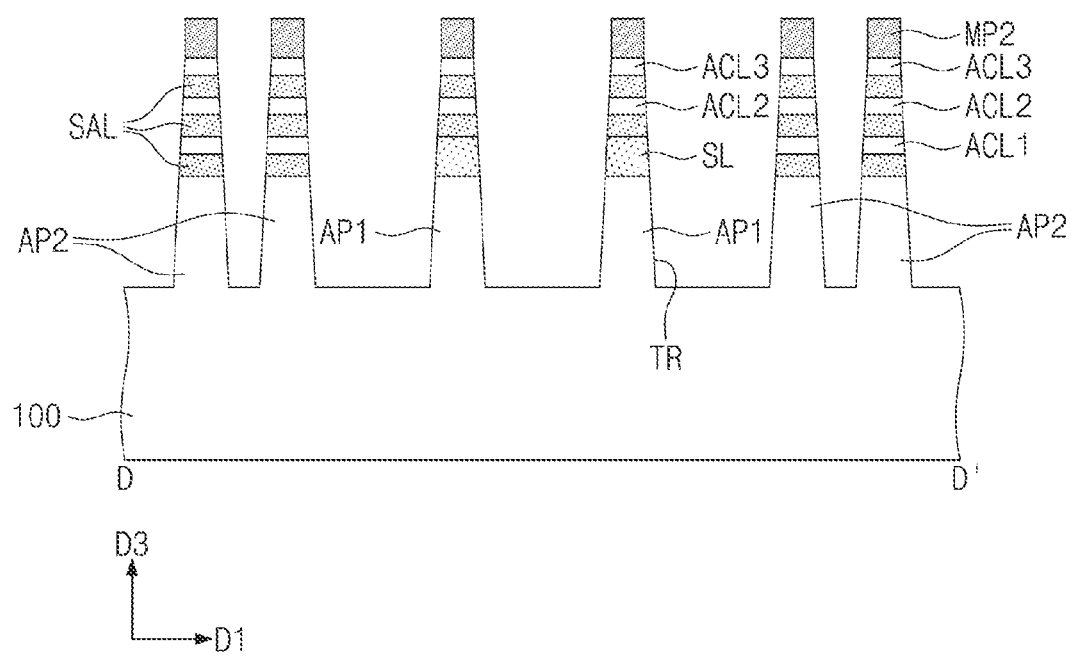
FIG. 8C is a sectional view that is taken along the line D-D' of FIG. 4 illustrating a method of fabricating a semiconductor device according to an embodiment of the inventive concept.
Figure 9A:
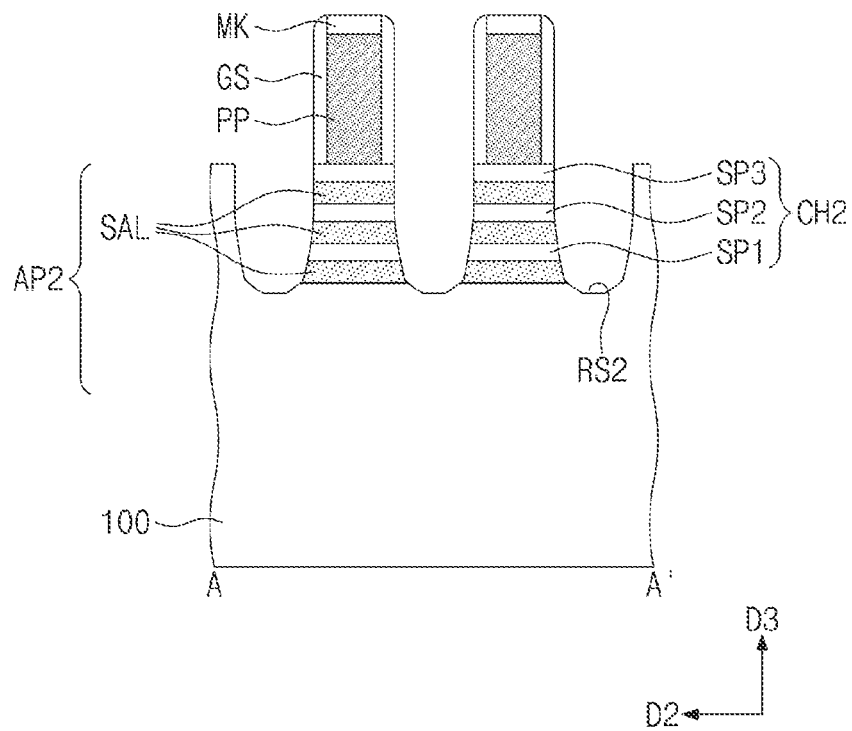
FIG. 9A is a sectional view that is taken along the line A-A' of FIG. 4 illustrating a method of fabricating a semiconductor device according to an embodiment of the inventive concept.
Figure 9B:
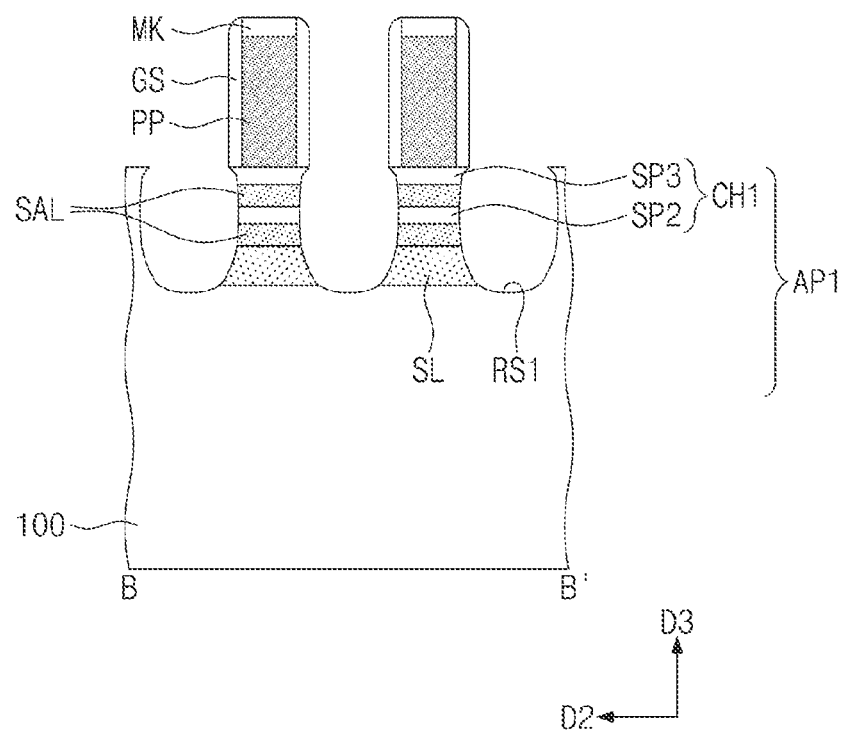
FIG. 9B is a sectional view that is taken along the line B-B' of FIG. 4 illustrating a method of fabricating a semiconductor device according to an embodiment of the inventive concept.
Figure 9C:
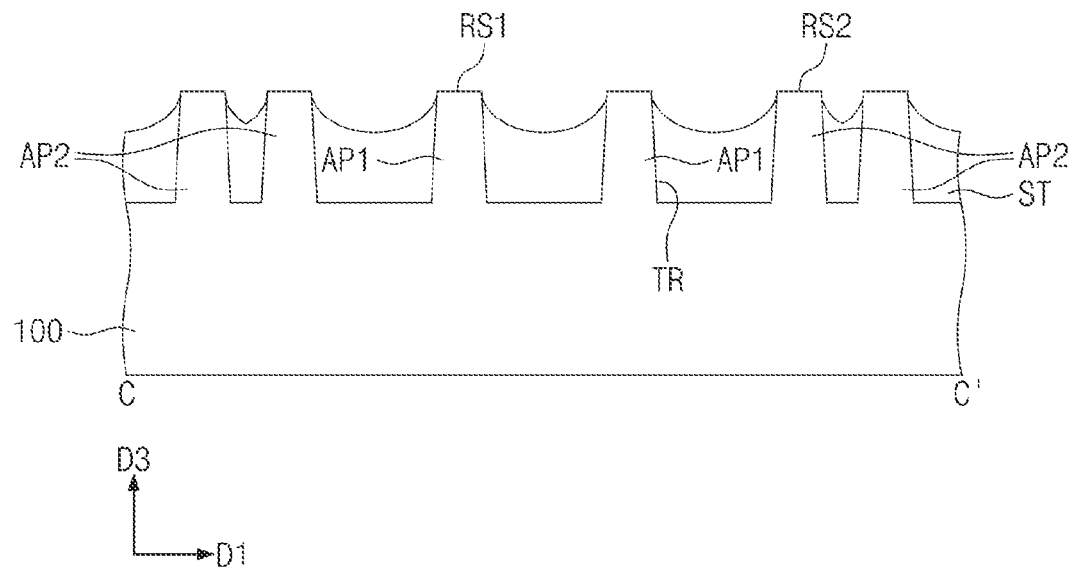
FIG. 9C is a sectional view that is taken along the line C-C' of FIG. 4 illustrating a method of fabricating a semiconductor device according to an embodiment of the inventive concept.
Figure 9D:
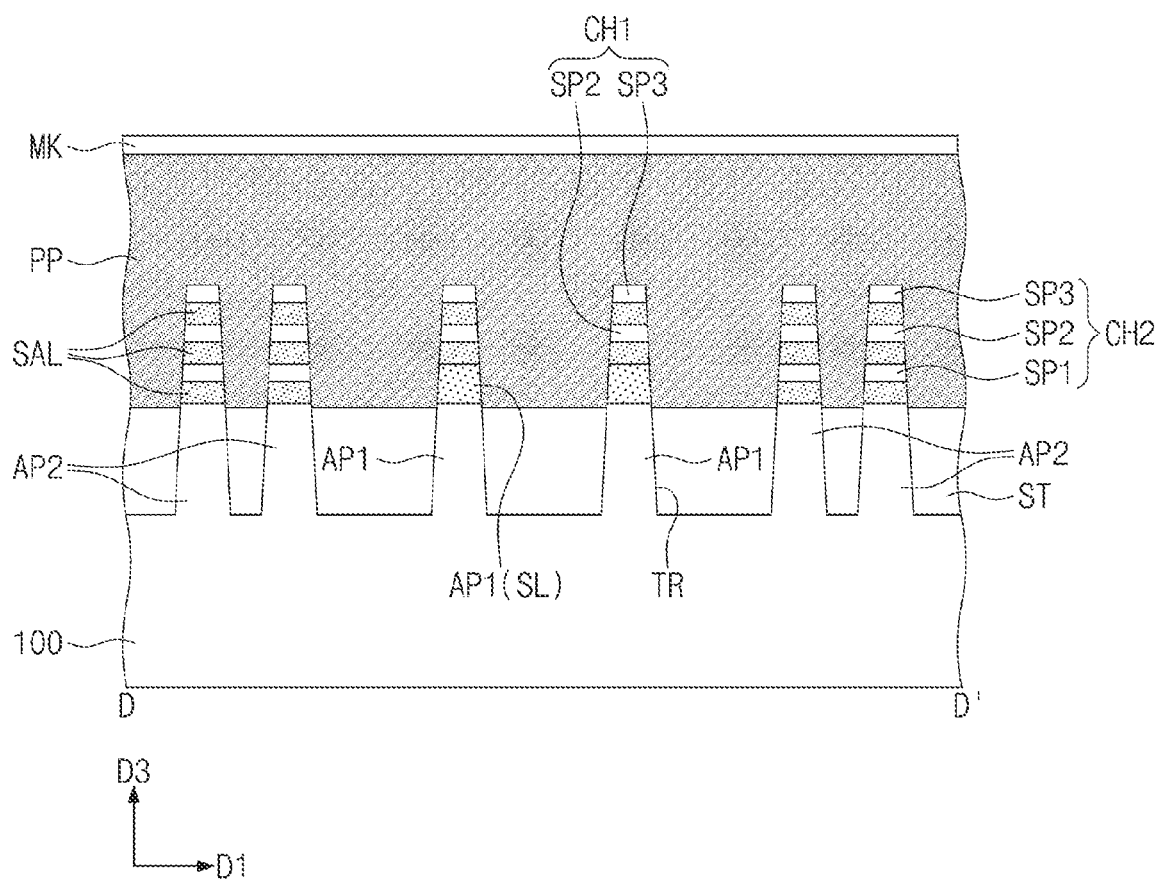
FIG. 9D is a sectional view that is taken along the line D-D' of FIG. 4 illustrating a method of fabricating a semiconductor device according to an embodiment of the inventive concept.

Referring to FIGS. 8A to 8C, a second mask pattern MP2 may be locally formed on a portion of the third active layer ACL3. The second mask pattern MP2 may be a line- or bar-shaped pattern extending in the second direction D2. In an embodiment, the second mask pattern MP2 may be formed of or include silicon nitride.

A second patterning process using the second mask pattern MP2 as an etch mask may be performed to form the trench TR defining the first and second active patterns AP1 and AP2. The second active patterns AP2 may include the sacrificial layers SAL alternately stacked with the first to third active layers ACL1, ACL2, and ACL3 in their upper portions. The first active patterns AP1 may include the semiconductor layer SL, and may also include the sacrificial layers SAL alternately stacked with the second and third active layers ACL2 and ACL3 in their upper portions.

Referring to FIGS. 9A to 9D, the device isolation layer ST may be formed on the substrate 100 to fill the trench TR. For example, an insulating layer may be formed on the substrate 100 to cover the first and second active patterns AP1 and AP2. A planarization process may then be performed on the insulating layer to expose the uppermost sacrificial layer SAL so that the second mask pattern MP2 may be removed. After the planarization process, the device isolation layer ST may be formed by recessing the insulating layer.

The device isolation layer ST may be formed of or include an insulating material (e.g., silicon oxide). Each of the first and second active patterns AP1 and AP2 may include an upper portion protruding above the device isolation layer ST. In other words, the upper portion of each of the first and second active patterns AP1 and AP2 may be a protruding pattern, which is vertically extended above the device isolation layer ST.

Sacrificial patterns PP may be formed on the substrate 100 to cross the first and second active patterns AP1 and AP2. Each of the sacrificial patterns PP may be a line- or bar-shaped pattern extending in the first direction D1. The sacrificial patterns PP may be arranged, with a specific pitch, in the second direction D2.

In detail, the formation of the sacrificial patterns PP may include forming a sacrificial layer on the substrate 100, forming hard masks MA on the sacrificial layer, and patterning the sacrificial layer using the hard masks MA as an etch mask. The sacrificial layer may be formed of or include poly silicon.

A pair of gate spacers GS may be formed on both side surfaces of each of the sacrificial patterns PP. The formation of the gate spacers GS may include conformally forming a gate spacer layer on the substrate 100 and anisotropically etching the gate spacer layer. The gate spacer layer may be formed of or include at least one of SiCN, SiCON, or SiN. Alternatively, the gate spacer layer may be a multi-layered structure including at least two of SiCN, SiCON, or SiN. First recesses RS1 may be formed in an upper portion of the first active patterns AP1. Second recesses RS2 may be formed in an upper portion of the second active patterns AP2. During the formation of the first and second recesses RS1 and RS2, the device isolation layer ST may be recessed at both sides of each of the first and second active patterns AP1 and AP2 (see, e.g., FIG. 9C).

In detail, the first and second recesses RS1 and RS2 may be formed by recessing the upper portions of the first and second active patterns AP1 and AP2 using the hard masks MK and the gate spacers GS as an etch mask. Each of the first and second recesses RS1 and RS2 may be formed between a pair of sacrificial patterns PP. The first recesses RS1 may be formed by etching the sacrificial layers SAL and the first to third active layers ACL1, ACL2, and ACL3. The second recesses RS2 may be formed by etching the sacrificial layers SAL, the second and third active layers ACL2 and ACL3, and the semiconductor layer SL.

As a result of the formation of the first and second recesses RS1 and RS2, the second and third active layers ACL2 and ACL3 of a first active pattern AP1 may be respectively used as the second and third semiconductor patterns SP2 and SP3 constituting a first channel pattern CH1. Similarly, the first to third active layers ACL1, ACL2, and ACL3 of ae second active pattern AP2 may be respectively used as the first to third semiconductor patterns SP1, SP2, and SP3 constituting a second channel pattern CH2.

Figure 10A:
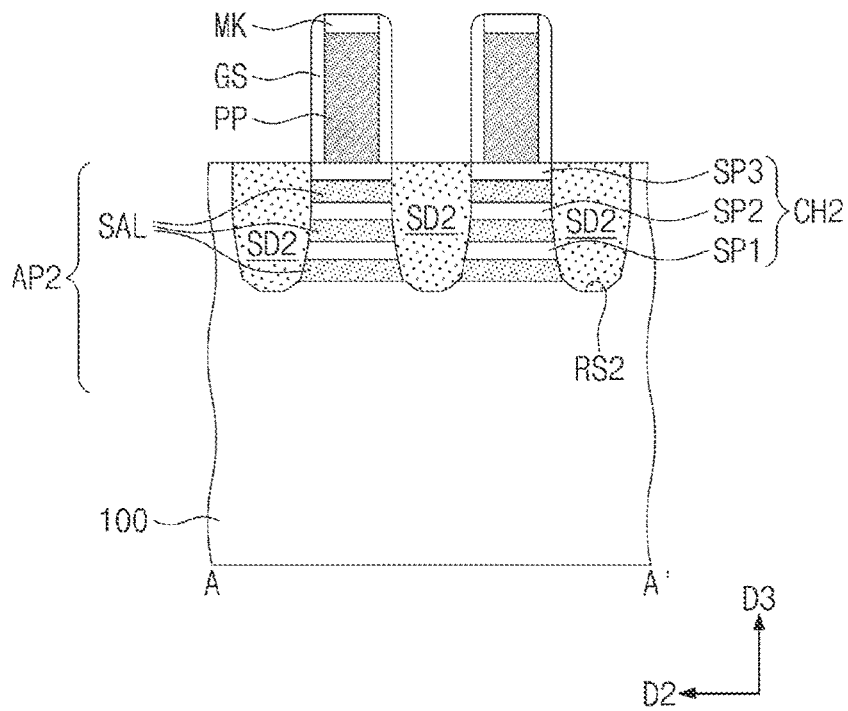
FIG. 10A is a sectional view that is taken along the line A-A' of FIG. 4 illustrating a method of fabricating a semiconductor device according to an embodiment of the inventive concept.
Figure 10B:
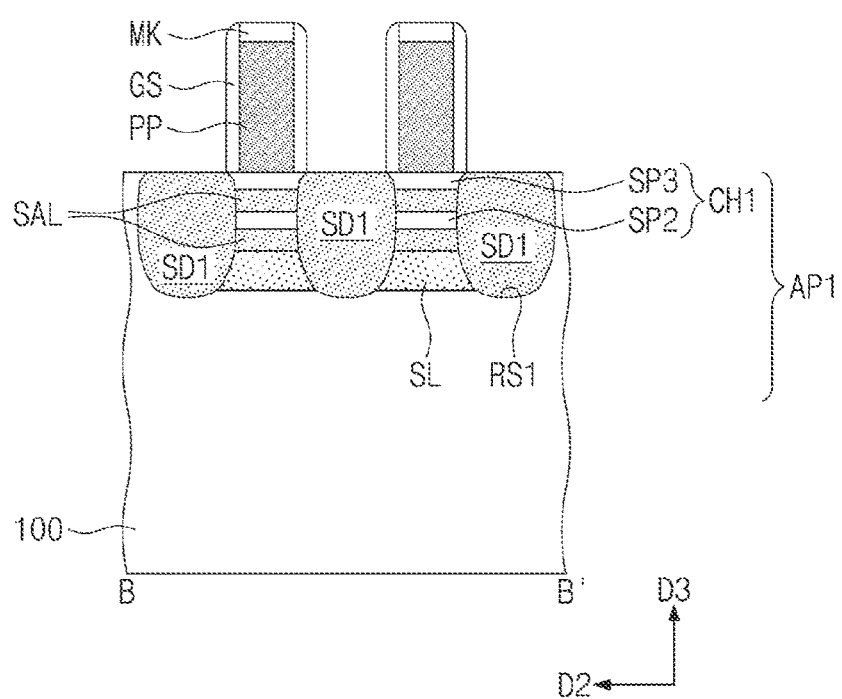
FIG. 10B is a sectional view that is taken along the line B-B' of FIG. 4 illustrating a method of fabricating a semiconductor device according to an embodiment of the inventive concept.
Figure 10C:
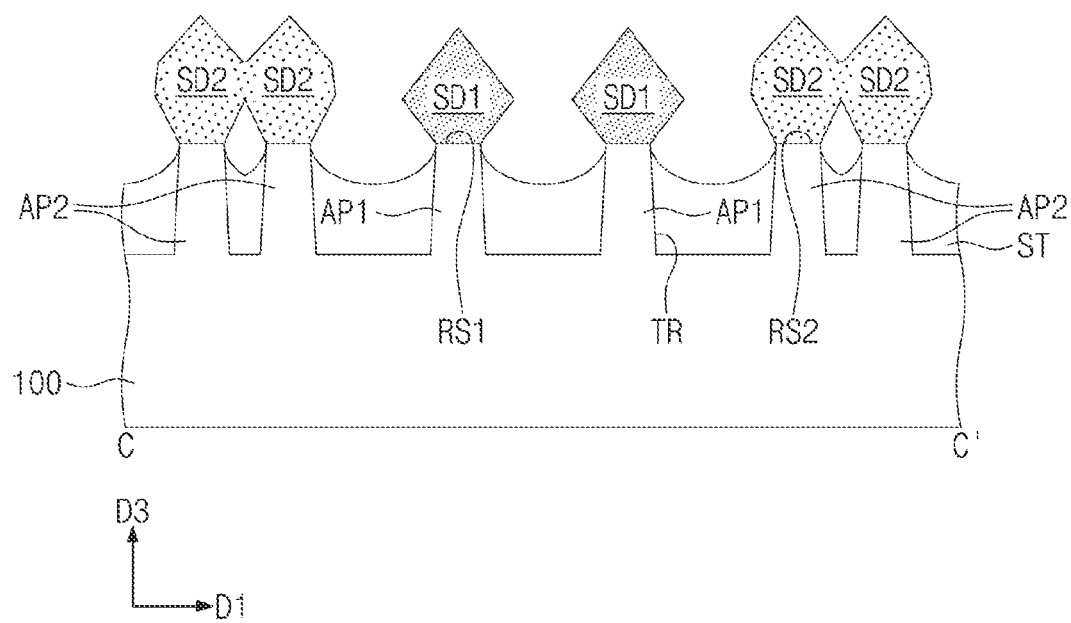
FIG. 10C is a sectional view that is taken along the line C-C' of FIG. 4 illustrating a method of fabricating a semiconductor device according to an embodiment of the inventive concept.
Figure 11A:
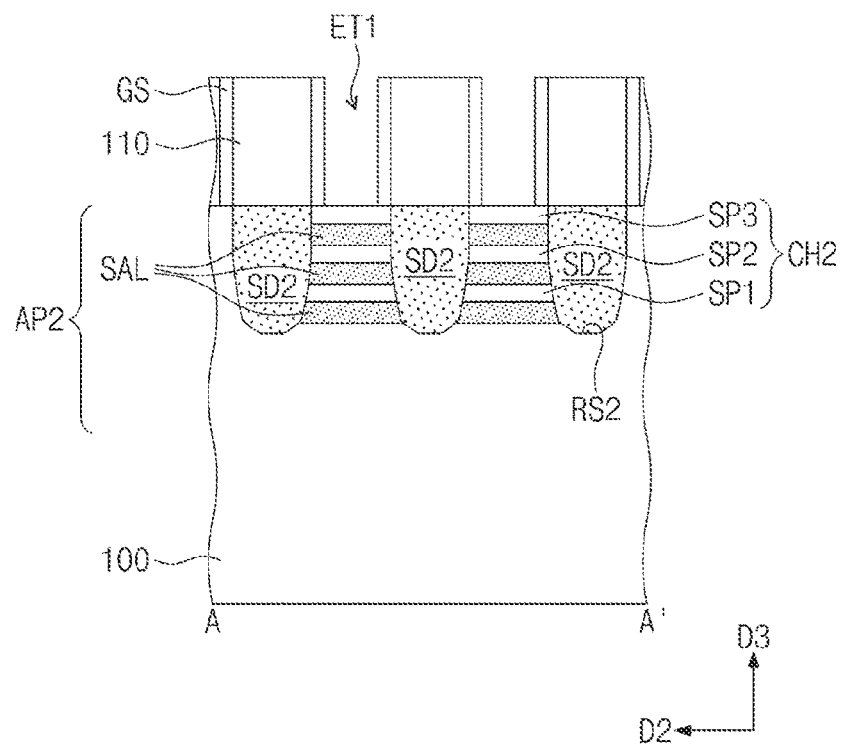
FIG. 11A is a sectional view that is taken along the line A-A' of FIG. 4 illustrating a method of fabricating a semiconductor device according to an embodiment of the inventive concept.
Figure 11B:
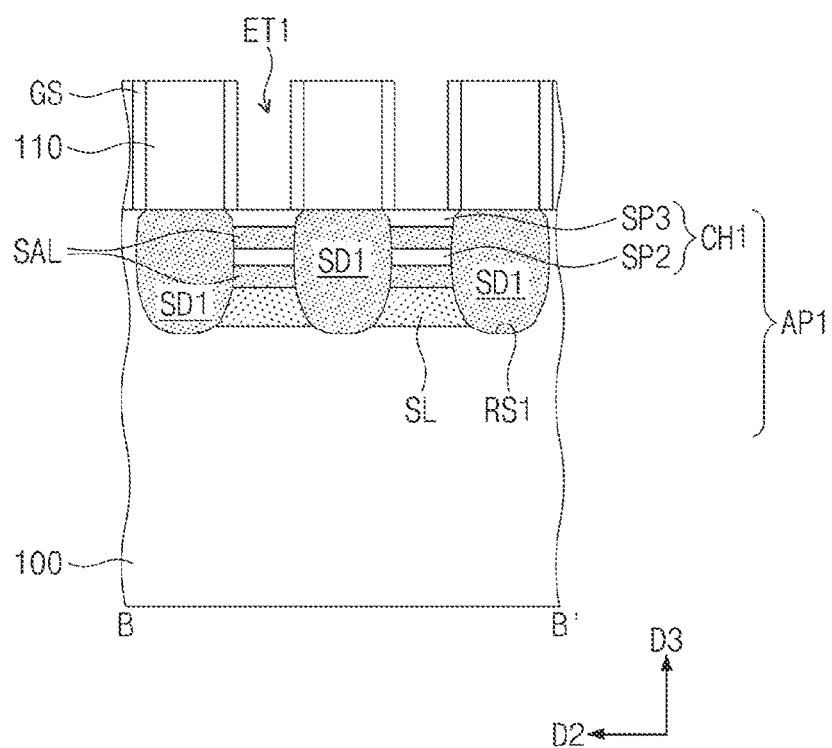
FIG. 11B is a sectional view that is taken along the line B-B' of FIG. 4 illustrating a method of fabricating a semiconductor device according to an embodiment of the inventive concept.
Figure 11C:
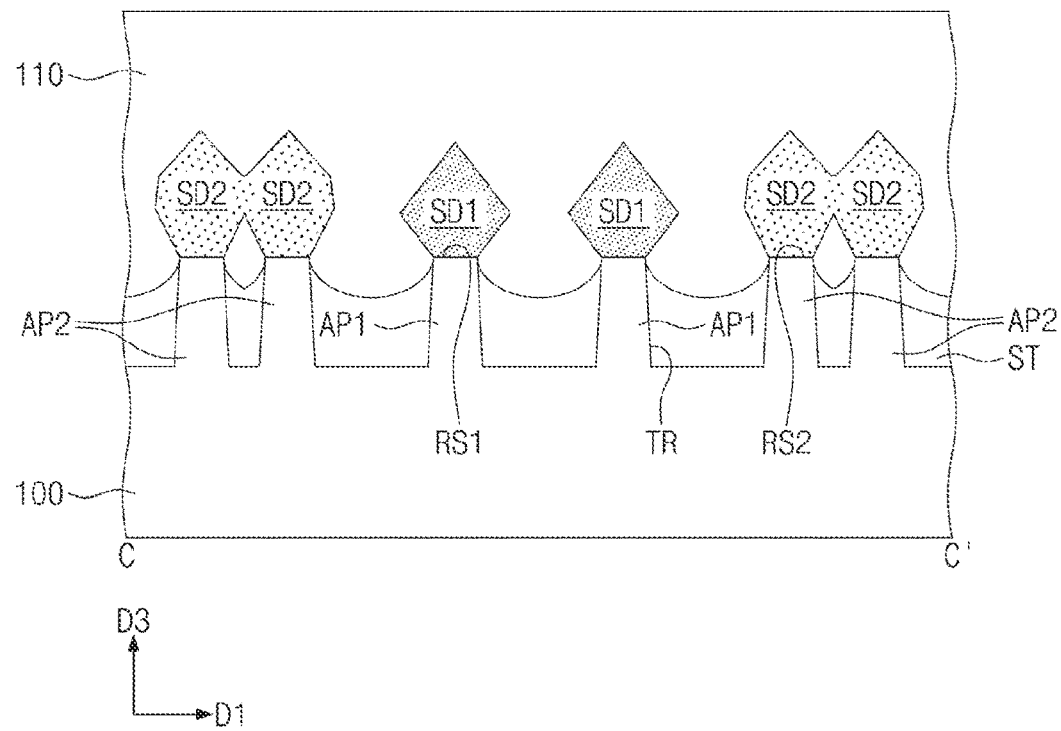
FIG. 11C is a sectional view that is taken along the line C-C' of FIG. 4 illustrating a method of fabricating a semiconductor device according to an embodiment of the inventive concept.
Figure 11D:
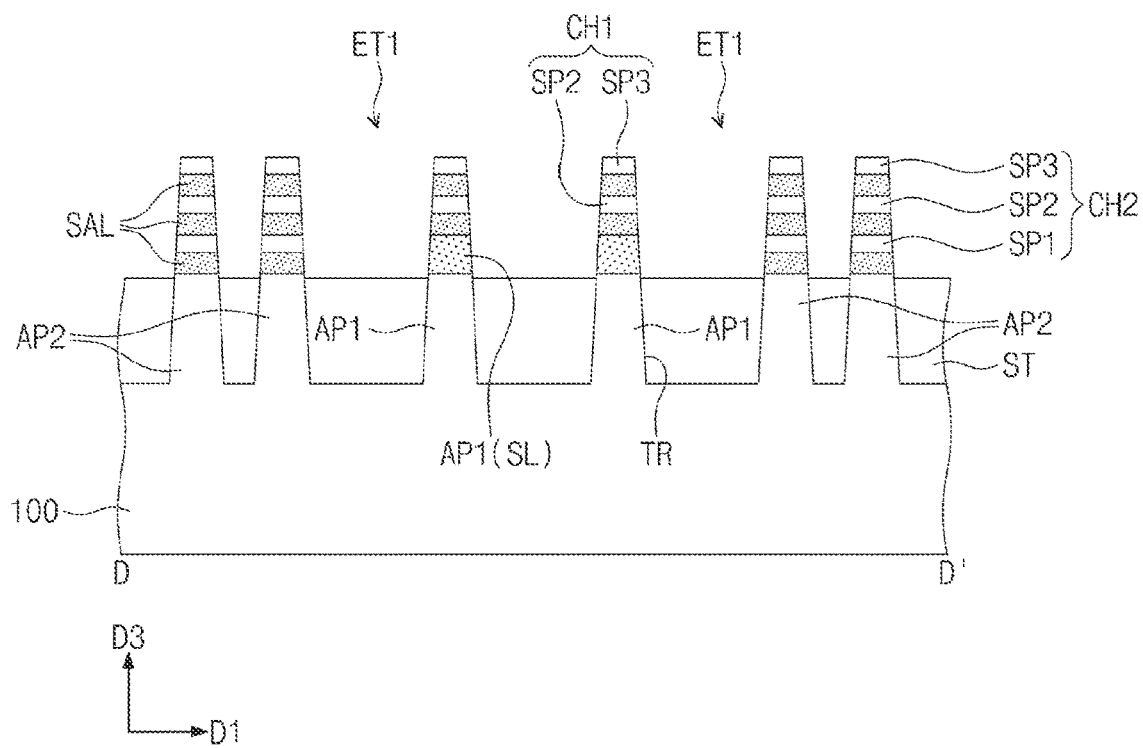
FIG. 11D is a sectional view that is taken along the line D-D' of FIG. 4 illustrating a method of fabricating a semiconductor device according to an embodiment of the inventive concept.
Figure 12A:
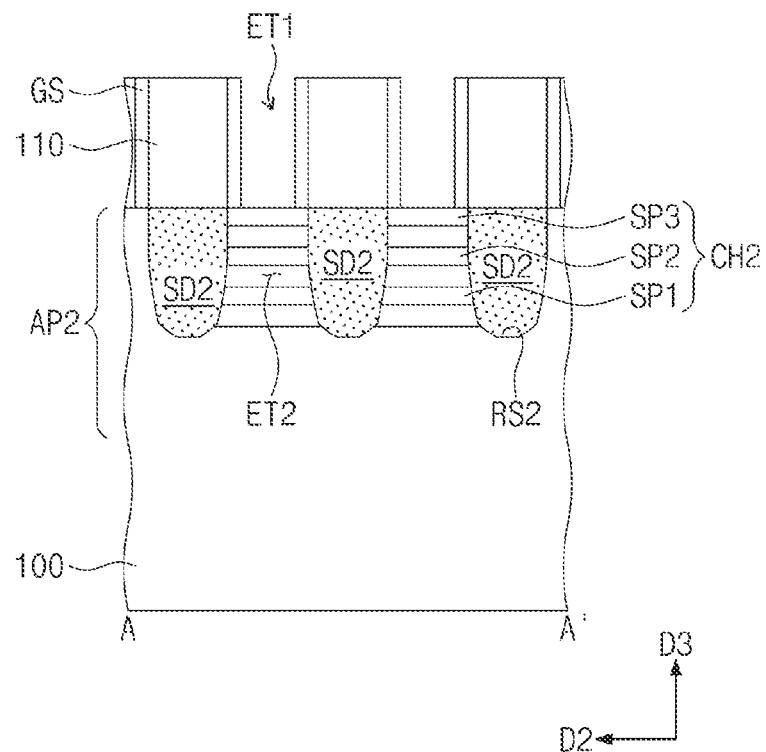
FIG. 12A is a sectional view that is taken along the line A-A' of FIG. 4 illustrating a method of fabricating a semiconductor device according to an embodiment of the inventive concept.
Figure 12B:
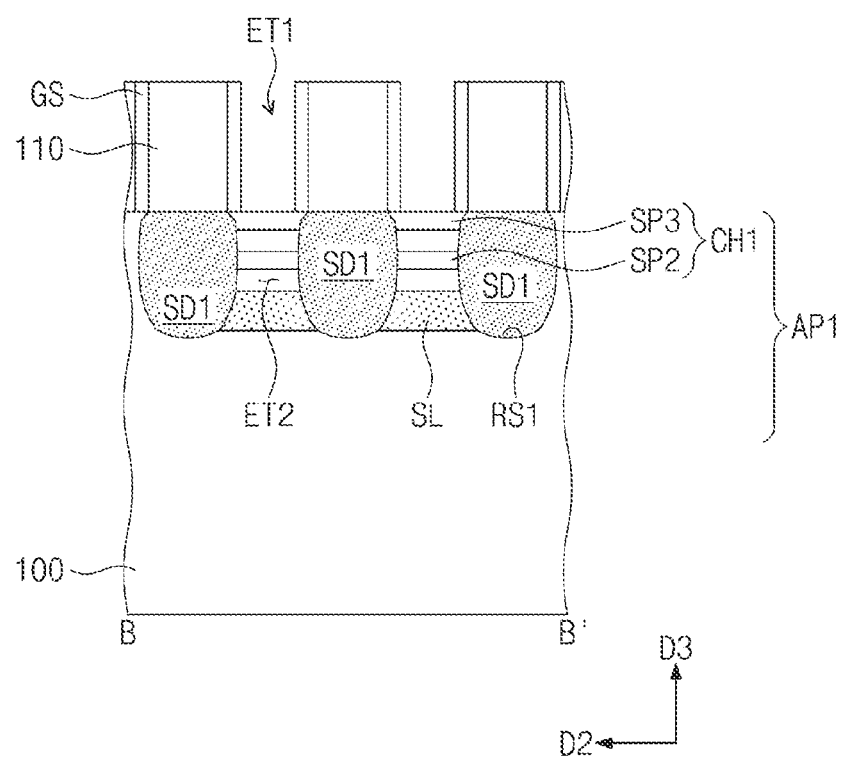
FIG. 12B is a sectional view that is taken along the line B-B' of FIG. 4 illustrating a method of fabricating a semiconductor device according to an embodiment of the inventive concept.
Figure 12C:
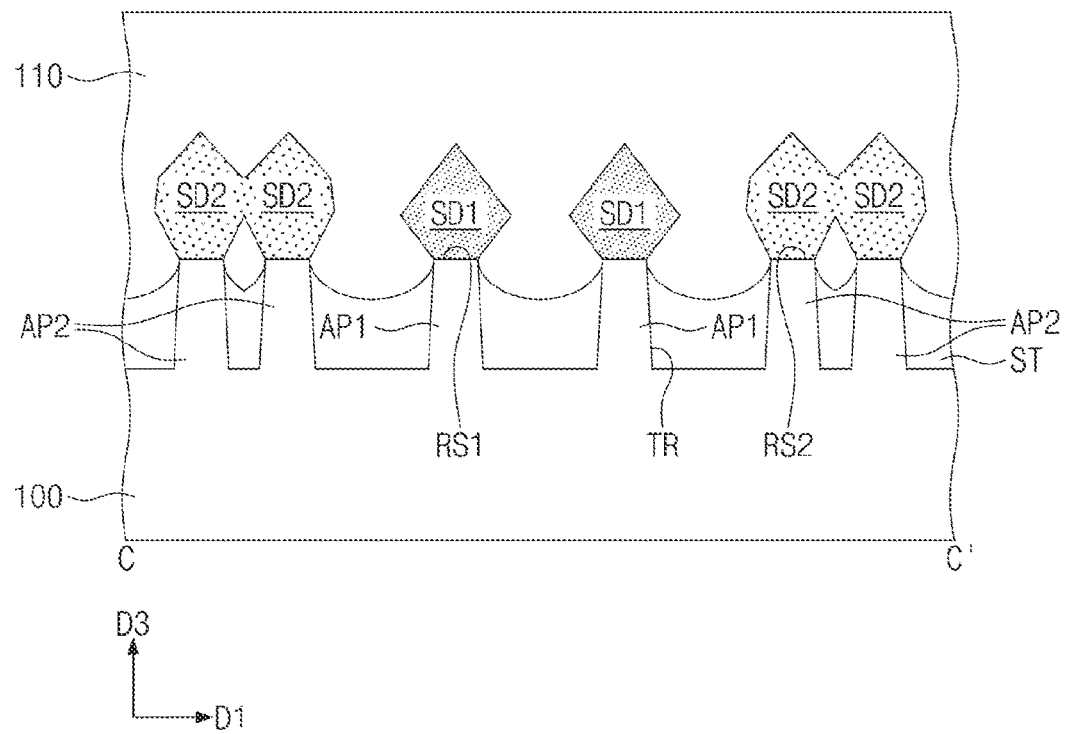
FIG. 12C is a sectional view that is taken along the line C-C' of FIG. 4 illustrating a method of fabricating a semiconductor device according to an embodiment of the inventive concept.
Figure 12D:
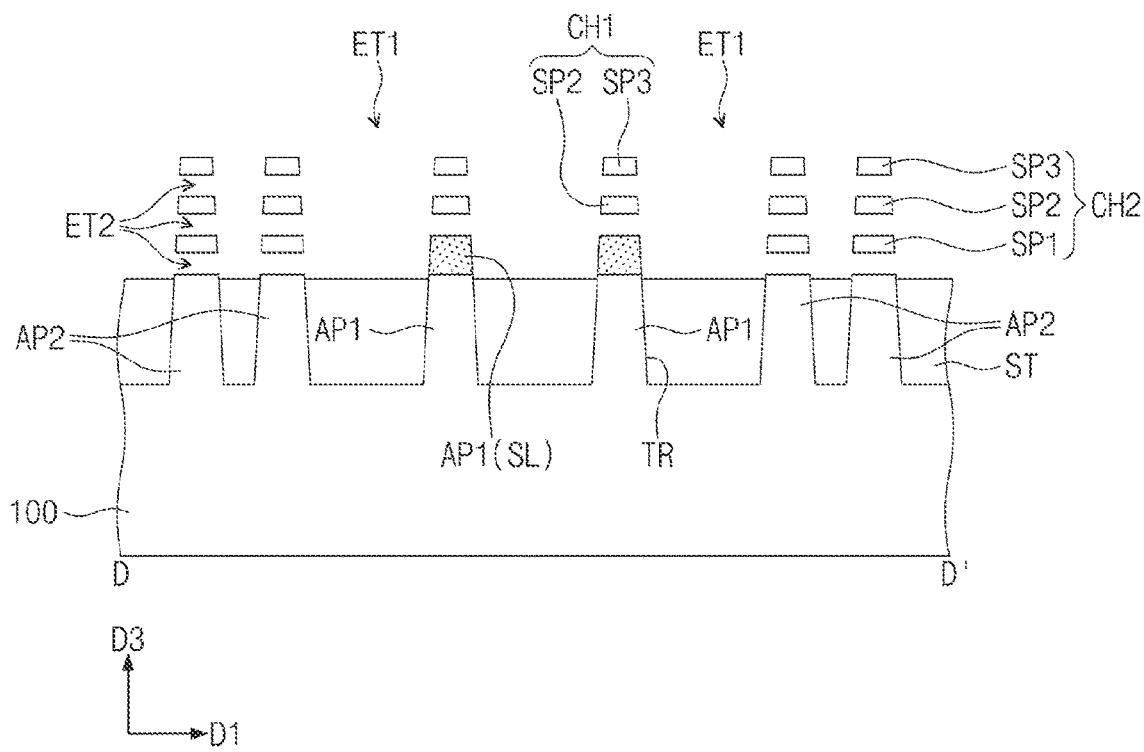
FIG. 12D is a sectional view that is taken along the line D-D' of FIG. 4 illustrating a method of fabricating a semiconductor device according to an embodiment of the inventive concept.
Figure 13A:
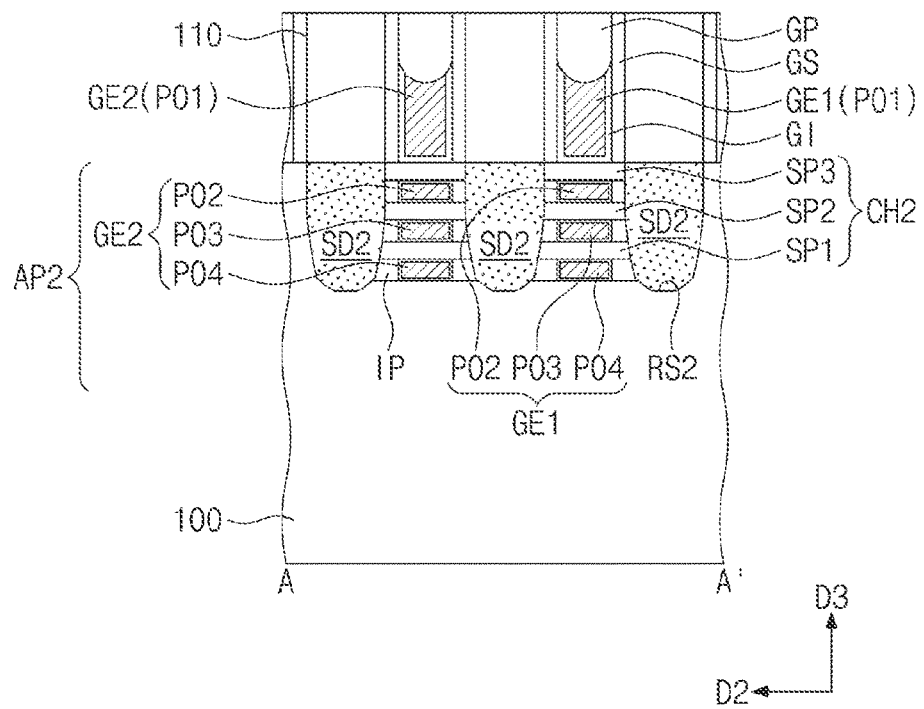
FIG. 13A is a sectional view that is taken along the line A-A' of FIG. 4 illustrating a method of fabricating a semiconductor device according to an embodiment of the inventive concept.
Figure 13B:
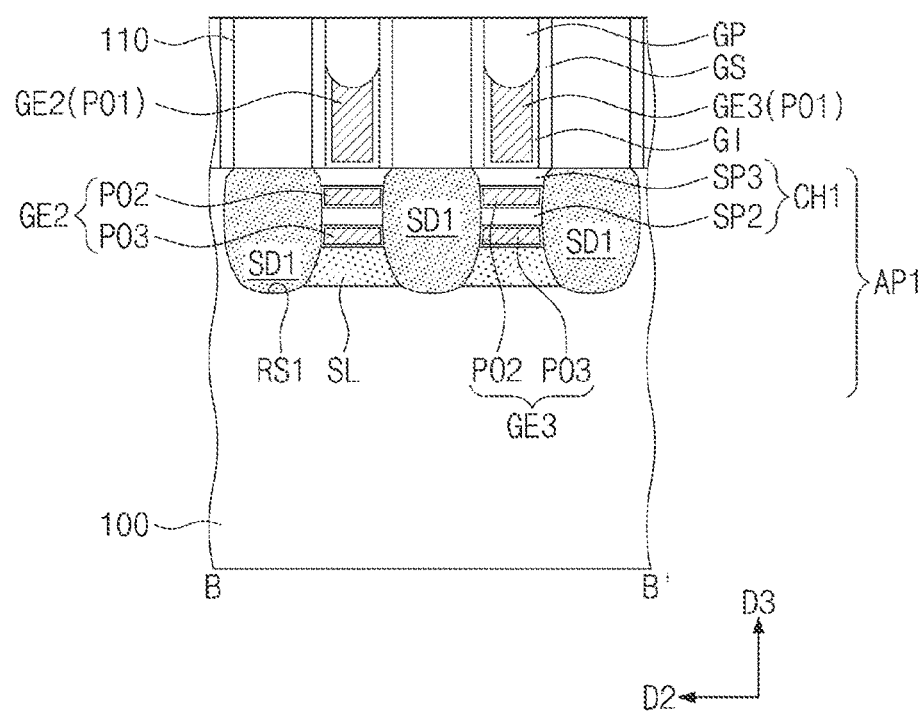
FIG. 13B is a sectional view that is taken along the line B-B' of FIG. 4 illustrating a method of fabricating a semiconductor device according to an embodiment of the inventive concept.
Figure 13C:
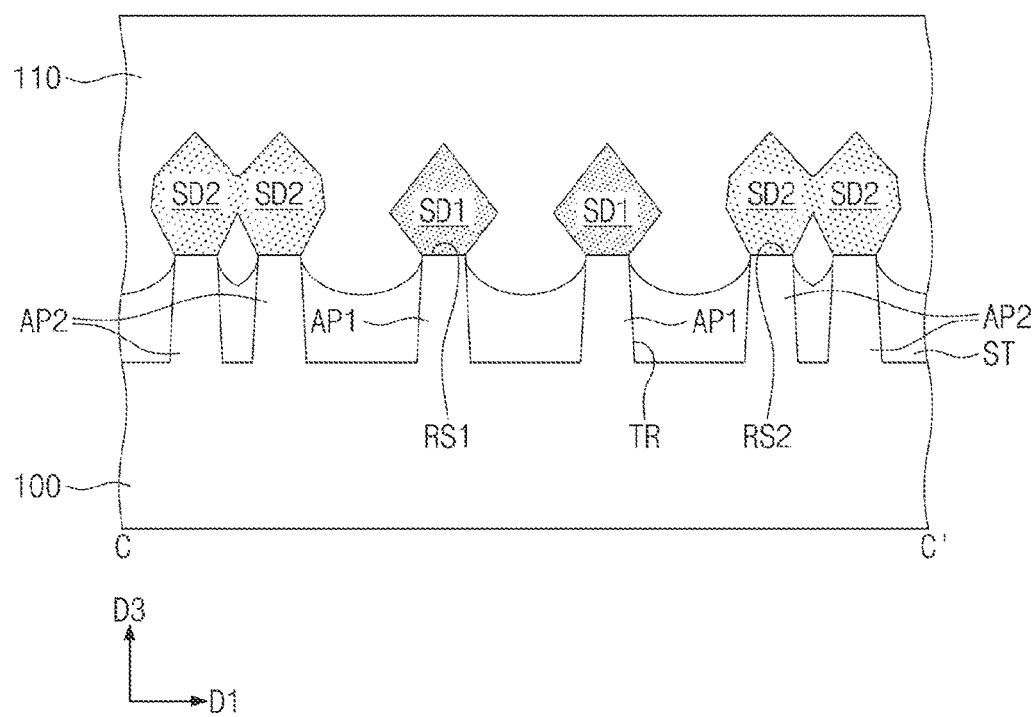
FIG. 13C is a sectional view that is taken along the line C-C' of FIG. 4 illustrating a method of fabricating a semiconductor device according to an embodiment of the inventive concept.
Figure 13D:
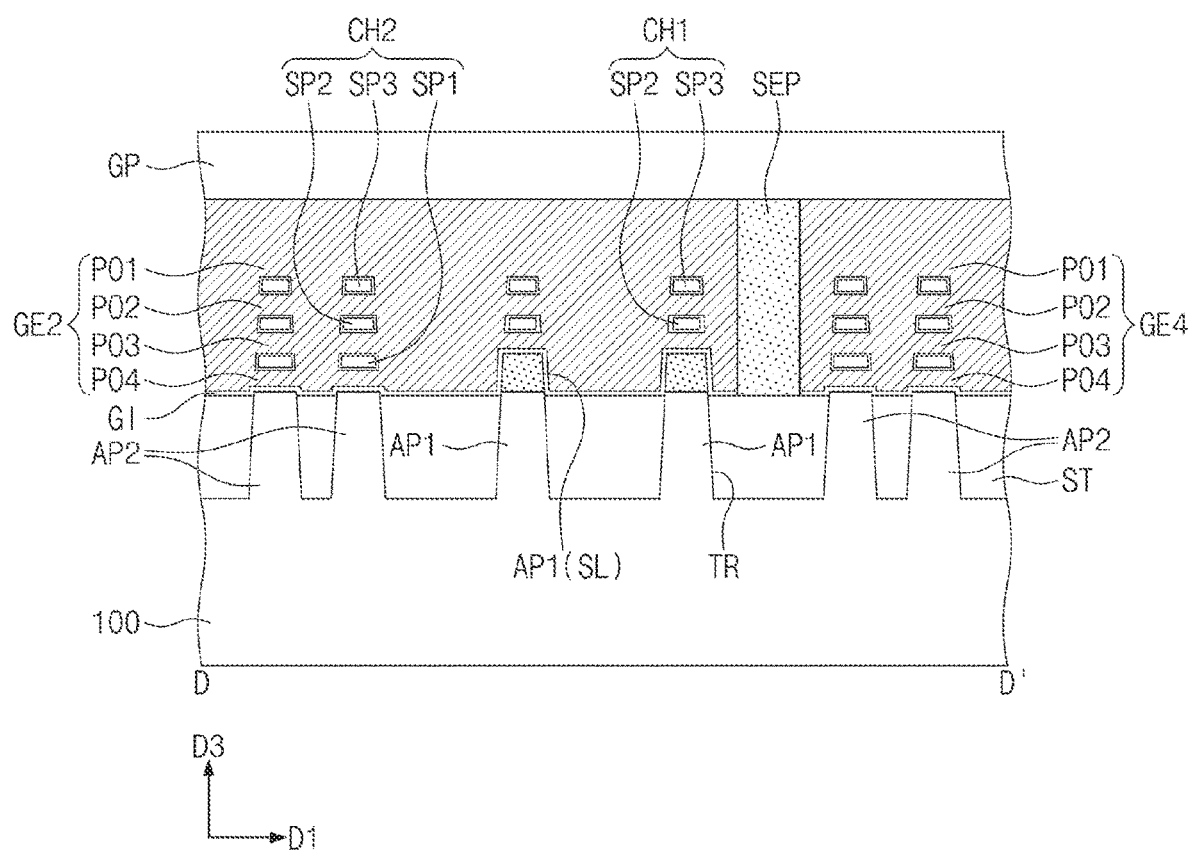
FIG. 13D is a sectional view that is taken along the line D-D' of FIG. 4 illustrating a method of fabricating a semiconductor device according to an embodiment of the inventive concept.

Referring to FIGS. 10A to 10C, the first source/drain patterns SD1 may be formed in the first recesses RS1. In detail, a first source/drain pattern SD1 may be formed by a selective epitaxial growth process, in which an inner side surface of a first recess RS1 is used as a seed layer. A first channel pattern CH1 and the semiconductor layer SL may be interposed between a pair of the first source/drain patterns SD1. As an example, the first source/drain patterns SD1 may be formed of or include a semiconductor material (e.g., SiGe) with a lattice constant that is greater than that of the semiconductor material of the substrate 100.

In an embodiment, the first source/drain patterns SD1 may be doped in-situ with impurities during the selective epitaxial growth process in which the first source/drain patterns SD1 are formed. In another embodiment, impurities may be injected into the first source/drain patterns SD1 after the first source/drain patterns SD1 are formed. The first source/drain patterns SD1 may be doped to have a first conductivity type (e.g., p-type).

The second source/drain patterns SD2 may be formed in the second recesses RS2. In detail, a second source/drain pattern SD2 may be formed by a selective epitaxial growth process, in which an inner side surface of a second recess RS2 is used as a seed layer. A second channel pattern CH2 may be interposed between a pair of the second source/drain patterns SD2. As an example, the second source/drain patterns SD2 may be formed of or include the same semiconductor material (e.g., Si) as the substrate 100. The second source/drain patterns SD2 may be doped to have a second conductivity type (e.g., n-type).

The first source/drain patterns SD1 and the second source/drain patterns SD2 may be sequentially formed through different processes. In other words, the first source/drain patterns SD1 and the second source/drain patterns SD2 may not be formed at the same time.

Referring to FIGS. 11A to 11D, the first interlayer insulating layer 110 may be formed to cover the first and second source/drain patterns SD1 and SD2, the hard masks MK, and the gate spacers GS. In an embodiment, the first interlayer insulating layer 110 may be formed of or include silicon oxide.

The first interlayer insulating layer 110 may be planarized to expose the top surfaces of the sacrificial patterns PP. The planarization of the first interlayer insulating layer 110 may be performed using an etch-back or chemical mechanical polishing (CMP) process. All of the hard masks MK may be removed during the planarization process. Accordingly, the top surface of the first interlayer insulating layer 110 may be coplanar with the top surfaces of the sacrificial patterns PP and the top surfaces of the gate spacers GS.

The exposed sacrificial patterns PP may be removed. As a result of the removal of the sacrificial patterns PP, first empty spaces ET1 may be formed to expose the first and second active patterns AP1 and AP2 (see, e.g., FIG. 11D).

Referring to FIGS. 12A to 12D, the sacrificial layers SAL, which are exposed through the first empty space ET1, may be removed. In detail, the sacrificial layers SAL of each of the first and second active patterns AP1 and AP2 may be exposed through the first empty space ET1. The sacrificial layers SAL may be selectively removed by an etching process including etching the sacrificial layers SAL and preventing or suppressing the etching of the first to third semiconductor pattern SP1, SP2, and SP3 and the semiconductor layer SL. The etching process may be a wet etching process.

That is, second empty spaces ET2 may be formed as a result of the removal of the sacrificial layers SAL. The second empty spaces ET2 may be formed between the first to third semiconductor patterns SP1, SP2, and SP3 and between the semiconductor layer SL and the second semiconductor patterns SP2.

Referring to FIGS. 13A to 13D, the gate insulating layer GI may be conformally formed in the first and second empty spaces ET1 and ET2. In detail, the gate insulating layer GI may be formed on the exposed surface of each of the first to third semiconductor patterns SP1, SP2, and SP3. The gate insulating layer GI may also be formed on the top surface of the device isolation layer ST and the top surface of the substrate 100.

The first to fourth gate electrodes GE1 to GE4 may be formed in the first and second empty spaces ET1 and ET2. Each of the first to fourth gate electrodes GE1 to GE4 may include the second to fourth gate patterns PO2, PO3, and PO4 filling the second empty spaces ET2 on the second active pattern AP2. Each of the second and third gate electrodes GE2 and GE3 may include the second and third gate patterns PO2 and PO3 filling the second empty spaces ET2 on the first active pattern AP1. Each of the first to fourth gate electrodes GE1 to GE4 may further include the first gate pattern PO1 filling the first empty spaces ET1.

The separation pattern SEP may be formed by partially removing the first to fourth gate electrodes GE1 to GE4 and filling the removed region with an insulating material. Due to the separation pattern SEP, the first to fourth gate electrodes GE1 to GE4 may be separated from each other. The gate capping patterns GP may be formed on the first to fourth gate electrodes GE1 to GE4, respectively.

In an embodiment, the insulating patterns IP may be formed on the second active patterns AP2 before the gate insulating layer GI is formed. The insulating pattern IP may be formed to partially fill the second empty spaces ET2. In this case, a gate electrode on the second active patterns AP2 may be spaced apart from the second source/drain pattern SD2, with the insulating pattern IP interposed therebetween.

Referring back to FIGS. 4 and 5A to 5D, the first to eighth active contacts AC1 to AC8 may be formed to penetrate the first interlayer insulating layer 110 and to be electrically connected to the first and second source/drain patterns SD1 and SD2. The first and second gate contacts GC1 and GC2 may be formed to penetrate the first interlayer insulating layer 110 and the gate capping pattern GP and to be respectively electrically connected to the second and third gate electrodes GE2 and GE3.

The first to eighth active contacts AC1 to AC8 and the first and second gate contacts GC1 and GC2 may be simultaneously formed through a middle-of-line (MOL) process. For example, first contact holes may be formed in the first interlayer insulating layer 110 through a first photolithography process. The first contact holes may define the first to eighth active contacts AC1 to AC8. The first contact holes may be formed to expose the first and second source/drain patterns SD1 and SD2. The first contact holes may be formed by a self-aligned method using the gate spacers GS and the gate capping patterns GP as a mask.

Second contact holes may be formed through a second photolithography process. The second contact holes may define the first and second gate contacts GC1 and GC2. The second contact holes may be formed to expose the top surfaces of the second and third gate electrodes GE2 and GE3.

For example, a portion of a first contact hole defining the second active contact AC2 may be overlapped with a portion of a second contact hole defining the first gate contact GC1. In other words, the first and second contact holes, which are overlapped with each other, may form a single contact hole.

The first to eighth active contacts AC1 to AC8 and the first and second gate contacts GC1 and GC2 may be formed by sequentially filling the first and second contact holes with a barrier layer and a conductive layer. For example, the second active contact AC2 and the first gate contact GC1 may constitute a single contact structure UC. The silicide patterns SC may be formed on the first and second source/drain patterns SD1 and SD2, which are exposed through the first contact holes.

Referring back to FIGS. 4 and 5A to 5D, the second to fourth interlayer insulating layers 120, 130, and 140 may be sequentially formed on the first interlayer insulating layer 110. A back-end-of-line (BEOL) process may be performed to form the first interconnection layer M1 in the second interlayer insulating layer 120, to form the second interconnection layer M2 in the third interlayer insulating layer 130, and to form the third interconnection layer M3 in the fourth interlayer insulating layer 140.

In a method of fabricating a semiconductor device according to an embodiment of the inventive concept, it may be possible to selectively remove lower active and sacrificial layers without removing upper active and sacrificial layers. This may make it possible to simplify a subsequent process and to reduce the number of mask-using processes. As a result, it may be possible to increase a degree of freedom in design and to reduce technical difficulties in the subsequent process.

Figure 14A:
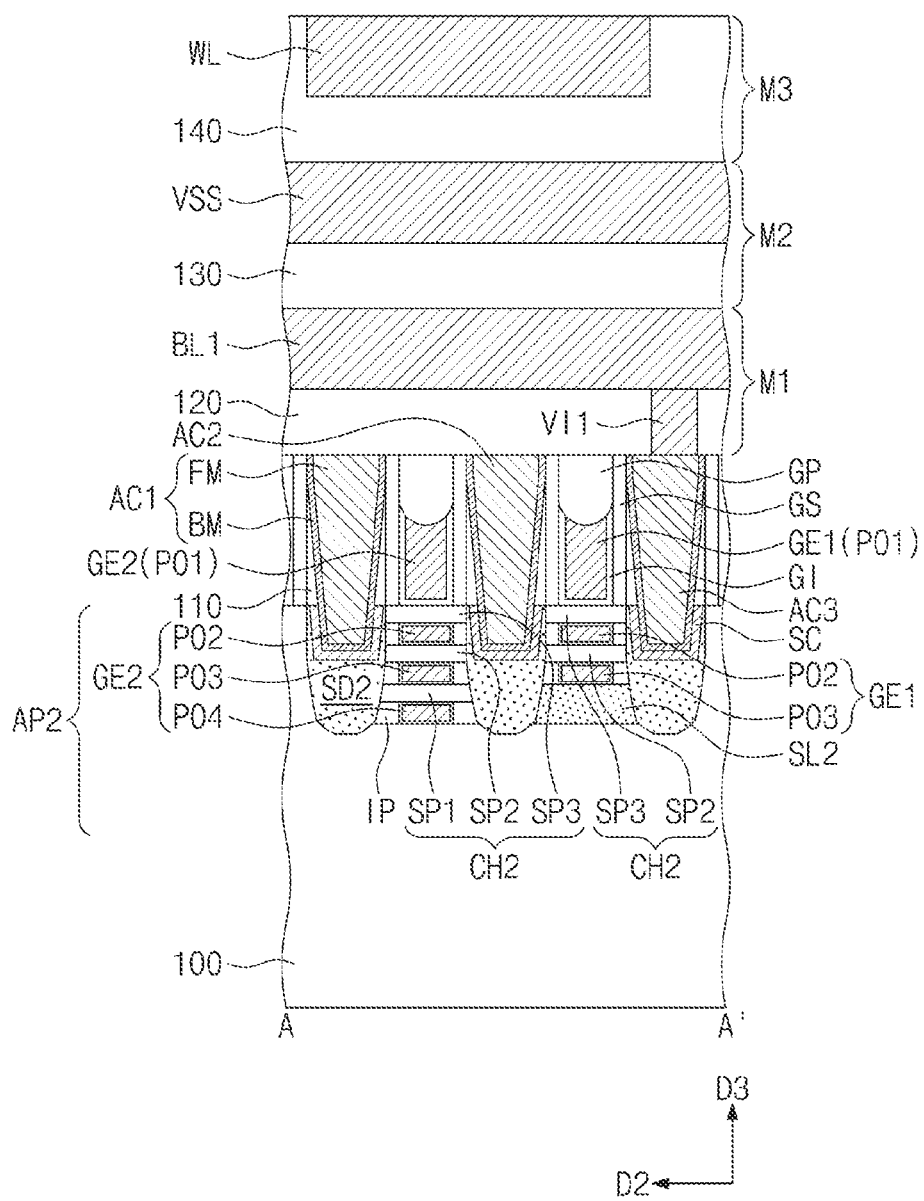
FIG. 14A is a sectional view that is taken along the line A-A' of FIG. 4 to illustrate a semiconductor device according to an embodiment of the inventive concept.
Figure 14B:
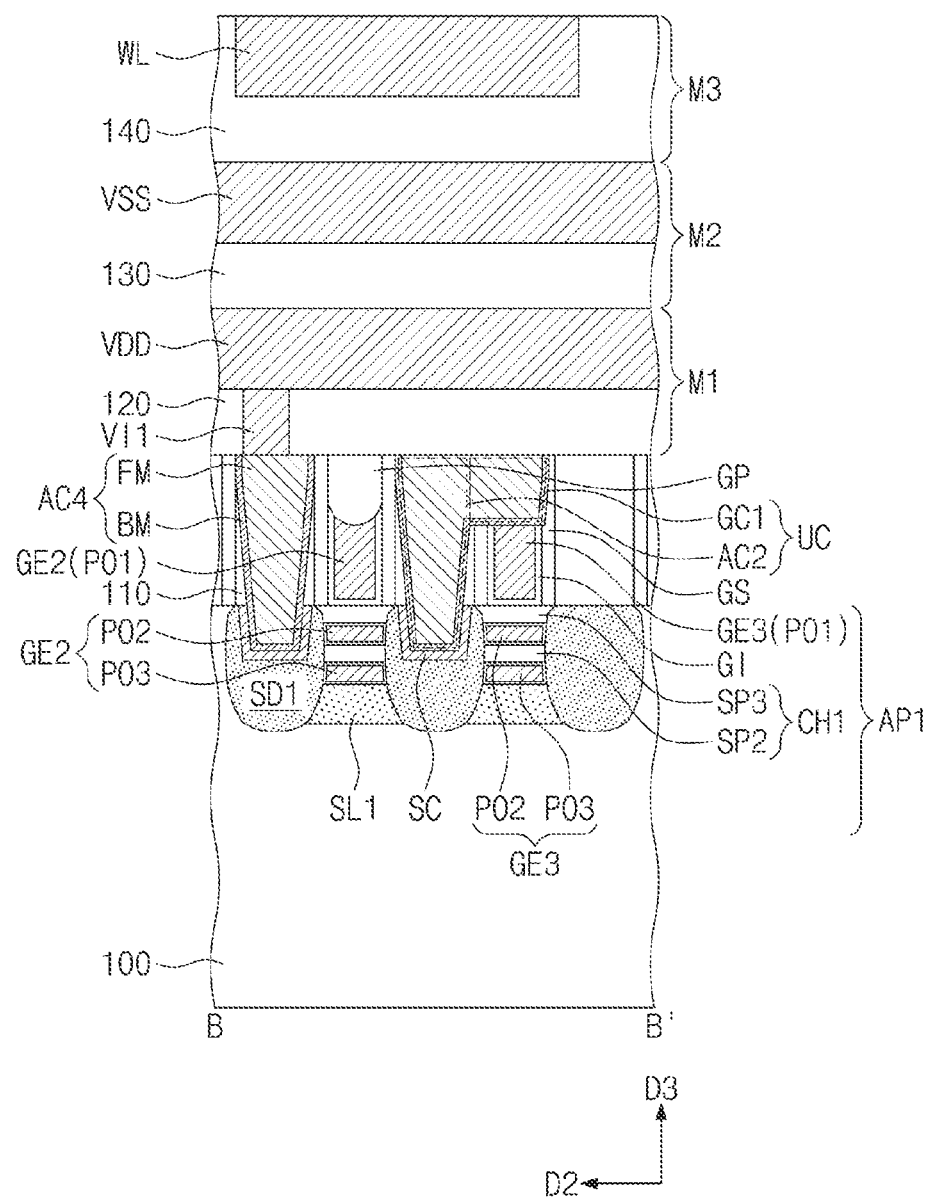
FIG. 14B is a sectional view that is taken along the line B-B' of FIG. 4 to illustrate a semiconductor device according to an embodiment of the inventive concept.
Figure 14C:
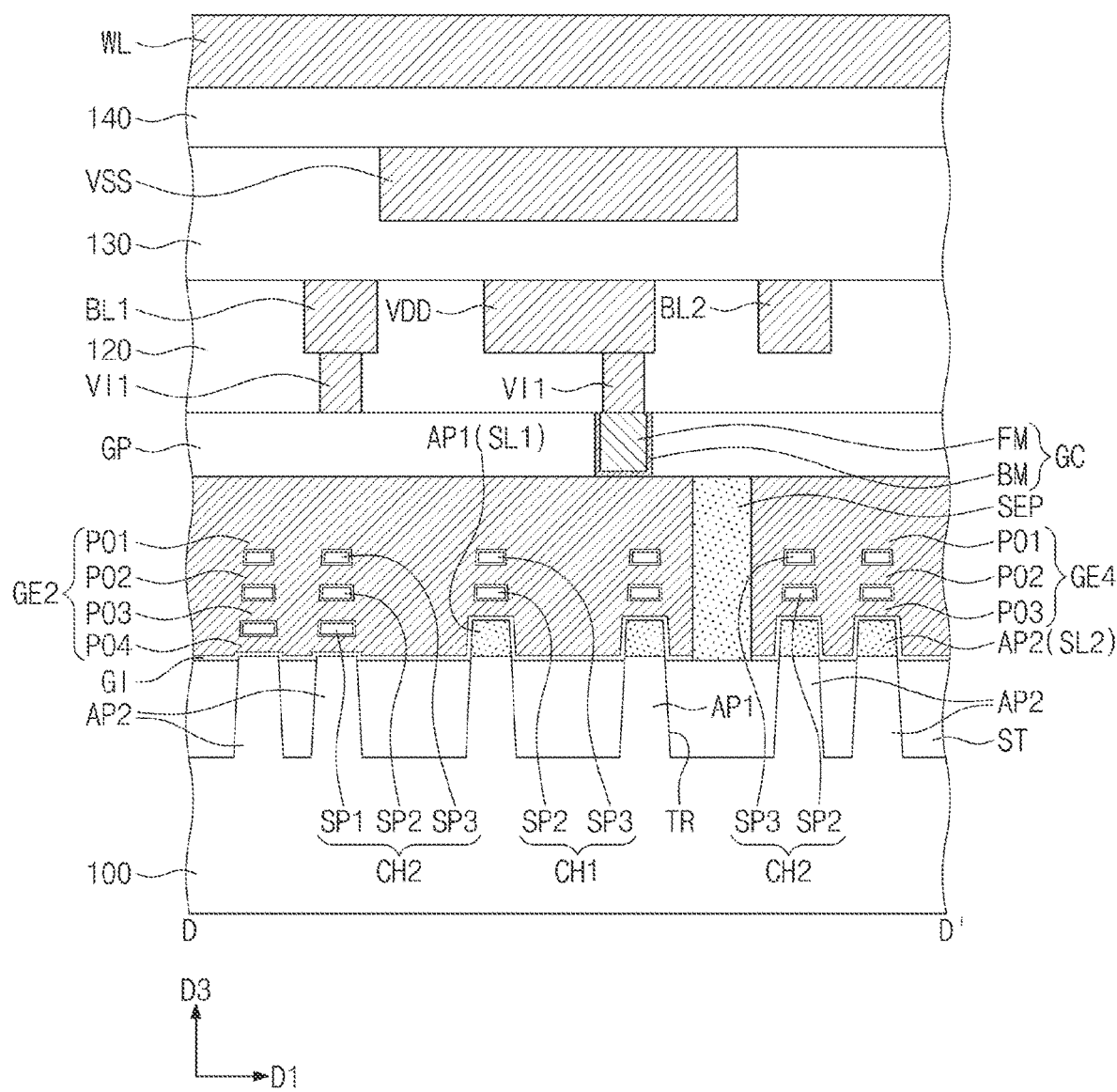
FIG. 14C is a sectional view that is taken along the line D-D' of FIG. 4 to illustrate a semiconductor device according to an embodiment of the inventive concept.

FIGS. 14A to 14C are sectional views that are respectively taken along the lines A-A', B-B', and D-D' of FIG. 4 to illustrate a semiconductor device according to an embodiment of the inventive concept. For concise description, a previously described element may be identified by the same reference number without repeating an overlapping description thereof.

Referring to FIGS. 14A to 14C, a second channel pattern CH2 may include a first semiconductor pattern SP1, a second semiconductor pattern SP2, and a third semiconductor pattern SP3, which are sequentially stacked. In detail, the second channel patterns CH2 in each of the first and second pull-down transistors TD1 and TD2 may include the first to third semiconductor patterns SP1, SP2, and SP3, and the second channel patterns CH2 in each of the first and second pass-gate transistors TA1 and TA2 may include the second and third semiconductor patterns SP2 and SP3.

In some embodiments, there may be more or less semiconductor patterns of first channel patterns CH1 as compared to semiconductor patterns of second channel patterns CH2. For example, a second channel pattern CH2 in each of the first and second pull-down transistors TD1 and TD2 may include more semiconductor patterns than a first channel pattern CH1, and a second channel pattern CH2 in each of the first and second pass-gate transistors TA1 and TA2 may include the same number of semiconductor patterns as a first channel pattern CH1. The number of semiconductor patterns of each of the first and second channel patterns CH1 and CH2 is not limited to the illustrated number.

A first active pattern AP1 may include a first semiconductor layer SL1. The first semiconductor layer SL1 may be vertically spaced apart from a first channel pattern CH1. The first semiconductor layer SL1 may be disposed below the first channel pattern CH1. The first semiconductor layer SL1 may be a portion of the first active pattern AP1 protruding above the device isolation layer ST. The first semiconductor layer SL1 may have a top surface that is located at substantially the same level as the top surface of a first semiconductor pattern SP1. The first semiconductor layer SL1 may be interposed between a pair of first source/drain patterns SD1. The first semiconductor layer SL1 may be formed of or include at least one of silicon (Si) or silicon phosphide (SiP). In an embodiment, the first semiconductor layer SL1 and the substrate 100 may be provided as a single object, although an interface is illustrated between the first semiconductor layer SL1 and the substrate 100.

A second active pattern AP2 may include a second semiconductor layer SL2. The second semiconductor layer SL2 may be vertically spaced apart from a second channel pattern CH2. The second semiconductor layer SL2 may be disposed below the second channel pattern CH2. The second semiconductor layer SL2 may be a portion of the second active pattern AP2 protruding above the device isolation layer ST. The second semiconductor layer SL2 may have a top surface that is located at substantially the same level as the top surface of a first semiconductor pattern SP1. The top surfaces of the first and second semiconductor layers SL1 and SL2 may be located at substantially the same level. The second semiconductor layer SL2 may be interposed between a pair of second source/drain patterns SD2. The second semiconductor layer SL2 may be formed of or include at least one of silicon (Si) or silicon boride (SiB). The second semiconductor layer SL2 may be provided as a part of each of the first and second pass-gate transistors TA1 and TA2. In an embodiment, the second semiconductor layer SL2 and the substrate 100 may be provided as a single object, although an interface is illustrated between the second semiconductor layer SL2 and the substrate 100.

Each of the second and third gate electrodes GE2 and GE3 on the second active pattern AP2 may include a fourth gate pattern PO4 interposed between the substrate 100 and the first semiconductor pattern SP1, a third gate pattern PO3 interposed between the first semiconductor pattern SP1 and the second semiconductor pattern SP2, a second gate pattern PO2 interposed between the second semiconductor pattern SP2 and the third semiconductor pattern SP3, and a first gate pattern PO1 on the second gate pattern PO2.

Each of the top surfaces of the first and second semiconductor layers SL1 and SL2 may be located at a level higher than the top surface of the fourth gate pattern PO4.

Each of the first and fourth gate electrodes GE1 and GE4 on the second active pattern AP2 may include the third gate pattern PO3 interposed between the substrate 100 and the second semiconductor pattern SP2, the second gate pattern PO2 interposed between the second semiconductor pattern SP2 and the third semiconductor pattern SP3, and the first gate pattern PO1 on the second gate pattern PO2.

Each of the first and fourth gate electrodes GEL and GE4 may include the same number of gate patterns as the first active pattern AP1. The number of gate patterns on a first active pattern AP1 and the number of gate patterns on a second active pattern AP2 are not limited to the illustrated numbers.

Since a pass-gate transistor is formed to be different from a pull-down transistor in terms of the number of semiconductor patterns and gate patterns, a pass-gate transistor may be formed to have a channel size smaller than that of a pull-down transistor. This may make it possible to improve a disturb margin property of a semiconductor device.

FIGS. 15A to 21C are sectional views illustrating a method of fabricating a semiconductor device according to an embodiment of the inventive concept. FIGS. 15A, 16A, 17A, 18A, 19A, 20A, and 21A are sectional views taken along the line A-A' of FIG. 4. FIGS. 16B, 17B, 18B, 19B, 20B, and 21B are sectional views taken along the line B-B' of FIG. 4. FIGS. 15B, 16C, 17C, 18C, 20C, and 21C are sectional views taken along the line D-D' of FIG. 4. For concise description, a previously described element may be identified by the same reference number without repeating an overlapping description thereof.

Figure 15A:
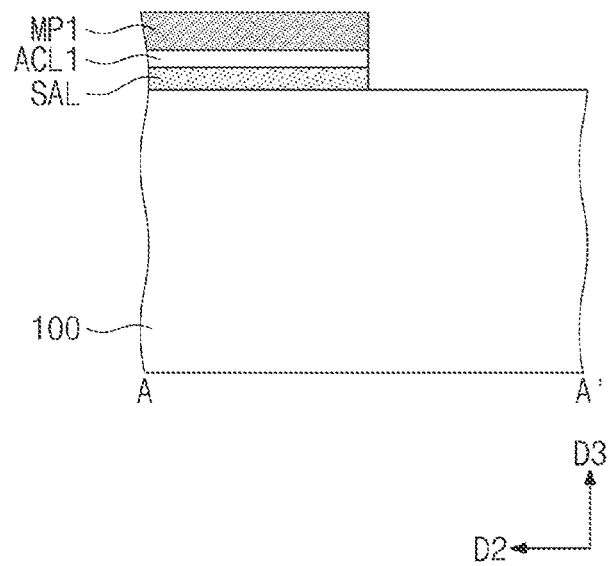
FIG. 15A is a sectional view that is taken along the line A-A' of FIG. 4 illustrating a method of fabricating a semiconductor device according to an embodiment of the inventive concept.
Figure 15B:
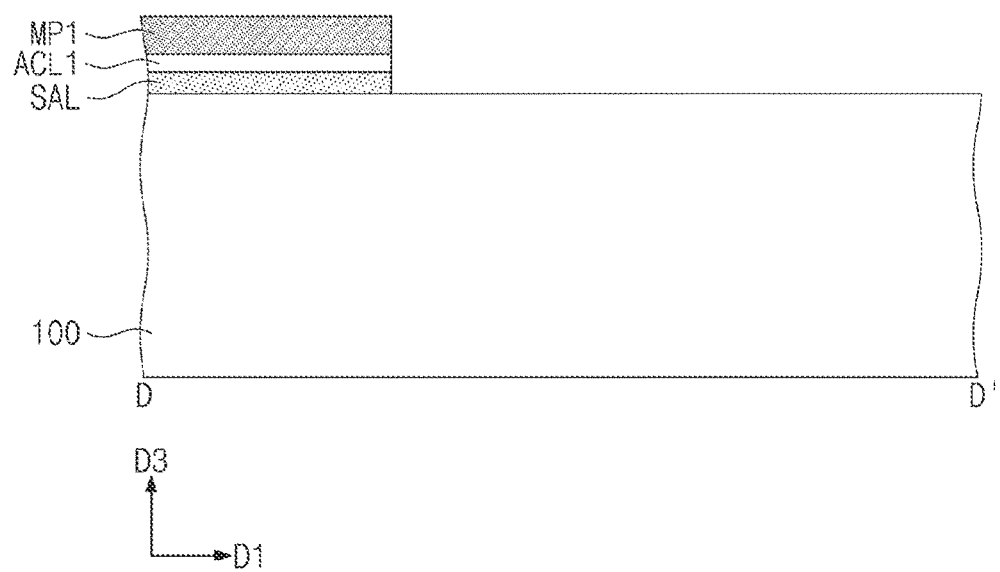
FIG. 15B is a sectional view that is taken along the line D-D' of FIG. 4 illustrating a method of fabricating a semiconductor device according to an embodiment of the inventive concept.

Referring to FIGS. 15A and 15B, the sacrificial layer SAL and the first active layer ACL1 may be formed on the entire top surface of the substrate 100. In an embodiment, the sacrificial layer SAL may be formed of or include silicon-germanium (SiGe), and the first active layer ACL1 may be formed of or include silicon (Si).

The first mask pattern MP1 may be locally formed on a portion of the substrate 100. A first patterning process using the first mask pattern MP1 as an etch mask may be performed to partially etch the sacrificial layer SAL and the first active layer ACL1 so that the top surface of the substrate 100 may be partially exposed. First and second semiconductor layers SL1 and SL2, which will be described below, may be formed in a region that is formed by etching the sacrificial layer SAL and the first active layer ACL1.

Figure 16A:
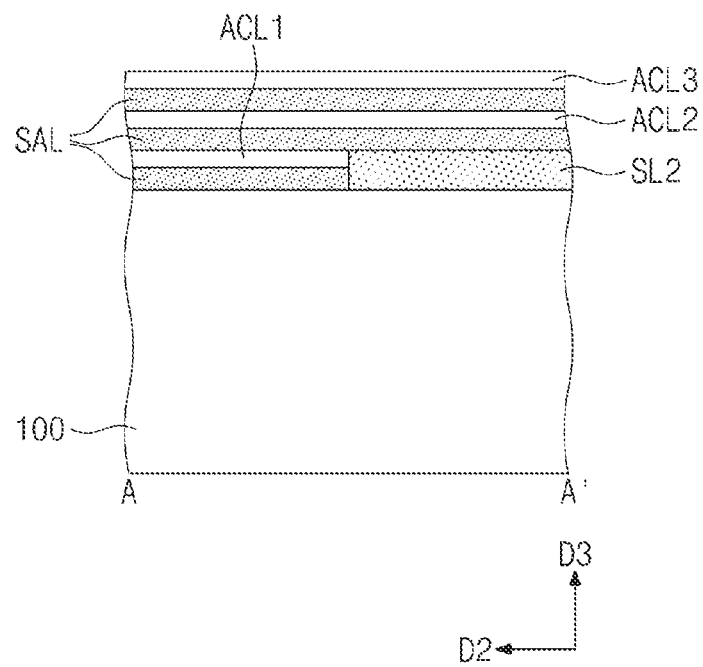
FIG. 16A is a sectional view that is taken along the line A-A' of FIG. 4 illustrating a method of fabricating a semiconductor device according to an embodiment of the inventive concept.
Figure 16B:
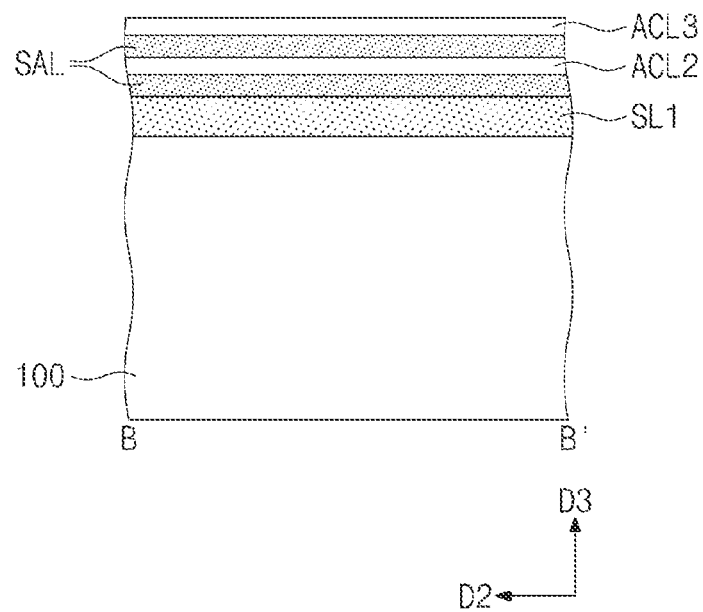
FIG. 16B is a sectional view that is taken along the line B-B' of FIG. 4 illustrating a method of fabricating a semiconductor device according to an embodiment of the inventive concept.
Figure 16C:
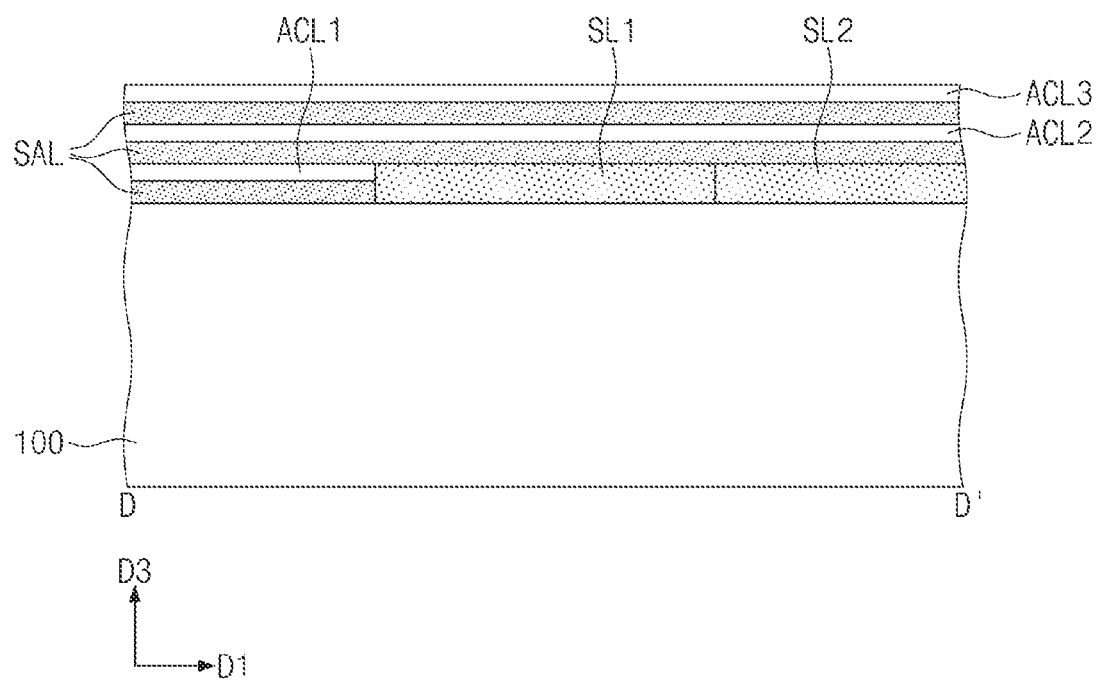
FIG. 16C is a sectional view that is taken along the line D-D' of FIG. 4 illustrating a method of fabricating a semiconductor device according to an embodiment of the inventive concept.

Referring to FIGS. 16A to 16C, the first mask pattern MP1 may be removed, and the first and second semiconductor layers SL1 and SL2 may be formed on the exposed top surface of the substrate 100. The first semiconductor layer SL1 may be formed of or include one of silicon (Si) or silicon phosphide (SiP). As an example, the first semiconductor layer SL1 may be formed by performing an epitaxial growth process on the substrate 100. Alternatively, the first semiconductor layer SL1 may be formed by growing a silicon layer from the exposed top surface of the substrate 100 and doping the silicon layer with impurities. In an embodiment, the impurities may be phosphorus (P). The first semiconductor layer SL1 may be formed to have a top surface that is substantially coplanar with the top surface of the first active layer ACL1. In an embodiment, the first semiconductor layer SL1 may be a portion of a first active pattern AP1.

The second semiconductor layer SL2 may be formed of or include one of silicon (Si) or silicon boride (SiB). In an embodiment, the second semiconductor layer SL2 may be formed by performing an epitaxial growth process on the substrate 100. Alternatively, the second semiconductor layer SL2 may be formed by growing a silicon layer from the exposed top surface of the substrate 100 and doping the silicon layer with impurities. The impurities may be boron (B). The second semiconductor layer SL2 may be formed to have a top surface that is substantially coplanar with the top surface of the first active layer ACL1. In an embodiment, the second semiconductor layer SL2 may be a portion of a second active pattern AP2.

The first and second semiconductor layers SL1 and SL2 may be sequentially formed through at least two different processes. In other words, the first and second semiconductor layers SL1 and SL2 may not be formed at the same time. As an example, the first and second semiconductor layers SL1 and SL2 may be formed by sequentially performing at least two different epitaxial growth processes using a mask. As another example, the first and second semiconductor layers SL1 and SL2 may be formed by forming a single silicon layer and separately doping two regions of the silicon layer with different impurities (e.g., phosphorus (P) and boron (B)) using a mask.

In an embodiment, the first and second semiconductor layers SL1 and SL2 may be formed through the same process. For example, a single silicon layer may be formed by an epitaxial growth process, and the impurity doping process may be omitted. The silicon layer may include the first and second semiconductor layers SL1 and SL2.

The sacrificial layers SAL and the second and third active layers ACL2 and ACL3 may be alternately stacked on the first active layer ACL1. The second and third active layers ACL2 and ACL3 may be formed of or include the same material as the first active layer ACL1. The sacrificial layer SAL may cover the top surfaces of the first and second semiconductor layers SL1 and SL2. The sacrificial layers SAL and the second and third active layers ACL2 and ACL3, which are stacked on the first and second semiconductor layers SL1 and SL2, may be formed on the entire top surface of the substrate 100.

Figure 17A:
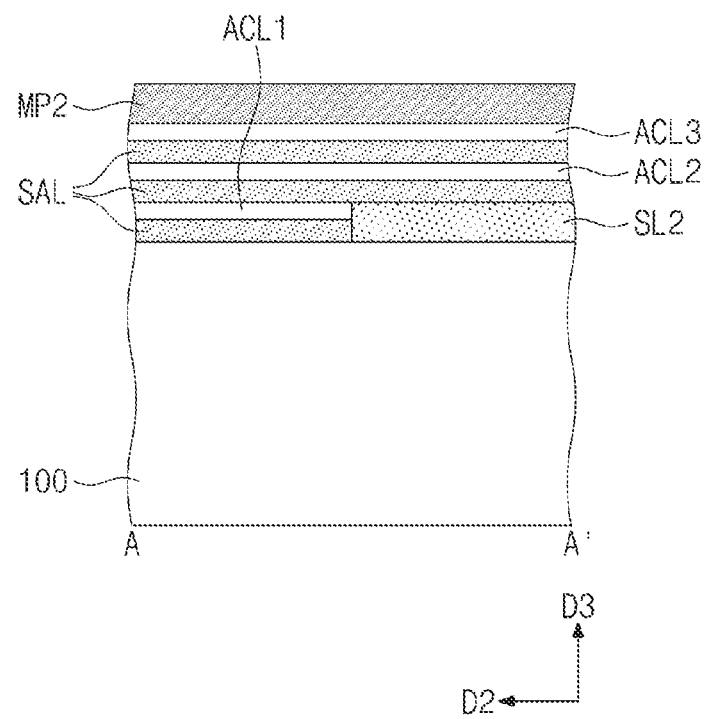
FIG. 17A is a sectional view that is taken along the line A-A' of FIG. 4 illustrating a method of fabricating a semiconductor device according to an embodiment of the inventive concept.
Figure 17B:
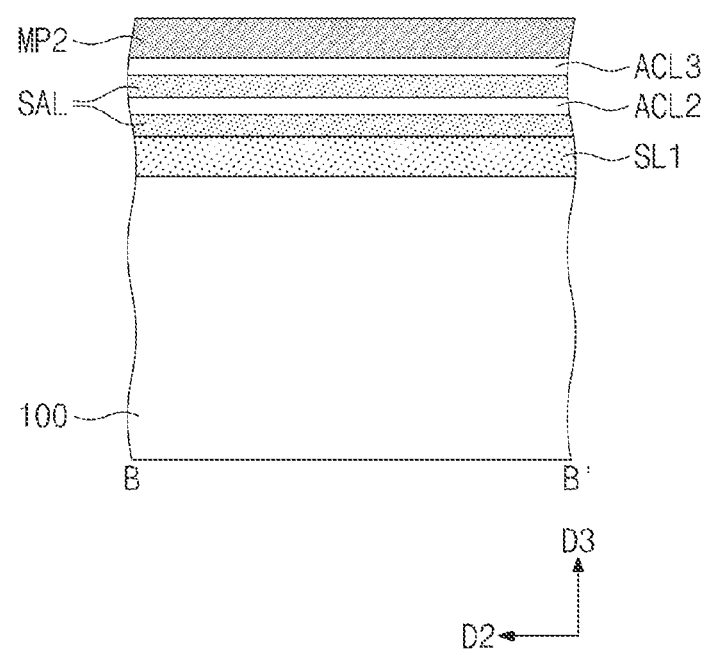
FIG. 17B is a sectional view that is taken along the line B-B' of FIG. 4 illustrating a method of fabricating a semiconductor device according to an embodiment of the inventive concept.
Figure 17C:
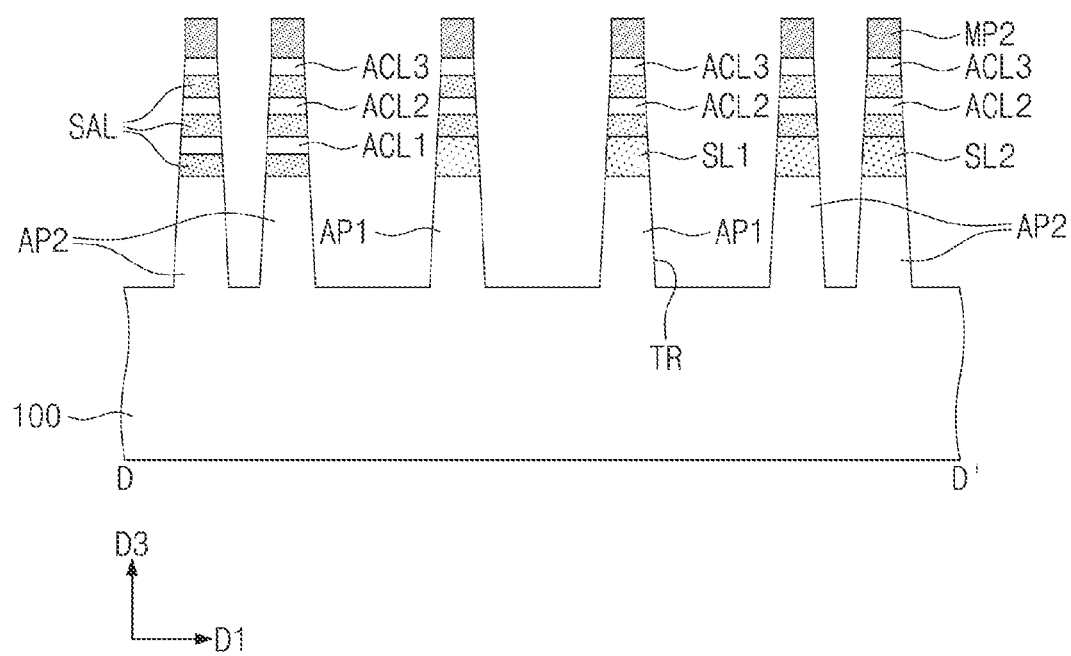
FIG. 17C is a sectional view that is taken along the line D-D' of FIG. 4 illustrating a method of fabricating a semiconductor device according to an embodiment of the inventive concept.

Referring to FIGS. 17A to 17C, a second mask pattern MP2 may be locally formed on a portion of the third active layer ACL3. A second patterning process, in which the second mask pattern MP2 is used as an etch mask, may be performed to form the trench TR defining the first and second active patterns AP1 and AP2. Second active patterns AP2 may include the second semiconductor layer SL2 and may also include the sacrificial layers SAL alternately stacked with the first to third active layers ACL1, ACL2, and ACL3 in their upper portions. First active patterns AP1 may include the first semiconductor layer SL1 and may also include the sacrificial layers SAL alternately stacked with the second and third active layers ACL2 and ACL3 in their upper portions.

Figure 18A:
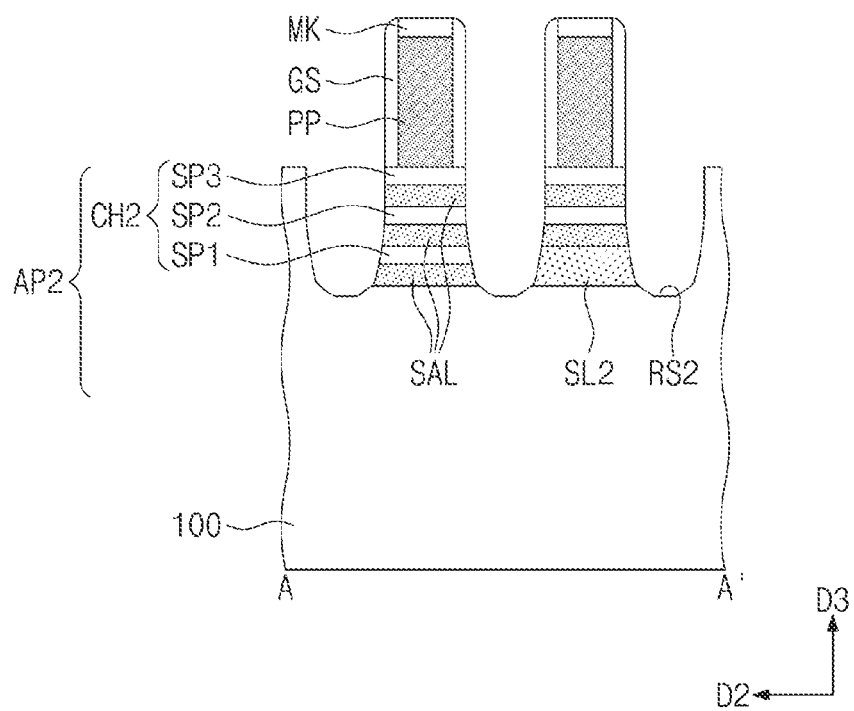
FIG. 18A is a sectional view that is taken along the line A-A' of FIG. 4 illustrating a method of fabricating a semiconductor device according to an embodiment of the inventive concept.
Figure 18B:
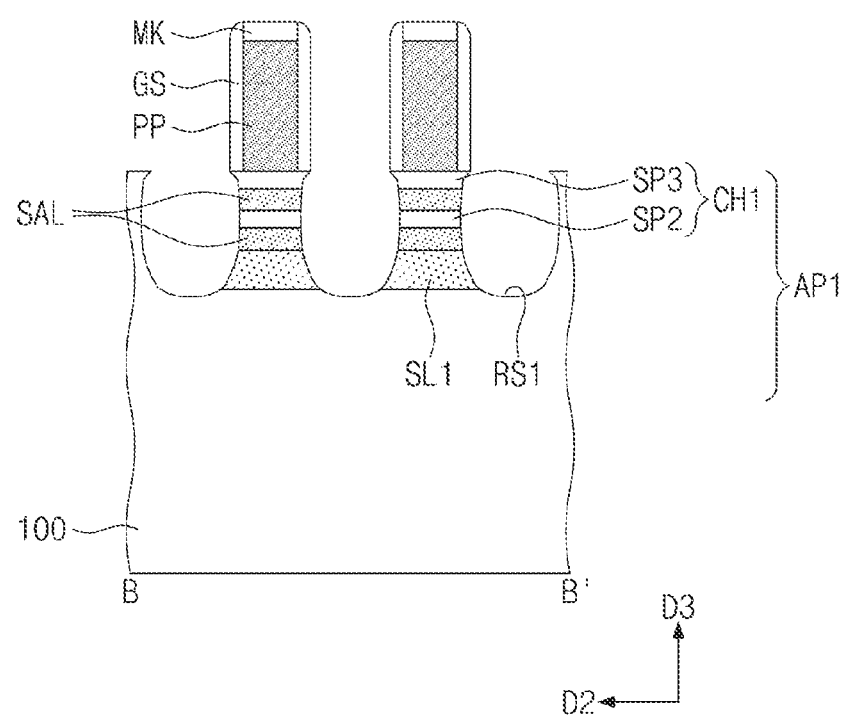
FIG. 18B is a sectional view that is taken along the line B-B' of FIG. 4 illustrating a method of fabricating a semiconductor device according to an embodiment of the inventive concept.
Figure 18C:
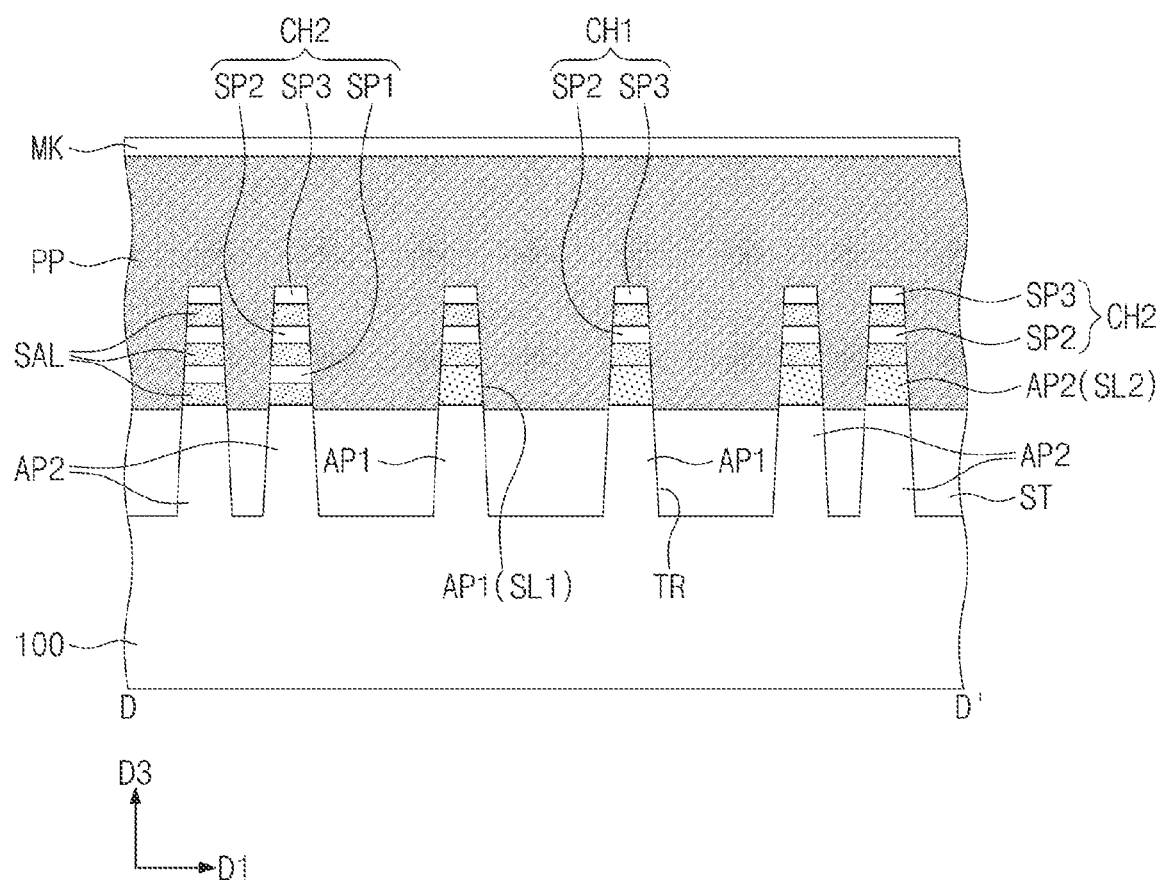
FIG. 18C is a sectional view that is taken along the line D-D' of FIG. 4 illustrating a method of fabricating a semiconductor device according to an embodiment of the inventive concept.

Referring to FIGS. 18A to 18C, the device isolation layer ST may be formed on the substrate 100 to fill the trench TR. For example, an insulating layer may be formed on the substrate 100 to cover the first and second active patterns AP1 and AP2. Then, a planarization process may be performed on the insulating layer to expose the uppermost sacrificial layer SAL. Thus, the second mask pattern MP2 may be removed. After the planarization process, the device isolation layer ST may be formed by recessing the insulating layer.

The sacrificial patterns PP may be formed on the substrate 100 to cross the first and second active patterns AP1 and AP2. Each of the sacrificial patterns PP may be a line- or bar-shaped pattern extending in the first direction D1. The sacrificial patterns PP may be arranged, with a specific pitch, in the second direction D2.

In detail, the formation of the sacrificial patterns PP may include forming a sacrificial layer on the substrate 100, forming the hard masks MA on the sacrificial layer, and patterning the sacrificial layer using the hard masks MA as an etch mask. The sacrificial layer may be formed of or include poly silicon.

A pair of the gate spacers GS may be formed on both side surfaces of each of the sacrificial patterns PP. The first recesses RS1 may be formed in an upper portion of the first active pattern AP1. The second recesses RS2 may be formed in an upper portion of the second active pattern AP2.

Each of the first and second recesses RS1 and RS2 may be formed between a pair of the sacrificial patterns PP. A first recess RS1 may be formed by etching the sacrificial layers SAL, the first to third active layers ACL1, ACL2, and ACL3, and the first semiconductor layer SL1. A second recess RS2 may be formed by etching the sacrificial layers SAL, the second and third active layers ACL2 and ACL3, and the second semiconductor layer SL2.

As a result of the formation of the first and second recesses RS1 and RS2, the second and third active layers ACL2 and ACL3 of the first active patterns AP1 may be respectively used as the second and third semiconductor patterns SP2 and SP3 constituting the first channel patterns CH1. Similarly, the first to third active layers ACL1, ACL2, and ACL3 of the second active patterns AP2 may be respectively used as the first to third semiconductor patterns SP1, SP2, and SP3 constituting the second channel patterns CH2.

Figure 19A:
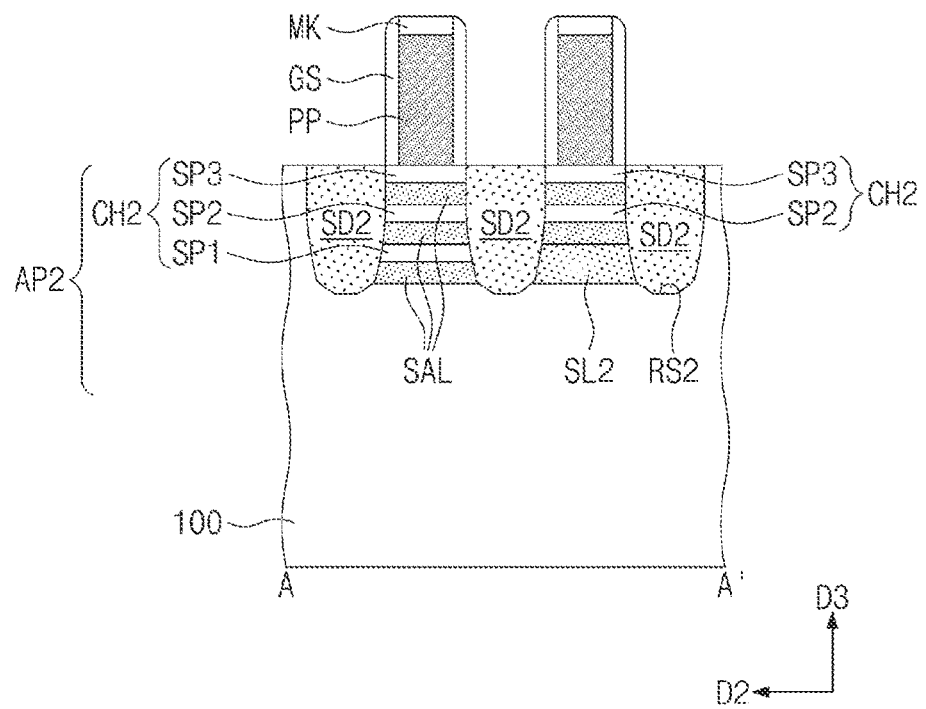
FIG. 19A is a sectional view that is taken along the line A-A' of FIG. 4 illustrating a method of fabricating a semiconductor device according to an embodiment of the inventive concept.
Figure 19B:
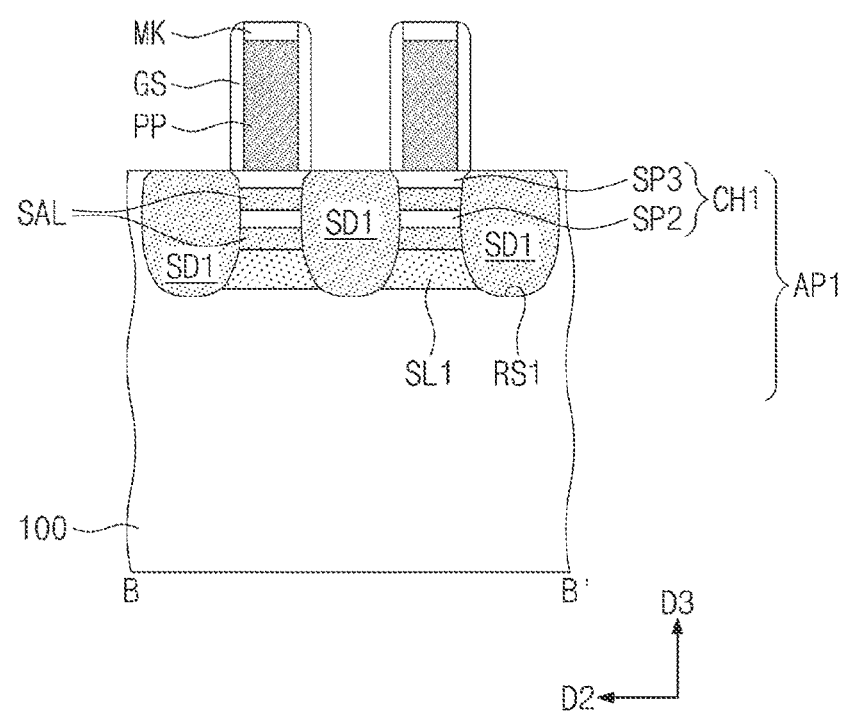
FIG. 19B is a sectional view that is taken along the line B-B' of FIG. 4 illustrating a method of fabricating a semiconductor device according to an embodiment of the inventive concept.

Referring to FIGS. 19A and 19B, the first source/drain patterns SD1 may be formed in the first recesses RS1. The second source/drain patterns SD2 may be formed in the second recesses RS2.

Figure 20A:
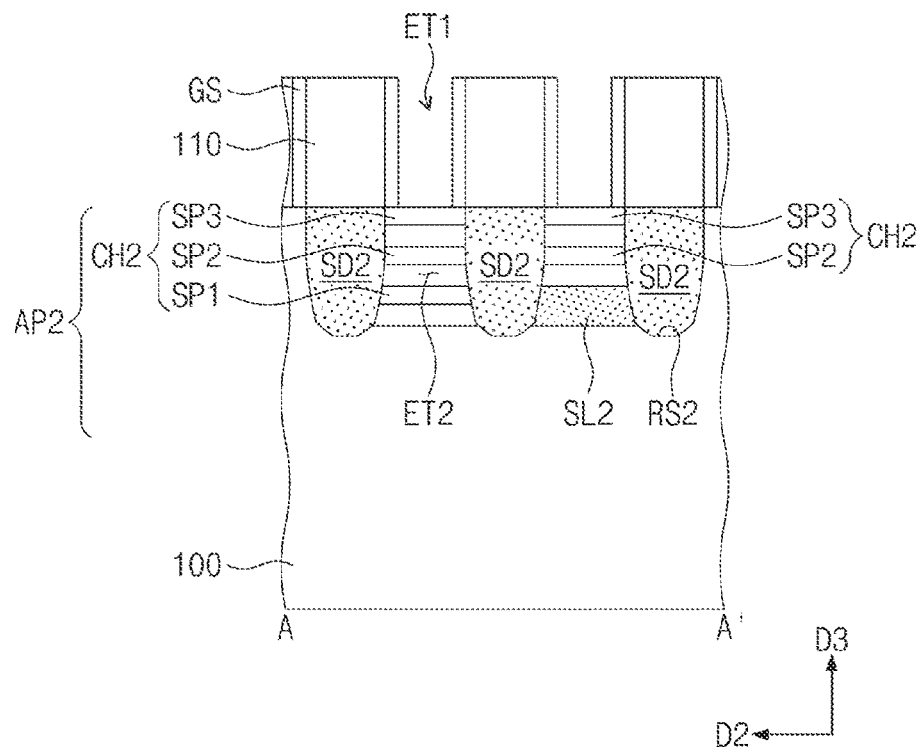
FIG. 20A is a sectional view that is taken along the line A-A' of FIG. 4 illustrating a method of fabricating a semiconductor device according to an embodiment of the inventive concept.
Figure 20B:
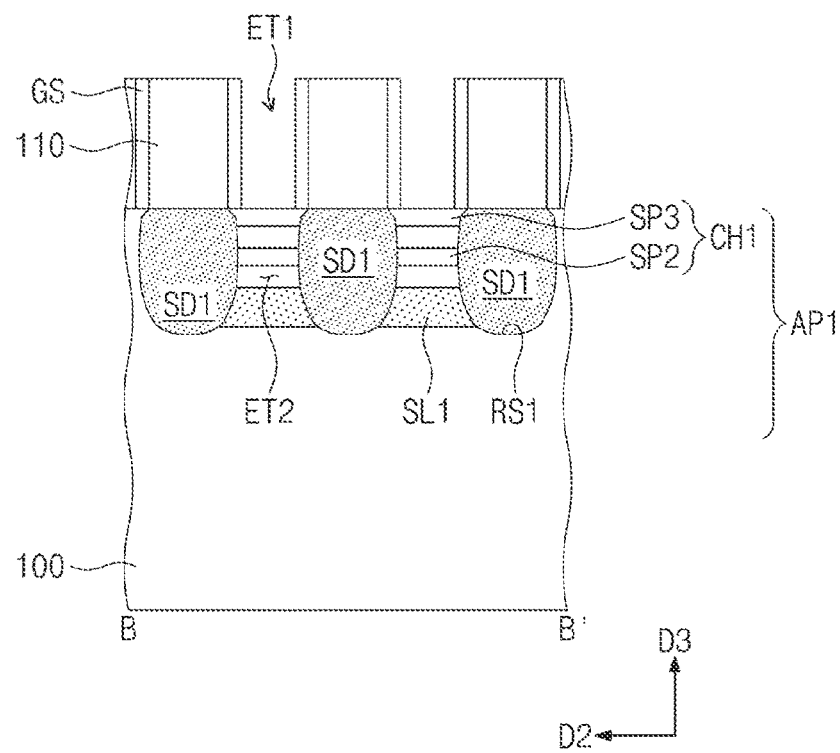
FIG. 20B is a sectional view that is taken along the line B-B' of FIG. 4 illustrating a method of fabricating a semiconductor device according to an embodiment of the inventive concept.
Figure 20C:
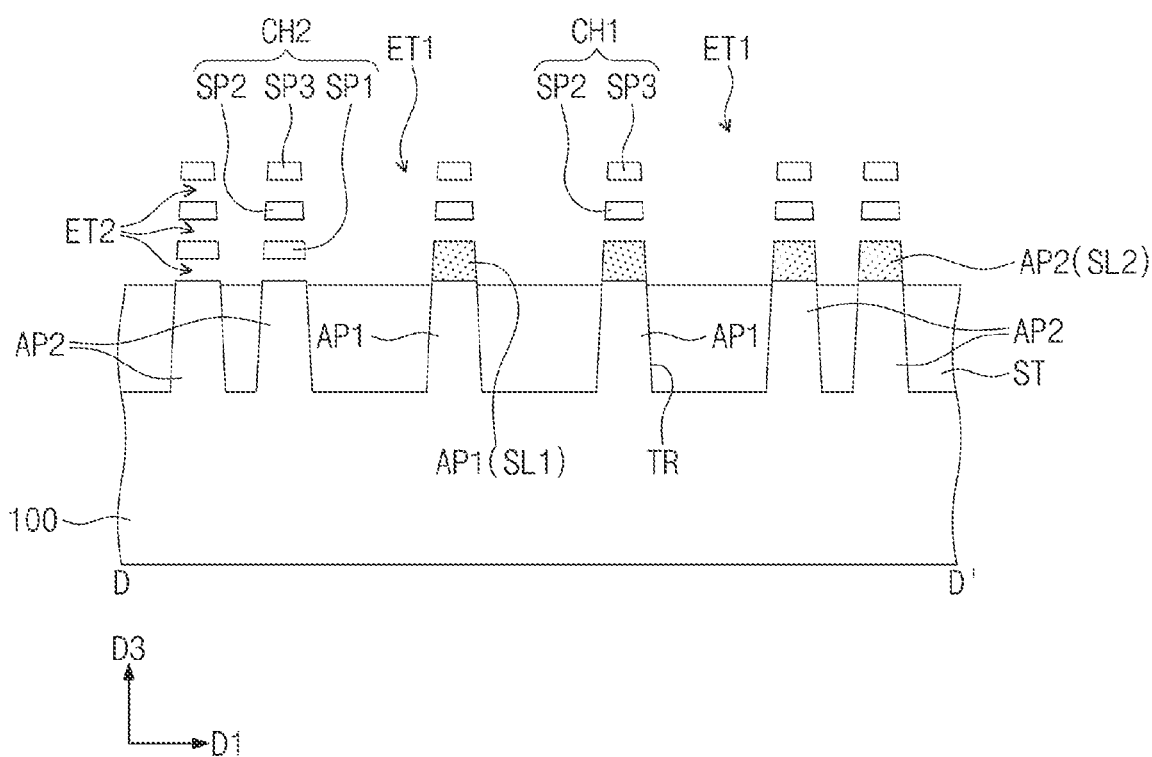
FIG. 20C is a sectional view that is taken along the line D-D' of FIG. 4 illustrating a method of fabricating a semiconductor device according to an embodiment of the inventive concept.

Referring to FIGS. 20A to 20C, the first interlayer insulating layer 110 may be formed to cover the first and second source/drain patterns SD1 and SD2, the hard masks MK, and the gate spacers GS.

The first interlayer insulating layer 110 may be planarized to expose the top surfaces of the sacrificial patterns PP. All of the hard masks MK may be removed during the planarization process.

The exposed sacrificial patterns PP may be removed. As a result of the removal of the sacrificial patterns PP, the first empty spaces ET1 may be formed to expose the first and second active patterns AP1 and AP2.

The sacrificial layers SAL, which are exposed through the first empty space ET1, may be removed. The sacrificial layers SAL may be selectively removed by an etching process including etching the sacrificial layers SAL and preventing or suppressing the etching of the first to third semiconductor patterns SP1, SP2, and SP3 and the first and second semiconductor layers SL1 and SL2. The etching process may be a wet etching process.

The second empty spaces ET2 may be formed as a result of the removal of the sacrificial layers SAL. The second empty spaces ET2 may be defined between the first to third semiconductor patterns SP1, SP2, and SP3, between the first semiconductor layer SL1 and the second semiconductor pattern SP2, and between the second semiconductor layer SL2 and the second semiconductor pattern SP2.

Figure 21A:
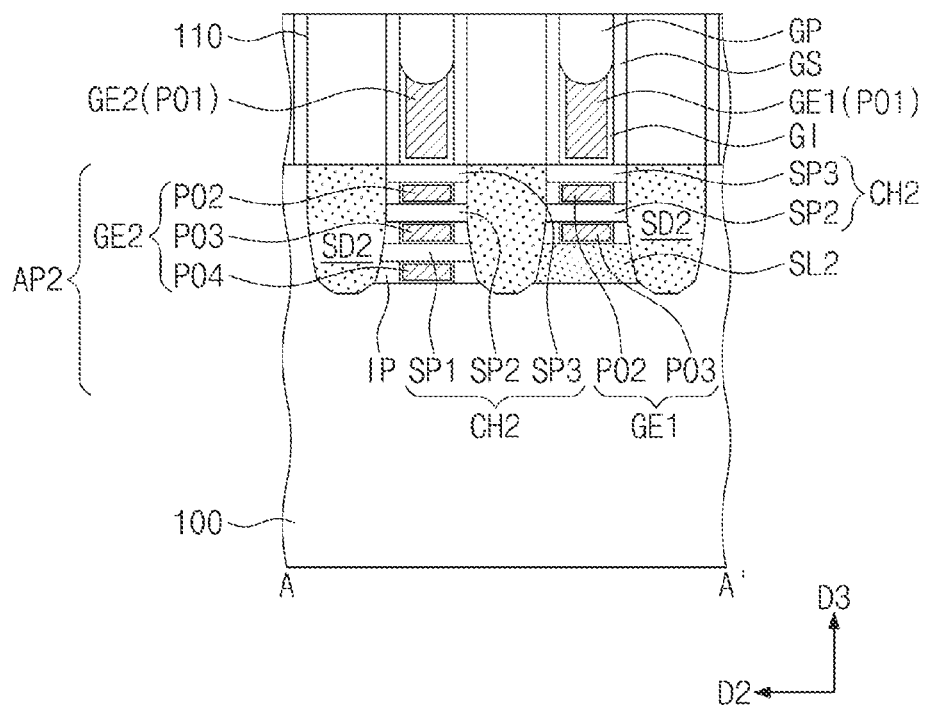
FIG. 21A is a sectional view that is taken along the line A-A' of FIG. 4 illustrating a method of fabricating a semiconductor device according to an embodiment of the inventive concept.
Figure 21B:
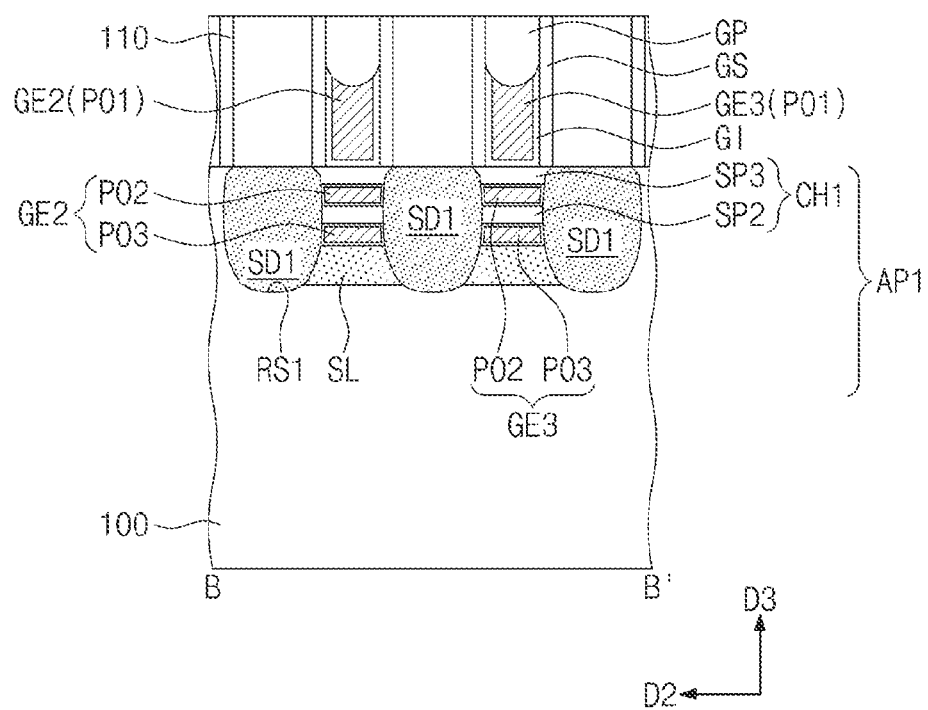
FIG. 21B is a sectional view that is taken along the line B-B' of FIG. 4 illustrating a method of fabricating a semiconductor device according to an embodiment of the inventive concept.
Figure 21C:
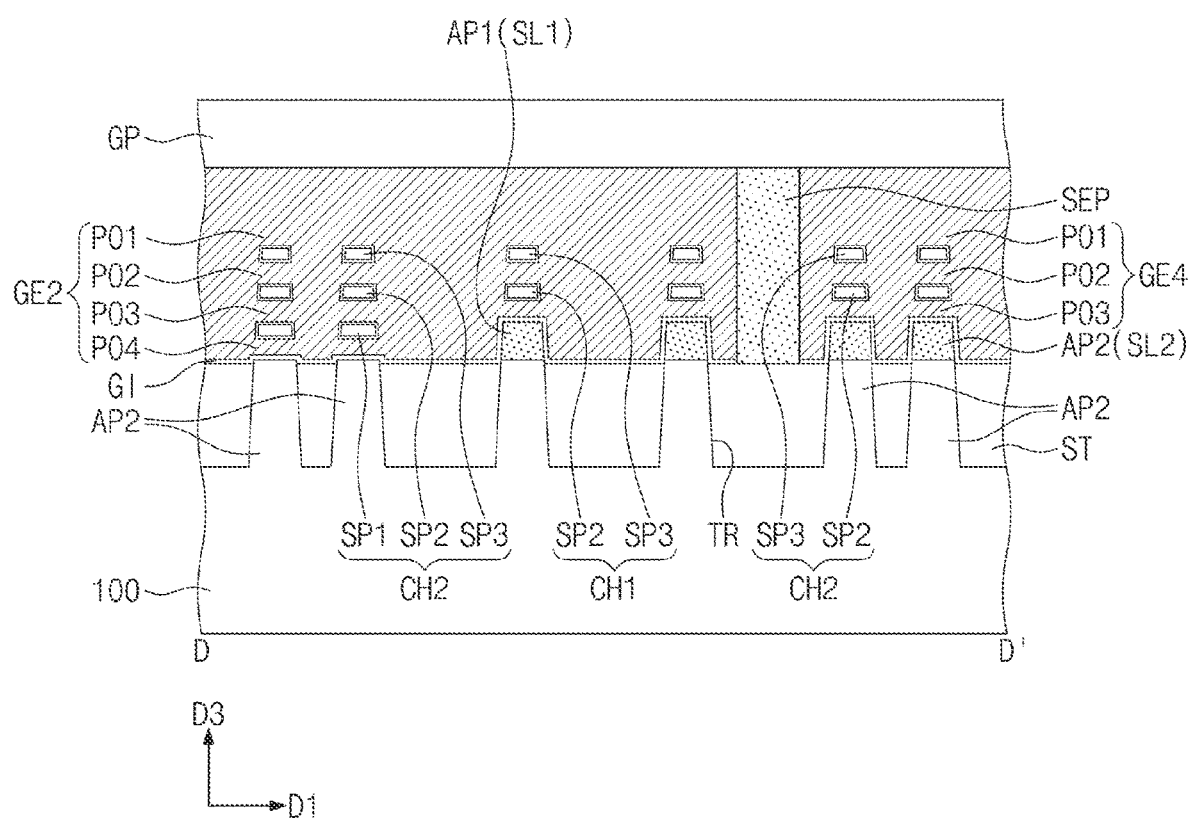
FIG. 21C is a sectional view that is taken along the line D-D' of FIG. 4 illustrating a method of fabricating a semiconductor device according to an embodiment of the inventive concept.

Referring to FIGS. 21A to 21C, the first to fourth gate electrodes GE1 to GE4 may be formed in the first and second empty spaces ET1 and ET2. Each of the second and third gate electrodes GE2 and GE3 may include the second to fourth gate patterns PO2, PO3, and PO4 filling the second empty spaces ET2. Each of the first and fourth gate electrodes GE1 and GE4 may include the second and third gate patterns PO2 and PO3 filling the second empty spaces ET2 on the second active patterns AP2. Each of the first to fourth gate electrodes GE1 to GE4 may further include the first gate pattern PO1 filling the first empty space ET1.

Referring back to FIGS. 4 and 5A to 5D, the first to eighth active contacts AC1 to AC8 may be formed to penetrate the first interlayer insulating layer 110 and to be electrically connected to the first and second source/drain patterns SD1 and SD2. The first and second gate contacts GC1 and GC2 may be formed to penetrate the first interlayer insulating layer 110 and the gate capping pattern GP and to be respectively electrically connected to the second and third gate electrodes GE2 and GE3.

The second to fourth interlayer insulating layers 120, 130, and 140 may be sequentially formed on the first interlayer insulating layer 110. For example, a back-end-of-line (BEOL) process may be performed to form the first interconnection layer M1 in the second interlayer insulating layer 120, to form the second interconnection layer M2 in the third interlayer insulating layer 130, and to form the third interconnection layer M3 in the fourth interlayer insulating layer 140.

Figure 22A:
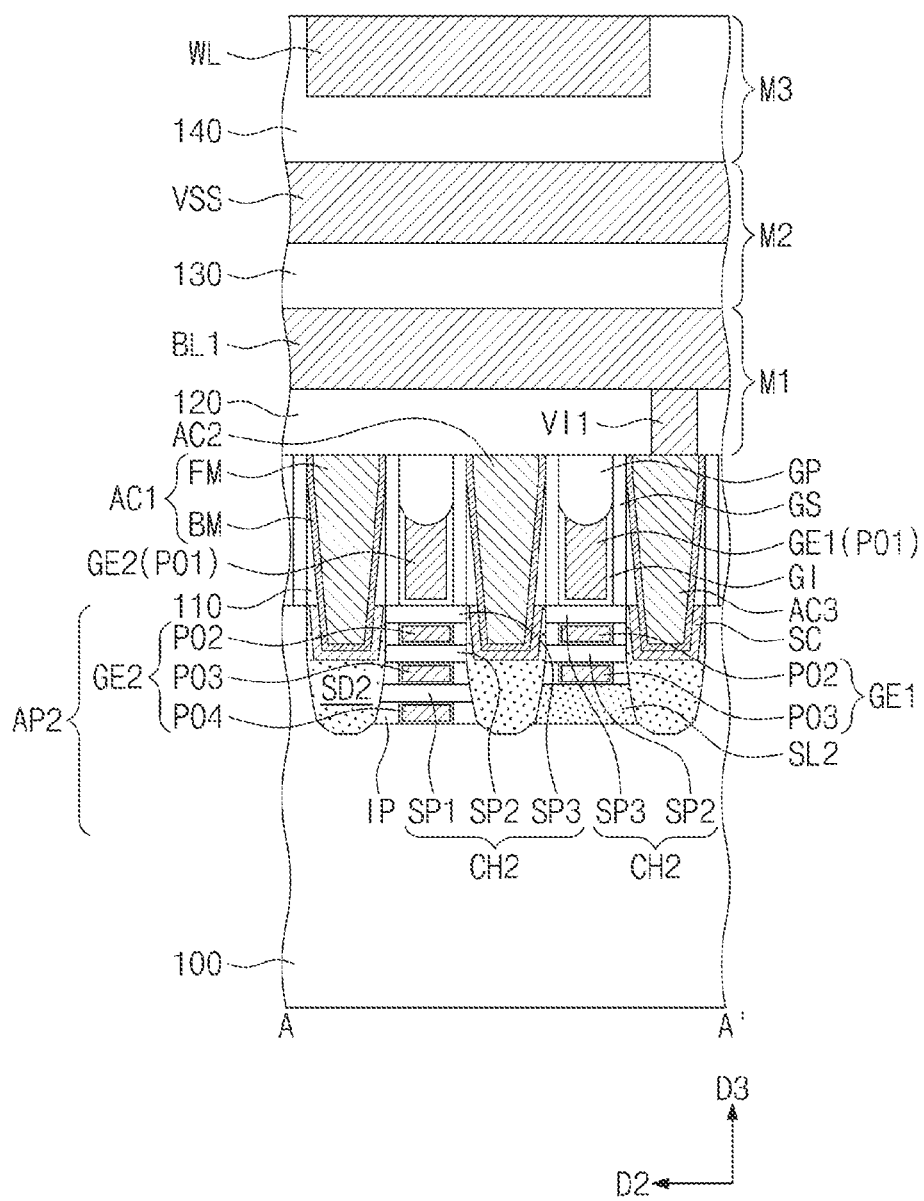
FIG. 22A is a sectional view that is taken along the line A-A' of FIG. 4 to illustrate a semiconductor device according to an embodiment of the inventive concept.
Figure 22B:
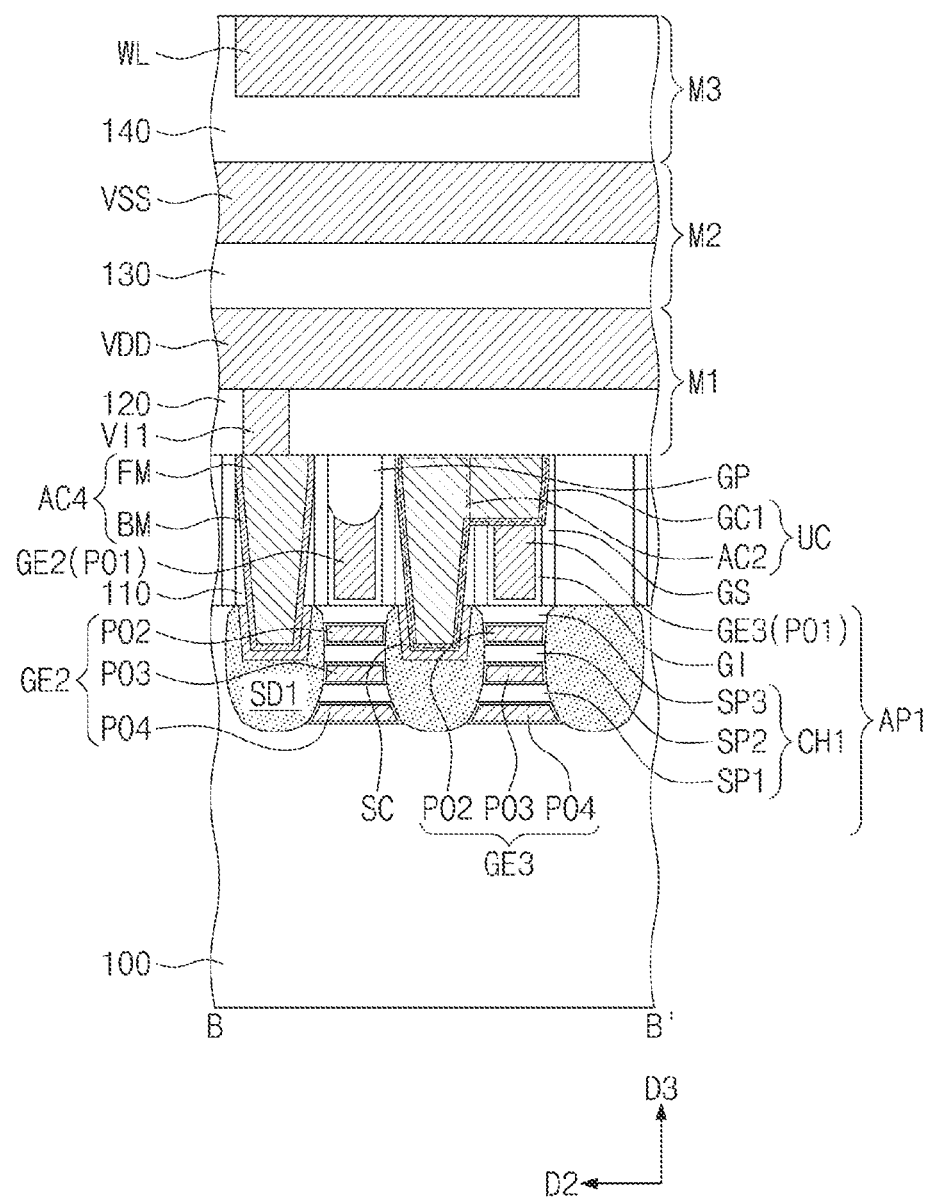
FIG. 22B is a sectional view that is taken along the line B-B' of FIG. 4 to illustrate a semiconductor device according to an embodiment of the inventive concept.
Figure 22C:
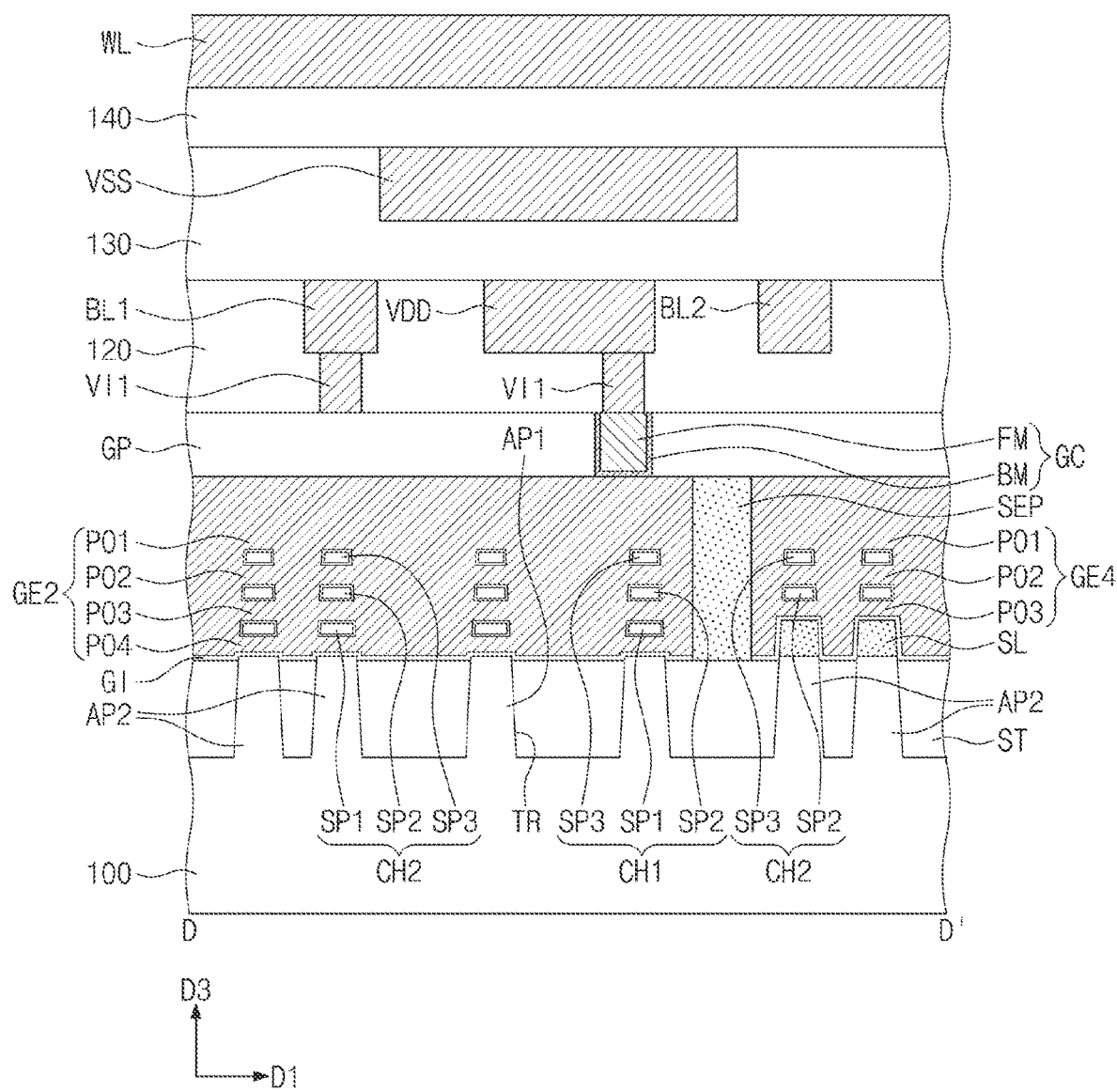
FIG. 22C is a sectional view that is taken along the line D-D' of FIG. 4 to illustrate a semiconductor device according to an embodiment of the inventive concept.

FIGS. 22A to 22C are sectional views that are respectively taken along the lines A-A', B-B', and D-D' of FIG. 4 to illustrate a semiconductor device according to an embodiment of the inventive concept. For concise description, a previously described element may be identified by the same reference number without repeating an overlapping description thereof.

Referring to FIGS. 22A to 22C, a first channel pattern CH1 may include the first semiconductor pattern SP1, the second semiconductor pattern SP2, and the third semiconductor pattern SP3, which are sequentially stacked.

A second channel pattern CH2 may include the first semiconductor pattern SP1, the second semiconductor pattern SP2, and the third semiconductor pattern SP3, which are sequentially stacked. In detail, the second channel patterns CH2 on each of the first and second pull-down transistors TD1 and TD2 may include the first to third semiconductor patterns SP1, SP2, and SP3, and the second channel patterns CH2 on each of the first and second pass-gate transistors TA1 and TA2 may include the second and third semiconductor patterns SP2 and SP3.

The second channel patterns CH2 in each of the first and second pull-down transistors TD1 and TD2 may include the same number of semiconductor patterns as the first channel patterns CH1. In some embodiments, there may be more or less semiconductor patterns of the channel patterns CH2 in each of the first and second pull-down transistors TD1 and TD2 as compared to first channel patterns CH1. For example, the second channel patterns CH2 in each of the first and second pass-gate transistors TA1 and TA2 may include less semiconductor patterns than the first channel patterns CH1. The number of semiconductor patterns constituting each of the first and second channel patterns CH1 and CH2 is not limited to the illustrated number.

A second active pattern AP2 may include the semiconductor layer SL. In detail, the second active patterns AP2 in each of the first and second pass-gate transistors TA1 and TA2 may include the semiconductor layer SL. The semiconductor layer SL may be vertically spaced apart from the second channel patterns CH2. The semiconductor layer SL may be disposed below the second channel patterns CH2. The semiconductor layer SL may be a portion of the second active patterns AP2 protruding above the device isolation layer ST. The semiconductor layer SL may have a top surface that is located at substantially the same level as the top surface of the first semiconductor pattern SP1. The semiconductor layer SL may be interposed between a pair of the second source/drain patterns SD2. The semiconductor layer SL may be formed of or include at least one of silicon (Si) or silicon boride (SiB). In an embodiment, the semiconductor layer SL and the substrate 100 may be provided as a single object, although an interface is illustrated between the semiconductor layer SL and the substrate 100.

Each of the second and third gate electrodes GE2 and GE3 may include the fourth gate pattern PO4 interposed between the substrate 100 and the first semiconductor pattern SP1, the third gate pattern PO3 interposed between the first semiconductor pattern SP1 and the second semiconductor pattern SP2, the second gate pattern PO2 interposed between the second semiconductor pattern SP2 and the third semiconductor pattern SP3, and the first gate pattern PO1 on the second gate pattern PO2. The top surface of the semiconductor layer SL may be located at a level higher than the top surface of the fourth gate pattern PO4.

Each of the first and fourth gate electrodes GE1 and GE4 may include the third gate pattern PO3 interposed between the substrate 100 and the second semiconductor pattern SP2, the second gate pattern PO2 interposed between the second semiconductor pattern SP2 and the third semiconductor pattern SP3, and the first gate pattern PO1 on the second gate pattern PO2.

In some embodiments, there may be more or less gate patterns of each of the first and fourth gate electrodes GE1 and GE4 as compared to gate patterns of each of the second and third gate electrodes GE2 and GE3. For example, each of the first and fourth gate electrodes GE1 and GE4 may include less gate patterns than each of the second and third gate electrodes GE2 and GE3. The number of gate patterns on a first active pattern AP1 and the number of gate patterns on a second active pattern AP2 are not limited to the illustrated numbers.

According to an embodiment of the inventive concept, a semiconductor device may be configured to have a difference in the number of semiconductor patterns and gate patterns between pull-down, pull-up, and pass-gate transistors. Accordingly, it may be possible to improve a write property margin and a disturb margin property of the semiconductor device.

In a method of fabricating a semiconductor device according to an embodiment of the inventive concept, it may be possible to selectively remove lower active and sacrificial layers without removing upper active and sacrificial layers. This may make it possible to simplify a subsequent process and to reduce the number of mask-using processes. As a result, it may be possible to increase a degree of freedom in design and to reduce technical difficulties in the subsequent process.

While example embodiments of the inventive concept have been particularly shown and described, it will be understood by one of ordinary skill in the art that variations in form and detail may be made therein without departing from the spirit and scope of the attached claims.

What is claimed is:

1. A method of manufacturing a semiconductor device, the method comprising:
    forming a first sacrificial layer and a first active layer on a substrate;
    forming a first mask pattern on a portion of the substrate;
    etching the first sacrificial layer and the first active layer partially using the first mask pattern as a mask to expose a portion of a top surface of the substrate;
    forming a semiconductor layer on the exposed portion of the top surface of the substrate;
    forming sacrificial layers and active layers on the first active layer and the semiconductor layer, the active layers including an uppermost second active layer;
    forming a second mask pattern on a portion of the uppermost second active layer;
    forming a trench using the second mask pattern as an etch mask, the trench defining a first active pattern and a second active pattern; and
    removing the sacrificial layers to form a first channel pattern and a second channel pattern on the first active pattern and the second active pattern, respectively,
    wherein the first active pattern includes the semiconductor layer.

2. The method of claim 1, wherein:
    the semiconductor layer is disposed below and apart from the first channel pattern.

3. The method of claim 1, wherein:
    a pair of adjacent first active patterns respectively constitute a pull-up transistor; and
    a pair of adjacent second active patterns respectively constitute a pull-down transistor and a pass-gate transistor.

4. The method of claim 3, wherein:
    the second active pattern of the pass-gate transistor includes the semiconductor layer; and
    the semiconductor layer of the pass-gate transistor comprises at least one of silicon or silicon boride.

5. The method of the claim 1, wherein:
    the first channel pattern and the second channel pattern respectively comprise a plurality of semiconductor patterns; and
    there are more or less semiconductor patterns of the first channel pattern than semiconductor patterns of the second channel pattern.

6. The method of the claim 1, wherein:
    a lowermost semiconductor pattern of the second channel pattern is disposed at a lower level than a lowermost semiconductor pattern of the first channel pattern.

7. The method of the claim 1, wherein forming the semiconductor layer includes:
    performing an epitaxial growth process on the exposed portion of the top surface of the substrate.

8. The method of the claim 1, wherein forming the semiconductor layer includes:
   growing a silicon layer from the exposed portion of the top surface of the substrate; and
   doping the silicon layer with impurities.

9. The method of the claim 1, wherein:
   a top surface of the semiconductor layer is coplanar with a top surface of the first active layer.

10. A method of manufacturing a semiconductor device, the method comprising:
   forming a first sacrificial layer and a first active layer on a substrate;
   forming a first mask pattern on a portion of the substrate;
   etching the first sacrificial layer and the first active layer partially using the first mask pattern as a mask to expose a portion of a top surface of the substrate;
   forming a first semiconductor layer and a second semiconductor layer on the exposed portion of the top surface of the substrate;
   forming staked sacrificial layers and active layers on the first active layer and the semiconductor layer, the active layers including an uppermost second active layer;
   forming a second mask pattern on a portion of the uppermost second active layer;
   forming a trench using the second mask pattern as an etch mask, the trench defining a first active pattern and a second active pattern; and
   removing the sacrificial layers to form a first channel pattern and a second channel pattern on the first active pattern and the second active pattern, respectively,
   wherein a top surface of the first semiconductor layer and a top surface of the second semiconductor layer are coplanar with a top surface of the first active layer,
   wherein the first semiconductor layer is a portion of the first active pattern, and
   wherein the second semiconductor layer is a portion of the second active pattern.

11. The method of claim 10, wherein:
   a pair of adjacent first active patterns respectively constitute a pull-up transistor; and
   a pair of adjacent second active patterns respectively constitute a pull-down transistor and a pass-gate transistor.

12. The method of claim 10, wherein:
   the first semiconductor layer is disposed below and apart from the first channel pattern; and
   the second semiconductor layer is disposed below and apart from the second channel pattern.

13. The method of claim 10, wherein:
   the first semiconductor layer comprises at least one of silicon or silicon phosphide; and
   the second semiconductor layer comprises at least one of silicon or silicon boride.

14. The method of the claim 10, wherein forming the first semiconductor layer and the second semiconductor layer includes:
   performing an epitaxial growth process on the exposed portion of the top surface of the substrate.

15. The method of the claim 10, wherein forming the first semiconductor layer and the second semiconductor layer includes:
   growing a silicon layer from the exposed portion of the top surface of the substrate; and
   doping the silicon layer with impurities.

16. A method of manufacturing a semiconductor device, the method comprising:
   forming a first active pattern and a second active pattern on a substrate;
   forming a sacrificial pattern extending in a first direction on the first active pattern and the second active pattern, the first direction extending in parallel with an upper surface of the substrate;
   etching the first active pattern and the second active pattern using the sacrificial pattern as a mask to form a first recess in the first active pattern and a second recess in the second active pattern, the first active pattern and the second active pattern respectively including semiconductor patterns exposed by the first recess and the second recess;
   forming a first source/drain pattern in the first recess and a second source/drain pattern in the second recess;
   removing the sacrificial pattern to expose a first semiconductor pattern, a second semiconductor pattern, and a third semiconductor pattern; and
   sequentially forming a gate insulating layer and a gate electrode on the exposed the first, the second, and the third semiconductor patterns,
   wherein the forming of the active patterns includes:
      forming a first sacrificial layer and a first active layer on the substrate;
      forming a first mask pattern on a portion of the substrate;
      etching the first sacrificial layer and the first active layer partially using the first mask pattern as a mask to expose a portion of a top surface of the substrate;
      forming a semiconductor layer on the exposed portion of the top surface of the substrate, wherein a top surface of the semiconductor layer is coplanar with a top surface of the first active layer;
      forming staked sacrificial layers and active layers on the first active layer and the semiconductor layer, the active layers including an uppermost second active layer;
      forming a second mask pattern on a portion of the uppermost second active layer; and
      forming a trench using the second mask pattern as an etch mask, the trench defining the first active pattern and the second active pattern,
   wherein the first active pattern comprises a semiconductor layer disposed below and apart from the first channel pattern, and
   wherein the semiconductor layer comprises at least one of silicon or silicon phosphide.

17. The method of claim 16, wherein:
   a pair of adjacent first active patterns respectively constitute a pull-up transistor; and
   a pair of adjacent second active patterns respectively constitute a pull-down transistor and a pass-gate transistor.

18. The method of the claim 16, wherein:
   there are more or less semiconductor patterns of the first active pattern than semiconductor patterns of the second active pattern.

19. The method of the claim 16, wherein forming the semiconductor layer includes:
   performing an epitaxial growth process on the exposed portion of the top surface of the substrate.

20. The method of the claim 16, wherein forming the semiconductor layer includes:
   growing a silicon layer from the exposed portion of the top surface of the substrate; and doping the silicon layer with impurities.

* * * * *